US008623590B2

(12) United States Patent  
Hatakeyama et al.

(10) Patent No.: US 8,623,590 B2
(45) Date of Patent: Jan. 7, 2014

(54) PATTERN FORMING PROCESS

(75) Inventors: Jun Hatakeyama, Joetsu (JP); Kenji Funatsu, Joetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 56 days.

(21) Appl. No.: 13/279,614

(22) Filed: Oct. 24, 2011

(65) Prior Publication Data

US 2012/0108043 A1 May 3, 2012

(30) Foreign Application Priority Data

Nov. 2, 2010 (JP) ................................ 2010-246185

(51) Int. Cl.
*G03F 7/30* (2006.01)
*G03F 7/38* (2006.01)

(52) U.S. Cl.
CPC ... *G03F 7/30* (2013.01); *G03F 7/38* (2013.01)
USPC .......... 430/326; 430/270.1; 430/311; 430/330

(58) Field of Classification Search
CPC ...................................... G03F 7/30; G03F 7/38
USPC ............................... 430/311, 270.1, 326, 330
See application file for complete search history.

(56) References Cited

U.S. PATENT DOCUMENTS

| | | | |
|---|---|---|---|
| 5,415,749 A | 5/1995 | Hamilton | |
| 5,879,851 A | 3/1999 | Takahashi et al. | |
| 5,989,776 A | 11/1999 | Felter et al. | |
| 6,312,867 B1 | 11/2001 | Kinsho et al. | |
| 6,448,420 B1 | 9/2002 | Kinsho et al. | |
| 6,485,883 B2 | 11/2002 | Kodama et al. | |
| 6,746,817 B2 | 6/2004 | Takeda et al. | |
| 7,449,277 B2 | 11/2008 | Hatakeyama et al. | |
| 7,482,108 B2 | 1/2009 | Matsumaru et al. | |
| 7,501,223 B2 | 3/2009 | Takeda et al. | |
| 7,537,880 B2 | 5/2009 | Harada et al. | |
| 7,569,326 B2 | 8/2009 | Ohsawa et al. | |
| 7,598,016 B2 | 10/2009 | Kobayashi et al. | |
| 7,771,914 B2 | 8/2010 | Hatakeyama et al. | |
| 8,288,076 B2 | 10/2012 | Masunaga et al. | |
| 2003/0162120 A1* | 8/2003 | Yoon et al. ................ 430/156 |
| 2004/0260031 A1 | 12/2004 | Takeda et al. | |
| 2006/0199103 A1* | 9/2006 | Neisser et al. ............ 430/270.1 |
| 2007/0231738 A1 | 10/2007 | Kaneko et al. | |
| 2008/0090172 A1 | 4/2008 | Hatakeyama et al. | |
| 2008/0096128 A1 | 4/2008 | Takeda et al. | |
| 2008/0096131 A1 | 4/2008 | Hatakeyama et al. | |
| 2008/0214011 A1* | 9/2008 | Colburn et al. ............ 438/708 |
| 2008/0241736 A1 | 10/2008 | Kobayashi et al. | |
| 2008/0311507 A1 | 12/2008 | Isono et al. | |
| 2009/0233223 A1 | 9/2009 | Tachibana et al. | |
| 2009/0269696 A1 | 10/2009 | Ohsawa et al. | |
| 2009/0274978 A1 | 11/2009 | Ohashi et al. | |
| 2009/0317742 A1 | 12/2009 | Toriumi et al. | |
| 2010/0035185 A1 | 2/2010 | Hagiwara et al. | |
| 2010/0159392 A1* | 6/2010 | Hatakeyama et al. ..... 430/286.1 |
| 2010/0304302 A1 | 12/2010 | Masunaga et al. | |
| 2010/0316955 A1 | 12/2010 | Masunaga et al. | |
| 2011/0212391 A1 | 9/2011 | Masunaga et al. | |
| 2011/0294070 A1 | 12/2011 | Hatakeyama et al. | |
| 2012/0135349 A1 | 5/2012 | Hatakeyama et al. | |
| 2012/0202153 A1 | 8/2012 | Hatakeyama | |
| 2013/0029270 A1 | 1/2013 | Hatakeyama | |

FOREIGN PATENT DOCUMENTS

| | | |
|---|---|---|
| EP | 0473547 A1 | 3/1992 |
| EP | 2090931 A1 | 8/2009 |
| EP | 2112554 A2 | 10/2009 |
| JP | 4-230645 A | 8/1992 |
| JP | 9-309874 A | 12/1997 |
| JP | 2000-327633 A | 11/2000 |
| JP | 2000-336121 A | 12/2000 |
| JP | 2001-281849 A | 10/2001 |
| JP | 2001329228 A | 11/2001 |
| JP | 3429592 B2 | 7/2003 |
| JP | 2004-115630 A | 4/2004 |
| JP | 2004-175755 A | 6/2004 |
| JP | 2005-008766 A | 1/2005 |
| JP | 2005-084365 A | 3/2005 |
| JP | 2006-045311 A | 2/2006 |
| JP | 2006-169302 A | 6/2006 |
| JP | 2006-178317 A | 7/2006 |
| JP | 3865048 B2 | 1/2007 |
| JP | 2007-114728 A | 5/2007 |

(Continued)

OTHER PUBLICATIONS

Guerrero, Douglas J. et al., "A New Generation of Bottom Anti-Reflective Coatings (BARCs): Photodefinable BARCs", Proceedings of SPIE, 2003, vol. 5039, pp. 129-135.
Meador, Jim et al., "Development of 193-nm wet BARCs for implant applications", Proceedings of SPIE, 2006, vol. 6153, pp. 61532P.
European Search Report dated May 30, 2011, issued in European Patent Application No. 11001592.2 (7 pages).
Brainard, Robert et al., "Shot Noise, LER and Quantam Efficiency of EUV Photoresists", Proc. of SPIE, 2004, pp. 74-85, vol. 5374.
Kishikawa, Yasuhiro et al., "Assessment of trade-off between resist resolution and sensitivity for optimization of hyper-NA immersion lithography", Proc. of SPIE, 2007, pp. 65203L1-65203L9, vol. 6520.
Kozawa, Takahiro et al., "Basic aspects of acid generation processes in chemically amplified resists for electron beam lithography", Proc. of SPIE, 2005, pp. 361-367, vol. 5753.
Nakano, Atsuro et al., "Deprotonation mechanism of poly(4-hydroxystyrene) and its derivative", Proc. of SPIE, 2005, pp. 1034-1039, vol. 5753.

(Continued)

*Primary Examiner* — John Chu
(74) *Attorney, Agent, or Firm* — Westerman, Hattori, Daniels & Adrian, LLP

(57) ABSTRACT

A resist pattern is formed by coating a first positive resist composition comprising a polymer comprising 20-100 mol % of aromatic group-containing recurring units and adapted to turn alkali soluble under the action of an acid onto a substrate to form a first resist film, coating a second positive resist composition comprising a $C_3$-$C_8$ alkyl alcohol solvent which does not dissolve the first resist film on the first resist film to form a second resist film, exposing, baking, and developing the first and second resist films simultaneously with a developer.

12 Claims, 6 Drawing Sheets

(56) References Cited

FOREIGN PATENT DOCUMENTS

| | | |
|---|---|---|
| JP | 2007-297590 A | 11/2007 |
| JP | 2008-095009 A | 4/2008 |
| JP | 2008-111103 A | 5/2008 |
| JP | 2008-122932 A | 5/2008 |
| JP | 2008102383 A | 5/2008 |
| JP | 2008-133448 A | 6/2008 |
| JP | 2008-239918 A | 10/2008 |
| JP | 2009-007327 A | 1/2009 |
| JP | 2009-019199 A | 1/2009 |
| JP | 2009237150 A | 10/2009 |
| JP | 2009-269953 A | 11/2009 |
| JP | 2010-152136 A | 7/2010 |
| WO | 2010-026973 A1 | 3/2010 |
| WO | 2010-119910 A1 | 10/2010 |
| WO | 2010-150917 A1 | 12/2010 |

OTHER PUBLICATIONS

Hutchinson, John M., "The Shot Noise Impact on Resist Roughness in EUV Lithography", Proc. of SPIE, 1998, pp. 531-536, vol. 3331.

Wang, Mingxing et al., "Novel Anionic Photoacid Generator (PAGs) and Photoresist for sub-50 nm Patterning by EUVL and EBL", Proc. of SPIE, 2007, pp. 6519F1-6519F6, vol. 6519.

Chae et al., "Preparation of Chemically Amplified Photoresists with N-hydroxyphthalimide Styrenesulfonate groups and Their Properties," Journal of Photopolymer Science and Technology, vol., No. 1, p. 183-186, 1994.

Hinsberg et al., "Extendibility of Chemically Amplified Resists : Another Brick wall?", Proc. of SPIE, 2003, pp. 1-14, vol. 5039.

\* cited by examiner

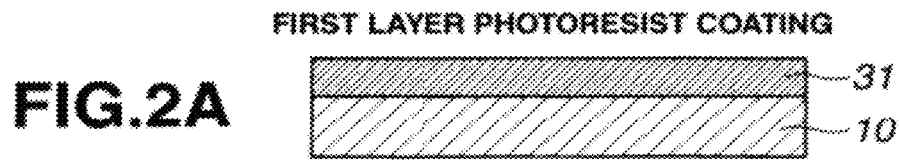
FIG.2A  FIRST LAYER PHOTORESIST COATING
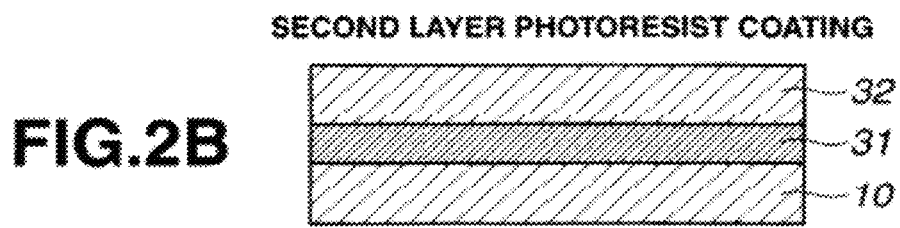
FIG.2B  SECOND LAYER PHOTORESIST COATING
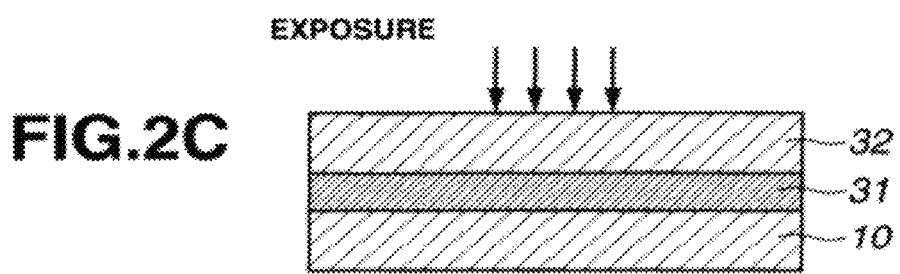
FIG.2C  EXPOSURE
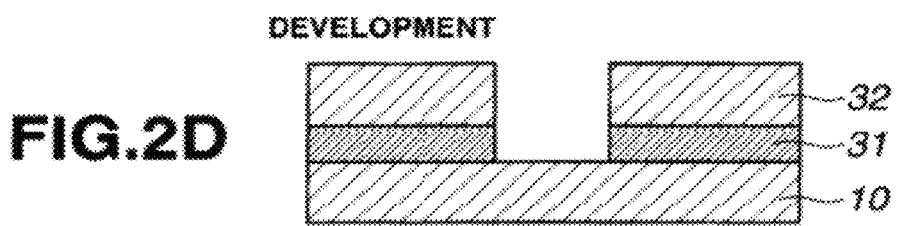
FIG.2D  DEVELOPMENT
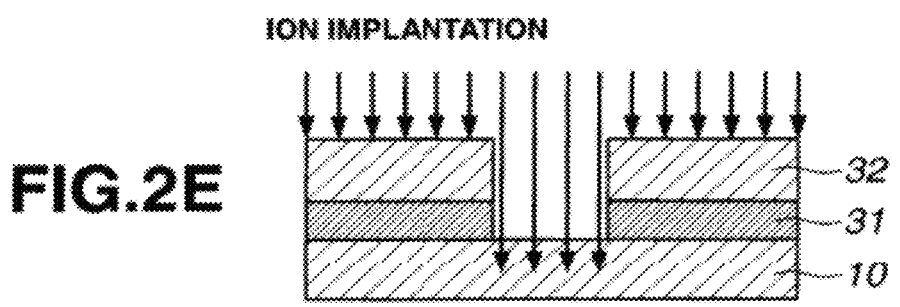
FIG.2E  ION IMPLANTATION

PATTERN FORMING PROCESS

CROSS-REFERENCE TO RELATED APPLICATION

This non-provisional application claims priority under 35 U.S.C. §119(a) on Patent Application No. 2010-246185 filed in Japan on Nov. 2, 2010, the entire contents of which are hereby incorporated by reference.

TECHNICAL FIELD

This invention relates to a pattern forming process comprising the steps of forming a first photoresist film having high absorption at exposure wavelength on a substrate, coating thereon a second resist material comprising an alkyl alcohol solvent which does not dissolve the first photoresist film to form a second photoresist film, exposure, and development, thereby simultaneously forming first and second resist patterns.

BACKGROUND ART

One recent approach for the manufacture of CMOS devices is to effect ion implantation on a substrate through a KrF resist film as a mask in order to form p- and n-wells in the substrate. As the resist pattern is reduced in size, a replacement by a ArF resist film is in progress, and the ArF immersion lithography is proposed for further miniaturization. In order to carry out ion implantation, the substrate surface must be exposed through space portions in the resist film pattern. If a bottom antireflective coating (BARC) layer is present beneath the resist film, ions can be trapped by the BARC layer. However, if the photoresist film is patterned in the absence of the BARC layer, then standing waves generate due to substrate reflection, whereby the resist pattern after development has substantially ridged sidewalls. For the purpose of smoothening such ridges due to standing waves, it is believed effective to enhance acid diffusion by using a photoacid generator (PAG) capable of generating a low molecular weight acid which is prone to diffuse and performing PEB at higher temperature. As long as the size at which the resist film subject to ion implantation is resolved by the KrF lithography is in the range of 200 to 300 nm, it is not recognized that resolution is degraded by enhancement of acid diffusion. However, when the size at which the resist film subject to ion implantation is resolved by the ArF lithography is reduced to less than 200 nm, undesirably the enhancement of acid diffusion can cause degradation of resolution and increase the proximity bias.

The most traditional means for preventing generation of standing waves is a dyed resist material for forming a photoresist film which is absorptive in itself. The study on that means started from the novolac resist materials for i and g-line exposure. As the absorptive component which can be used in the ArF lithography, a study was made on the introduction of benzene ring into a base polymer and the use of an additive having benzene ring. However, it is impossible for the absorptive component to completely prevent standing waves. If the component is made more absorptive, standing waves are reduced, but the cross-sectional profile of a resist pattern can be tapered into a trapezoidal shape.

It is also studied to form an antireflective coating (TARC) on top of a resist film. TARC is effective for reducing standing waves, but not effective for preventing halation due to irregularities on the substrate. Ideally, the refractive index of TARC is equal to the square root of the refractive index of a photoresist film. Since a methacrylate polymer used in the ArF resist film has a relatively low refractive index of 1.7 at the wavelength 193 nm, there is available few materials having a low refractive index equal to the square root of that refractive index, 1.30.

The study was then made on developer-soluble bottom antireflective coating (DBARC, see Non-Patent Documents 1 and 2). The early study was focused on the BARC which is soluble non-isotropically in developer. This approach encountered difficulty of size control in that undercuts were formed beneath the resist pattern upon excessive progress of dissolution, whereas scum was left in space portions upon shortage of dissolution. Studied next was photosensitive BARC. In order for a material to function as BARC, the material should have an antireflective effect, and when a photoresist solution is coated thereon to form a photoresist film, the material should not dissolve in the photoresist solution and be devoid of intermixing with the photoresist film. The dissolution in photoresist solution and the intermixing can be prevented by inducing crosslinking during bake after coating of a BARC solution. If BARC is provided with a positive photosensitive function, the exposed region must dissolve in developer like the photoresist film. The crosslinked BARC film has the problem that dissolution in developer is difficult even after deprotection of acid labile groups, leaving scum in the space region.

In the case of the prior art crosslinking BARC, after resist development to form a resist pattern, the substrate is processed by dry etching through the resist pattern serving as a mask. There is a problem that the resist pattern is reduced in film thickness when the BARC film is opened. Thus a BARC having a high etching rate is required. Since the BARC film is almost unexpectable to have etch resistance, an improvement in etch resistance to enable substrate processing is assigned to the resist film. As the resist film is made thinner, the etching resistance becomes lower. An attempt to provide BARC with etching resistance to enable substrate processing encounters a dilemma that the resist pattern is more damaged when the BARC film is opened.

CITATION LIST

Non-Patent Document 1: Proc. SPIE Vol. 5039 p129 (2003)
Non-Patent Document 2: Proc. SPIE Vol. 6153 p61532P (2006)

SUMMARY OF THE INVENTION

The photoresist film used in the ion implantation process must allow the substrate surface in the exposed portion thereof to be opened after development in order to implant ions into an opened region. In this case, a silicon substrate is commonly used as the substrate, and so reflection from the substrate is substantial. TARC is effective for suppressing standing waves. However, since an optimum low refractive material capable of completely suppressing standing waves is not available, TARC allows standing waves to generate and lacks the effect of suppressing diffuse reflection or halation in the presence of irregularities on the substrate. In the case of a resist film containing an absorptive component, a highly absorptive component is more effective for suppressing substrate reflection, but leads to a tapered profile, whereas a component which is less absorptive so as not to cause a tapered profile is less effective for suppressing substrate reflection and allows for formation of ridges due to standing waves. BARC has a very high anti-reflection effect because reflection is suppressed in two ways, i.e., by light absorption of an absorber and offsetting between incident light and reflected light by a choice of optimum film thickness. However, the BARC surface appears after development and inhibits ion implantation into the substrate interior. The photosensitive BARC has the problem that the solubility of an exposed portion of BARC in alkaline developer is reduced due to crosslinking during post-spin-coating bake for preventing mixing with the resist film, leaving scum on the substrate surface in the exposed portion of BARC. It would be desirable to have a photosensitive BARC which leaves no scum on the substrate surface.

An object of the invention is to provide a pattern forming process using a first photoresist film that is fully effective as a photosensitive antireflective film which leaves no scum on the substrate surface and is improved in size control, and a second photoresist film to be deposited thereon.

The invention provides a pattern forming process comprising coating a first positive resist composition onto a substrate to form a first resist film, said first resist composition comprising a first polymer comprising 20 mol % to 100 mol % of aromatic group-containing recurring units and adapted to turn alkali soluble under the action of an acid and a first solvent, coating a second positive resist composition on the first resist film to form a second resist film, said second resist composition comprising a second polymer and a second solvent of $C_3$-$C_8$ alkyl alcohol which does not dissolve the first resist film, exposing to high-energy radiation having a wavelength, post-exposure baking, and developing the first and second resist films simultaneously with a developer to form a resist pattern.

In a preferred embodiment, the first resist film has an extinction coefficient (k value) in the range of 0.1 to 1.1 at the exposure wavelength. Typically the radiation for exposure is ArF excimer laser radiation having a wavelength of 193 nm.

In a preferred embodiment, the aromatic group in the first resist composition is benzene ring.

In a preferred embodiment, the first solvent in the first resist composition is selected from the group consisting of ketones, ether or ester-containing alcohols, ethers, esters, and lactones, and mixtures comprising at least two of the foregoing. Specifically, the first solvent is selected from the group consisting of cyclohexanone, cyclopentanone, methyl-2-n-amylketone, 3-methoxybutanol, 3-methyl-3-methoxybutanol, 1-methoxy-2-propanol, 1-ethoxy-2-propanol, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, and mixtures comprising at least two of the foregoing.

In a preferred embodiment, the alkyl alcohol solvent in the second resist composition is selected from the group consisting of n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-1-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, and octanol, and mixtures comprising at least two of the foregoing.

In a preferred embodiment, the second polymer in the second resist composition has a 2,2,2-trifluoro-1-hydroxyethyl group. More preferably, the second polymer comprises recurring units having a 2,2,2-trifluoro-1-hydroxyethyl group, represented by the general formula (1):

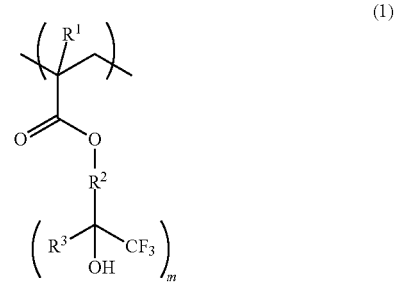

(1)

wherein $R^1$ is hydrogen or methyl, m is 1 or 2, $R^2$ is a straight, branched or cyclic $C_1$-$C_{10}$ alkylene group, which may contain an ester, ether, hydroxyl group or fluorine, in the case of m=1, or $R^2$ is the foregoing alkylene group with one hydrogen atom eliminated in the case of m=2, or $R^2$ and $R^3$ may bond together to form a ring, and $R^3$ is hydrogen, fluorine, methyl, trifluoromethyl or difluoromethyl.

Also preferably, the second polymer is a copolymer comprising recurring units (a) having a 2,2,2-trifluoro-1-hydroxyethyl group and recurring units (b1) having an acid labile group, represented by the general formula (2):

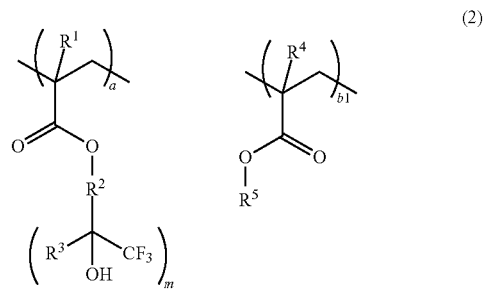

(2)

wherein $R^1$ to $R^3$ and m are as defined above, $R^4$ is hydrogen or methyl, $R^5$ is an acid labile group, a and b1 are numbers in the range: $0<a<1.0$, $0<b1<1.0$, and $0<a+b1<1.0$.

In a preferred embodiment, the first polymer in the first resist composition comprises recurring units (b2), (c1), and (c2) as represented by the general formula (3):

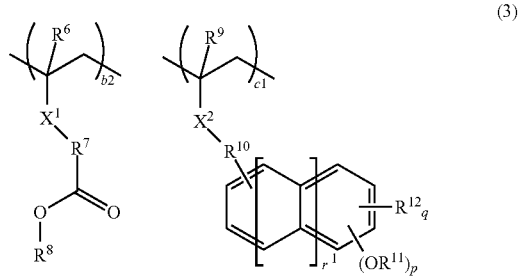

(3)

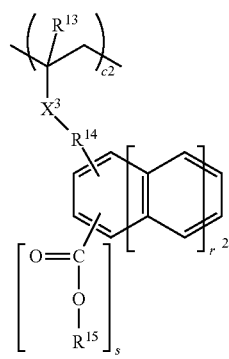

wherein $R^6$, $R^9$, and $R^{13}$ each are hydrogen or methyl, $X^1$, $X^2$, and $X^3$ each are a single bond or —C(=O)—O—, $X^2$ may also be —C(=O)—NH—, $R^7$, $R^{10}$, and $R^{14}$ each are a single bond or a straight or branched $C_1$-$C_6$ alkylene group, which may contain an ether group, ester group or lactone ring, $R^8$, $R^{11}$, and $R^{15}$ each are an acid labile group, $R^{12}$ is hydrogen, fluorine or a straight, branched or cyclic $C_1$-$C_6$ alkyl group, p and s are 1 or 2, q is an integer of 0 to 4, $r^1$ and $r^2$ are an integer of 0 to 2, b2, c1, and c2 are numbers in the range: $0 \le b2 < 1.0$, $0 \le c1 < 1.0$, $0 \le c2 < 1.0$, $0 < b2+c1+c2 \le 1.0$.

More preferably, the first polymer further comprise recurring units (d) having an adhesive group selected from the group consisting of lactone ring, carbonate, thiocarbonate, carbonyl, cyclic acetal, ether, ester, sulfonic acid ester, cyano, amide groups, and —O—C(=O)—Y— wherein Y is sulfur or NH.

In a preferred embodiment, the process further comprises, after the developing step, the step of processing the substrate by dry etching through the resist pattern, or the step of processing the substrate by ion implantation through the resist pattern.

When the pattern forming process defined above is applied, formation of ridges due to standing waves in the cross section of the photoresist pattern after development is prevented because reflection from the substrate is suppressed. The substrate surface in the exposed portion after development can be opened at a high degree of size control without scumming.

Advantageous Effects of the Invention

According to the invention, a first positive resist composition comprising a polymer containing aromatic groups in 20 mol % to 100 mol % of recurring units and adapted to turn alkali soluble under the action of an acid is coated onto a substrate to form a first resist film. A second positive resist composition comprising a solvent of $C_3$-$C_8$ alkyl alcohol which does not dissolve the first resist film is coated on the first resist film to form a second resist film. Exposure is performed while the influence of standing waves or halation by reflection from the substrate during exposure is eliminated. This is followed by PEB and simultaneous development of the first and second resist films with a developer to form a resist pattern. The substrate surface can be opened after development.

Because of the high content of aromatic groups, the first resist film has higher etch resistance than the second resist film. The second resist film combined with the first resist film offers high resistance to etching of the substrate using the resist pattern after development as a mask or high resistance to ion implantation, as compared with the second resist film used alone.

BRIEF DESCRIPTION OF DRAWINGS

FIG. 1 is a cross-sectional view of a pattern forming process according one embodiment of the invention.

FIG. 2 is a cross-sectional view of a pattern forming process according another embodiment of the invention. FIG. 2A shows a first resist film deposited on a substrate, FIG. 2B shows a second resist film deposited thereon, FIG. 2C shows exposure, FIG. 2D shows development, and FIG. 2E shows ion implantation into the substrate using the resist pattern as a mask.

DESCRIPTION OF THE EMBODIMENTS

Figure 1A:
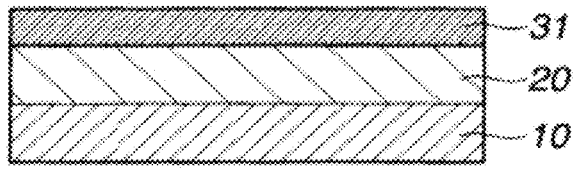
FIG. 1A shows a processable layer and a first resist film deposited on a substrate.
Figure 1B:
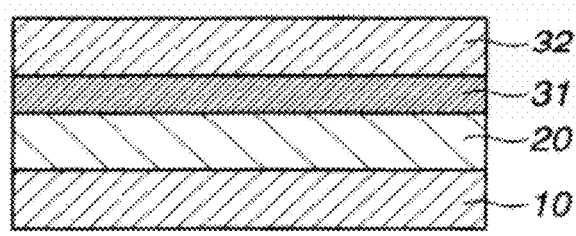
FIG. 1B shows a second resist film deposited thereon.
Figure 1C:
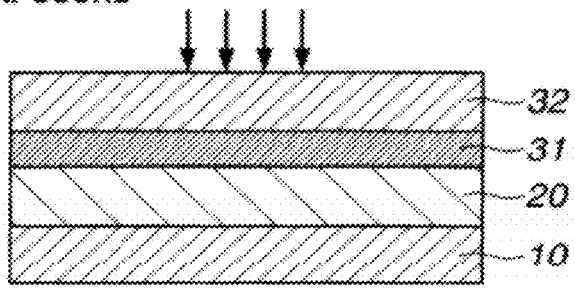
FIG. 1C shows exposure.
Figure 1D:
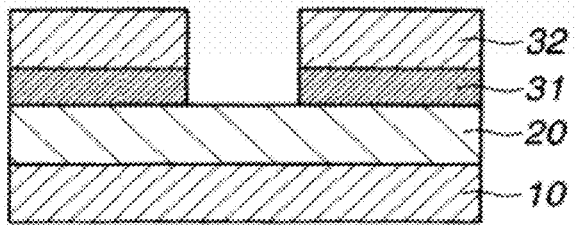
FIG. 1D shows development.
Figure 1E:
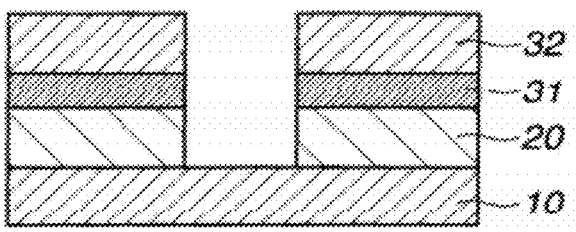
FIG. 1E shows the processable layer etched using the resist pattern as a mask.
Figure 3:
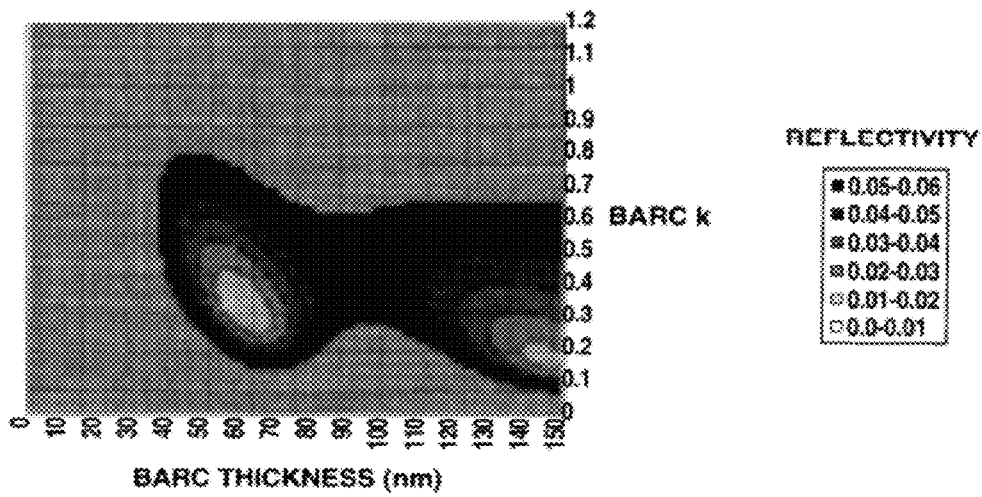
FIG. 3 is a diagram showing reflectivity from beneath a first resist film having an n value of 1.3 when the k value and thickness of the resist film are varied.
Figure 4:
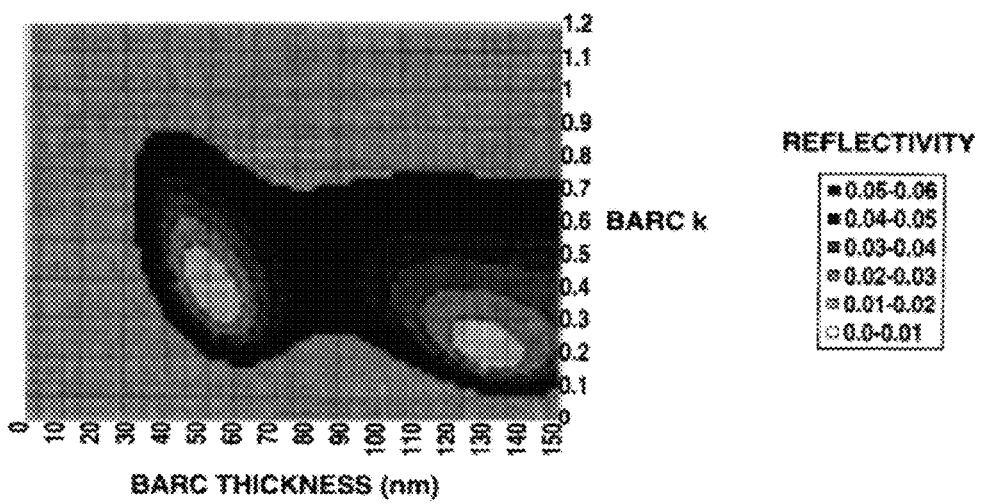
FIG. 4 is a diagram showing reflectivity from beneath a first resist film having an n value of 1.4 when the k value and thickness of the resist film are varied.
Figure 5:
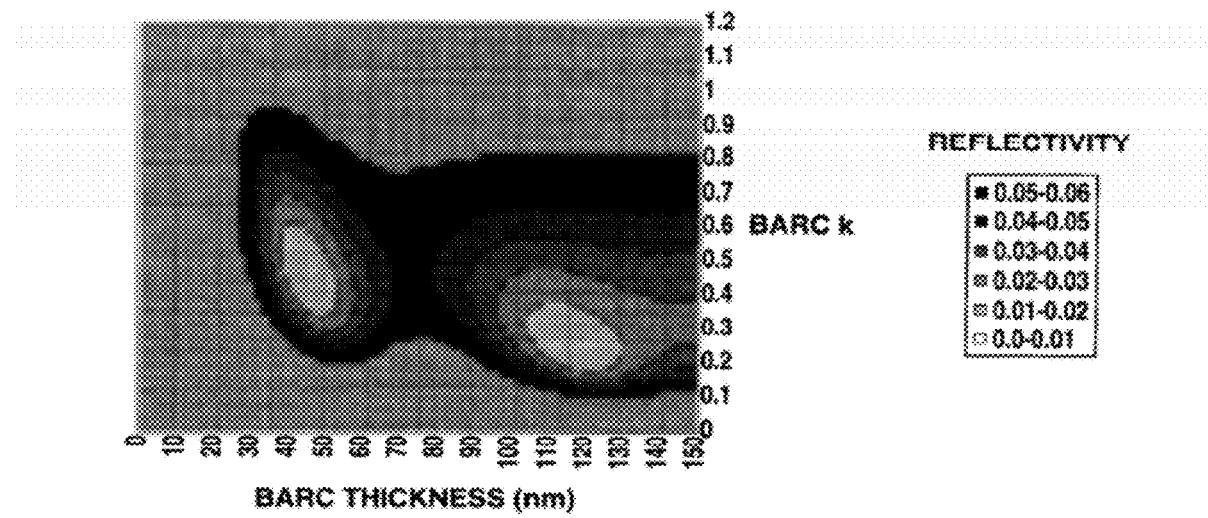
FIG. 5 is a diagram showing reflectivity from beneath a first resist film having an n value of 1.5 when the k value and thickness of the resist film are varied.

The singular forms "a," "an" and "the" include plural references unless the context clearly dictates otherwise. "Optional" or "optionally" means that the subsequently described event or circumstances may or may not occur, and that description includes instances where the event or circumstance occurs and instances where it does not. As used herein, the terminology "($C_x$-$C_y$)", as applied to a particular unit, such as, for example, a chemical compound or a chemical substituent group, means having a carbon atom content of from "x" carbon atoms to "y" carbon atoms per such unit. As used herein, the term "film" is used interchangeably with "coating" or "layer." The term "processable layer" refers to a layer that can be processed typically by etching or ion implantation.

The abbreviations and acronyms have the following meaning.

ARC: antireflective coating
Mw: weight average molecular weight

Mn: number average molecular weight

Mw/Mn: molecular weight distribution or dispersity

GPC: gel permeation chromatography

PEB: post-exposure baking

The invention pertains to the photolithography of forming a pattern on a highly reflective substrate, typically silicon substrate so that the substrate may be ready for ion implantation. The inventors made research on a patterning process capable of preventing reflection from the substrate and opening the exposed portion without scumming in the opening as found on use of DBARC, and a photoresist material used in the process.

The inventors have found that a pattern can be formed simultaneously from first and second resists by using a positive resist composition having strong absorption at the exposure wavelength as the first positive resist material, coating thereon a second positive resist composition comprising a solvent of $C_3$-$C_8$ alkyl alcohol which does not dissolve the first resist film, and effecting exposure and development, and that the substrate surface in the exposed portion can be opened while suppressing the generation of ridges on sidewalls of the resist pattern due to reflection from the substrate and generation of standing waves and without leaving scum.

Specifically, since the first resist film need not be crosslinked as is DBARC, no scum is generated in the exposed portion. While the first resist film has absorption equivalent to BARC, it can be improved in contrast due to the lack of crosslinking, which makes it possible to prevent a tapered profile and scumming.

While both the first and second positive resist compositions are chemically amplified positive resist compositions, at least first positive resist film should be insoluble in the solvent in the second positive resist composition. If a base polymer in the first positive resist composition has lactone as a predominant adhesive group, this polymer is difficulty soluble in alcohol solvents. On the other hand, a base polymer in the second positive resist composition should essentially contain a weakly acidic hydroxyl group in order that the polymer be soluble in alcohol solvents. The weakly acidic hydroxyl groups are α-trifluoromethyl hydroxy groups as typified by 2,2,2-trifluoro-1-hydroxyethyl and phenol groups. Although the phenol group cannot be used for the base polymer in the second resist composition because of strong absorption of benzene ring at the wavelength 193 nm, the naphthol group is applicable because the absorption peak wavelength is shifted to the longer wavelength side.

The first resist composition should meet not only the function of photoresist material, but also the function of ARC. In the case of ArF excimer laser having an exposure wavelength of 193 nm, the absorbing group is most preferably benzene ring. Benzene ring may be contained as an acid labile group, or an adhesive group, or a styrene directly bonded to a polymeriable group. The amount of benzene ring-containing recurring units is 20 to 100 mol % provided that the entire polymer units total to 100 mol %.

Benzene ring may be introduced in different ways, for example, as an acid labile group, or an adhesive group such as hydroxystyrene having a phenol group, or as non-polar recurring units like styrene and indene, or as a rigidity-enhancing adhesive group like coumarin or chromone. Moreover, benzene ring may be introduced as recurring units having an acid labile group-substituted phenolic hydroxyl group or carboxyl group, specifically recurring units (c1) and (c2) in the following general formula (3).

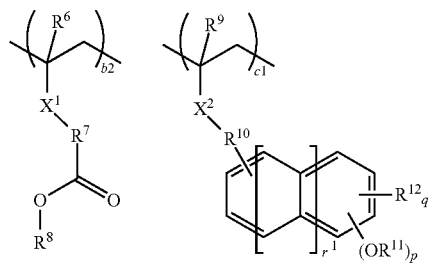

(3)

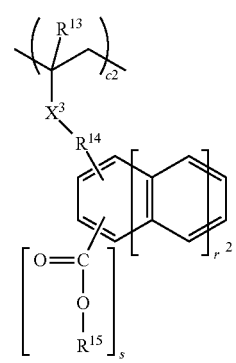

Herein $R^6$, $R^9$, and $R^{13}$ each are hydrogen or methyl, $X^1$, $X^2$, and $X^3$ each are a single bond or —C(=O)—O—, $X^2$ may also be —C(=O)—NH—, $R^7$, $R^{10}$, and $R^{14}$ each are a single bond or a straight or branched $C_1$-$C_6$ alkylene group, which may contain an ether group, ester group or lactone ring, $R^8$, $R^{11}$, and $R^{15}$ each are an acid labile group, $R^{12}$ is hydrogen, fluorine or a straight, branched or cyclic $C_1$-$C_6$ alkyl group, p and s are 1 or 2, q is an integer of 0 to 4, $r^1$ and $r^2$ are an integer of 0 to 2, b2, c1, and c2 are numbers in the range: $0 \le b2 < 1.0$, $0 \le c1 < 1.0$, $0 \le c2 < 1.0$, $0 < b2+c1+c2 \le 1.0$.

In order that the first resist composition function as positive resist material, the first polymer should comprise recurring units of at least one type selected from recurring units having an acid labile group-substituted carboxyl group or phenolic hydroxyl group (b2), (c1) and (c2) in formula (3).

The monomer from which recurring units (b2) are derived is a methacrylate or acrylate monomer as shown below.

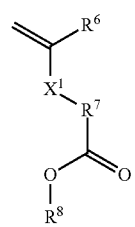

Herein $R^6$ to $R^8$ and $X^1$ are as defined above.

Examples of the monomer from which recurring units (b2) are derived are shown below.

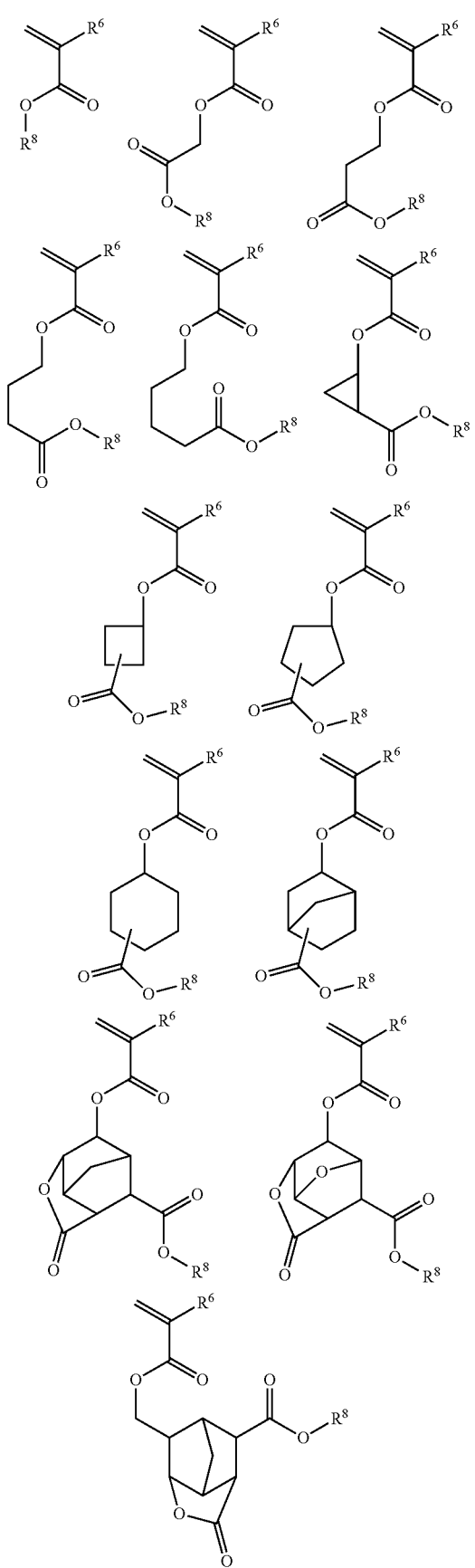
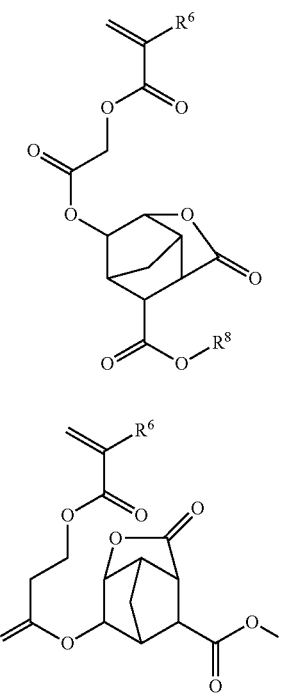
Examples of the monomers from which recurring units (c1) and (c2) are derived are shown below.
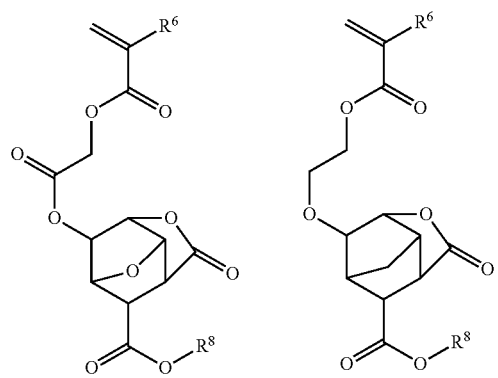
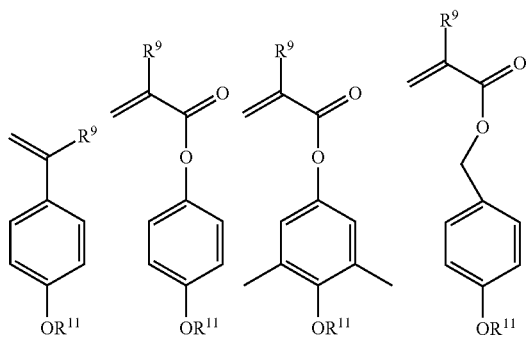

-continued
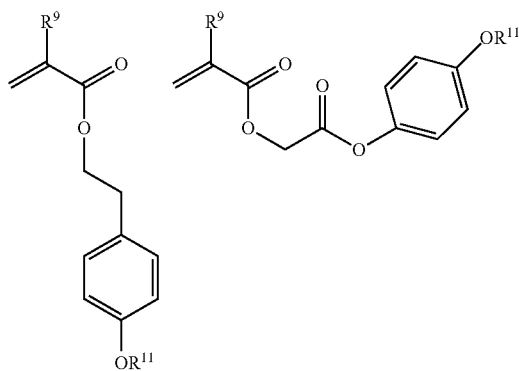
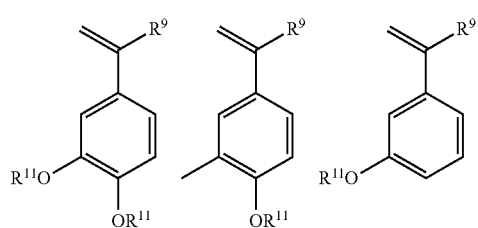
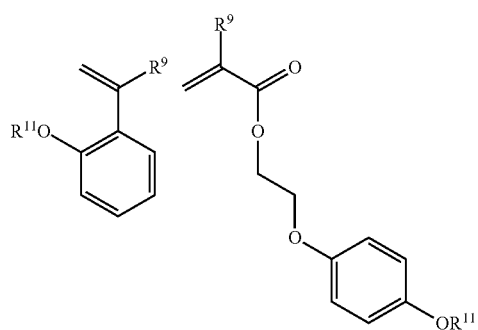
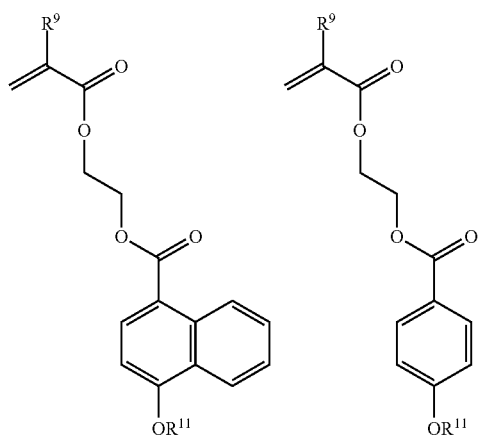
-continued
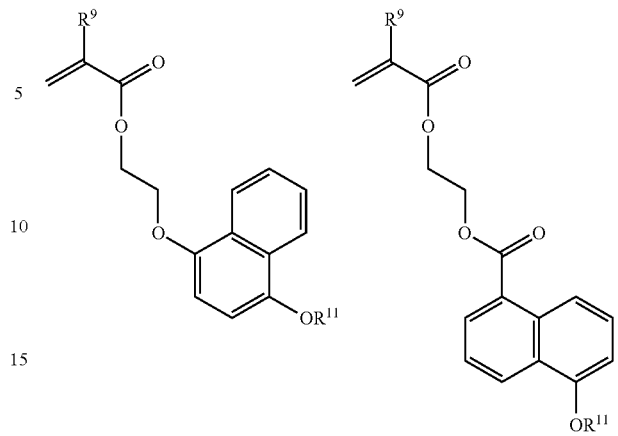
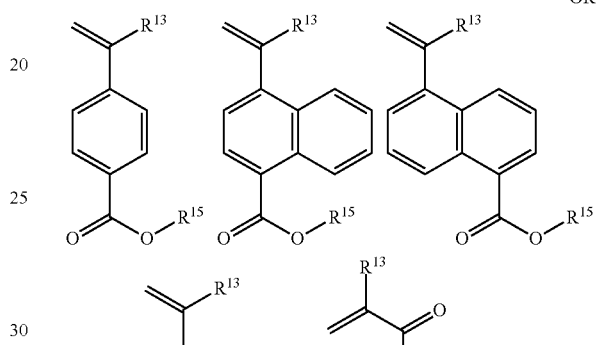
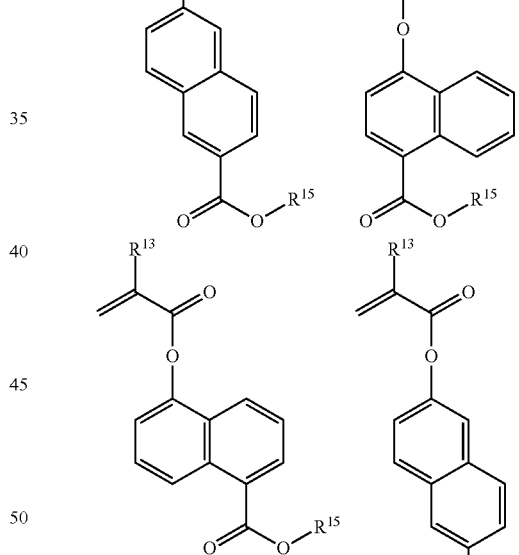
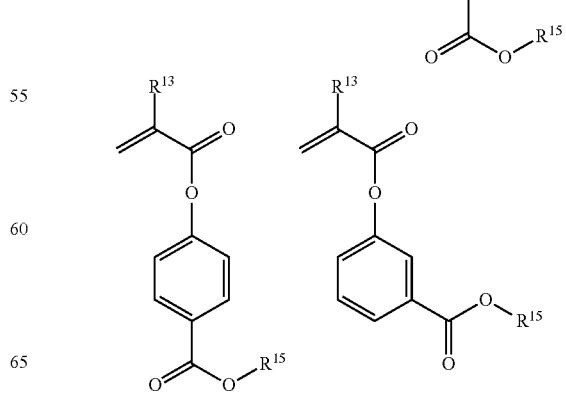

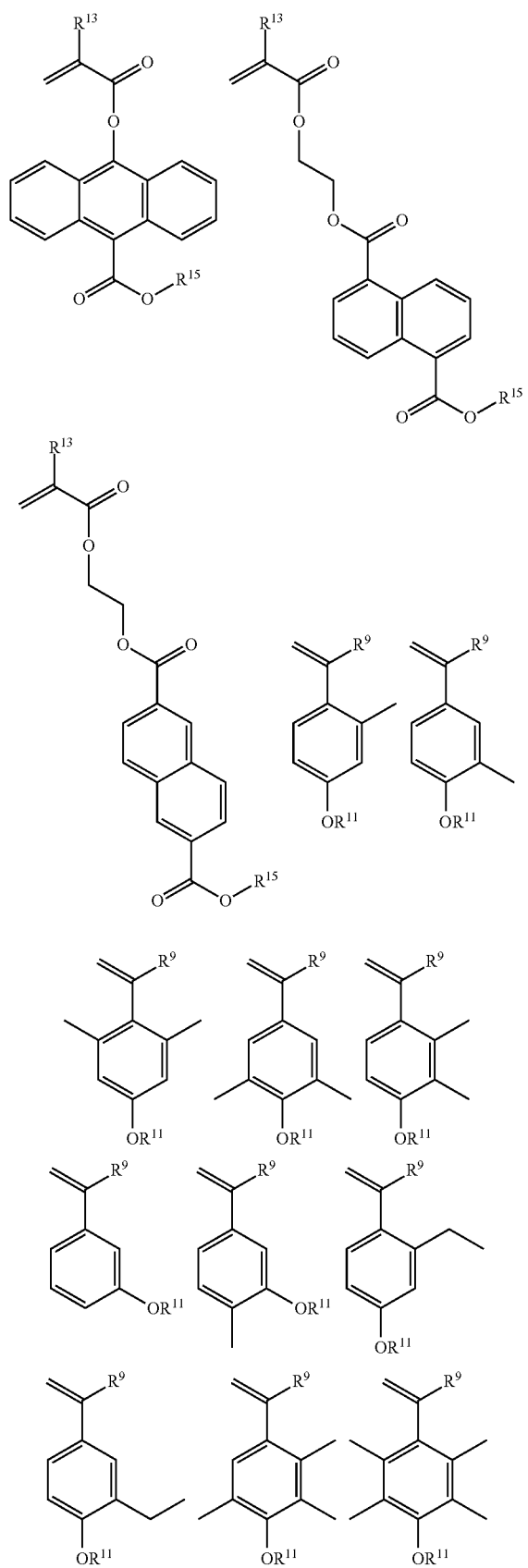
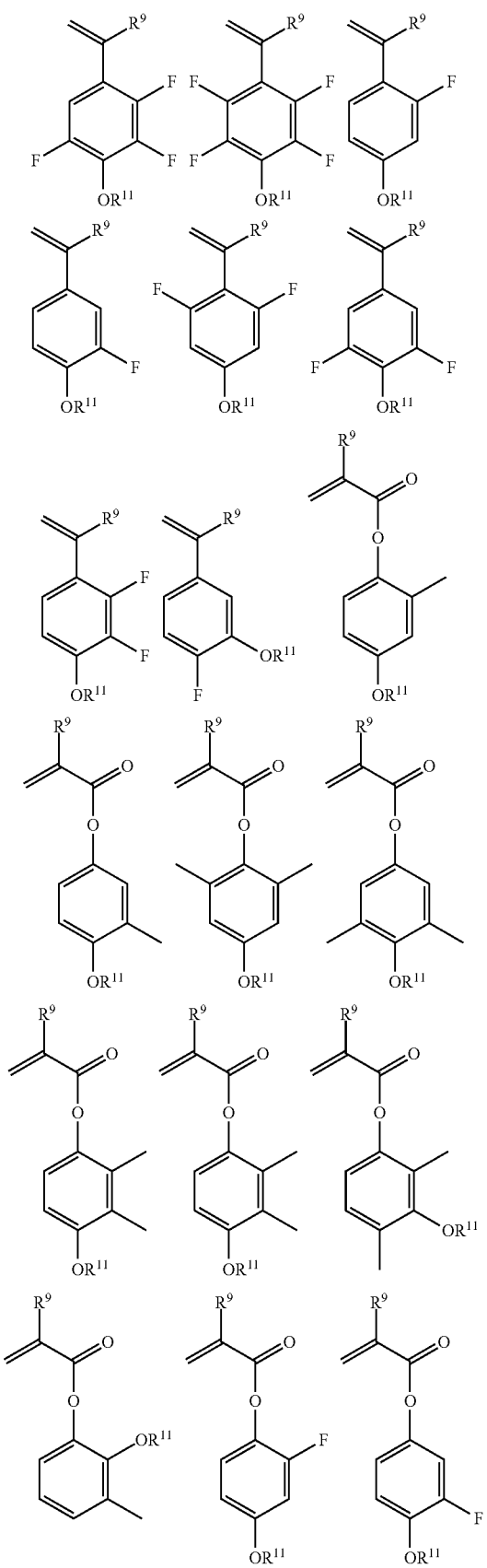

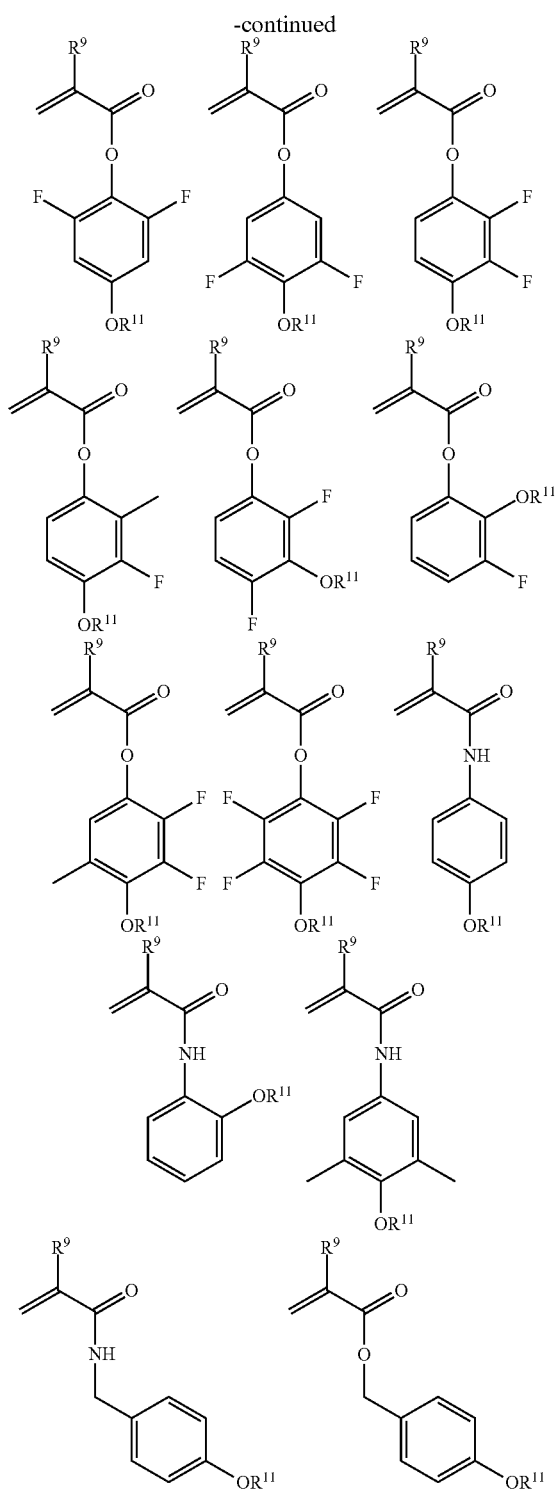

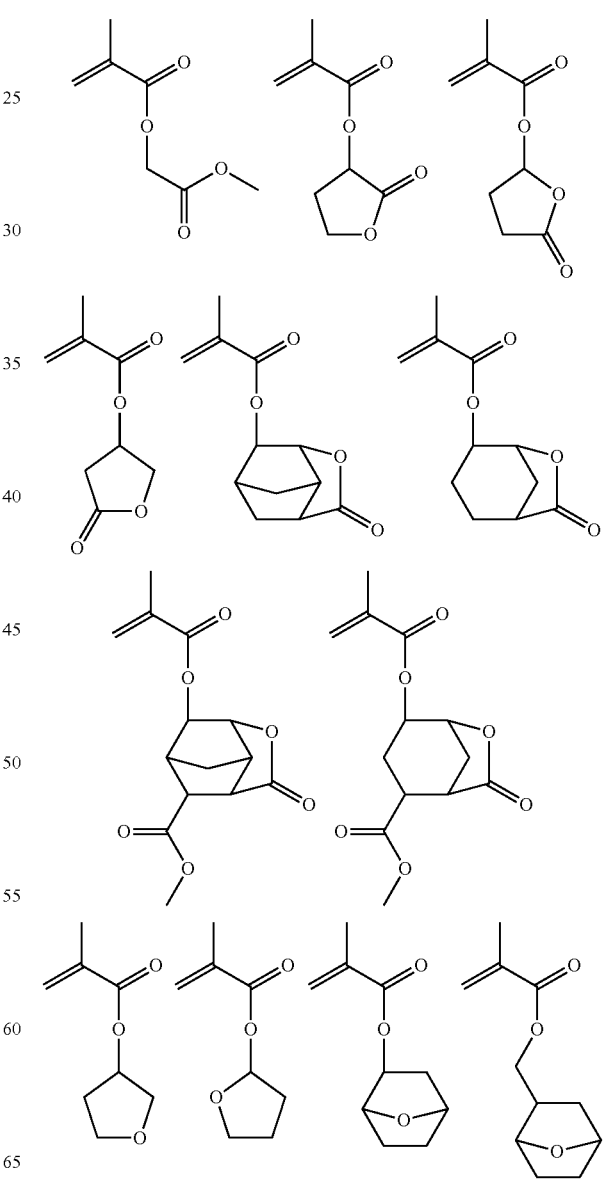

alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-1-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, and octanol. When the second resist composition is dispensed on the first resist film, the first resist film is not dissolved therein or intermixed with the second resist film.

Shown below are examples of the recurring units (d) having an adhesive group selected from among lactone ring, carbonate, thiocarbonate, carbonyl, cyclic acetal, ether, ester, sulfonic acid ester, cyano, amide groups, and —O—C(=O)—Y— wherein Y is sulfur or NH.

In addition to recurring units (b2), (c1) and (c2) as represented by formula (3), the first polymer used in the first resist composition may have further copolymerized therein recurring units (d) having an adhesive group selected from among lactone ring, carbonate, thiocarbonate, carbonyl, cyclic acetal, ether, ester, sulfonic acid ester, cyano, amide groups, and —O—C(=O)—Y— wherein Y is sulfur or NH. Then the polymer becomes substantially insoluble in the solvent of $C_3$-$C_8$ alkyl alcohol to form a resist solution for the second resist film, specifically n-propanol, isopropyl alcohol, 1-butyl -continued
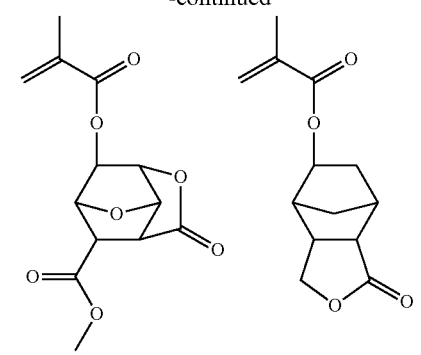
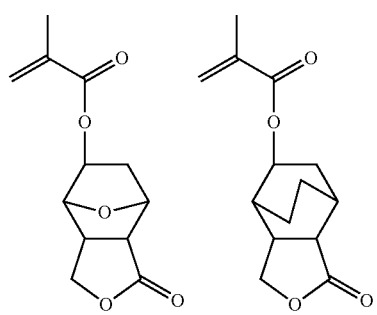
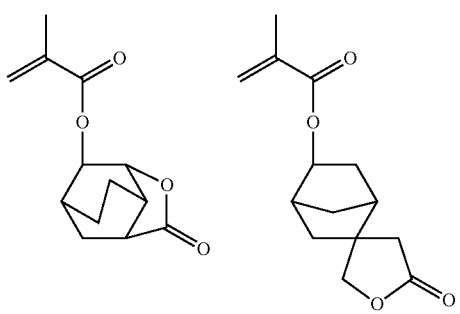
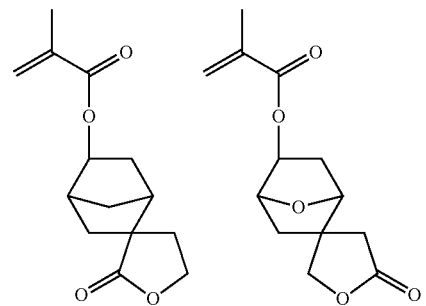
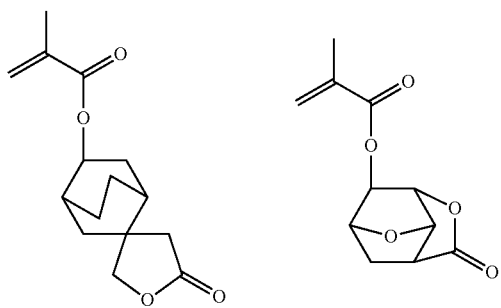
-continued
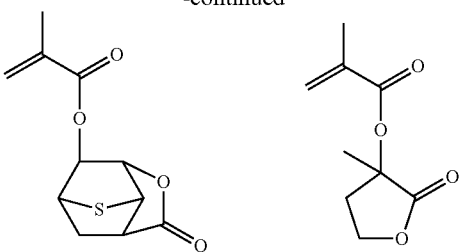
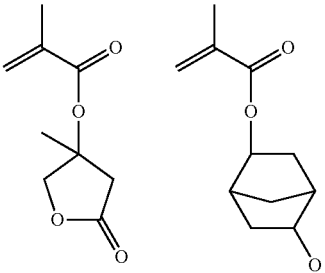
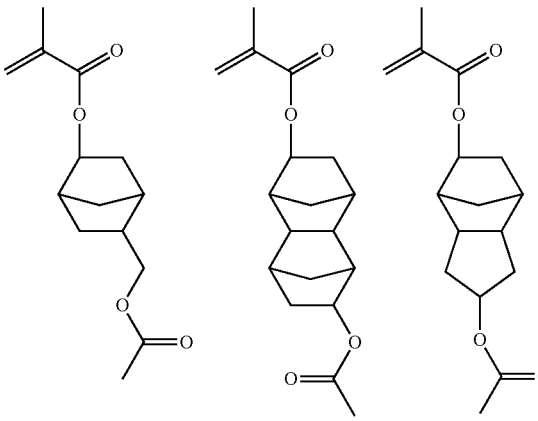
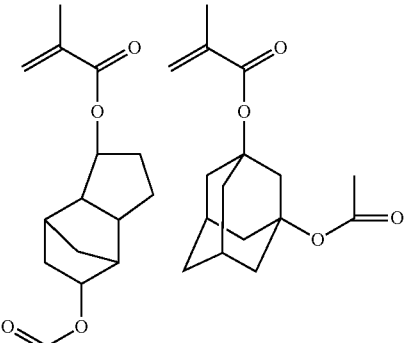
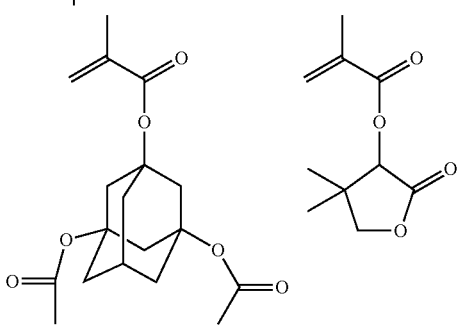

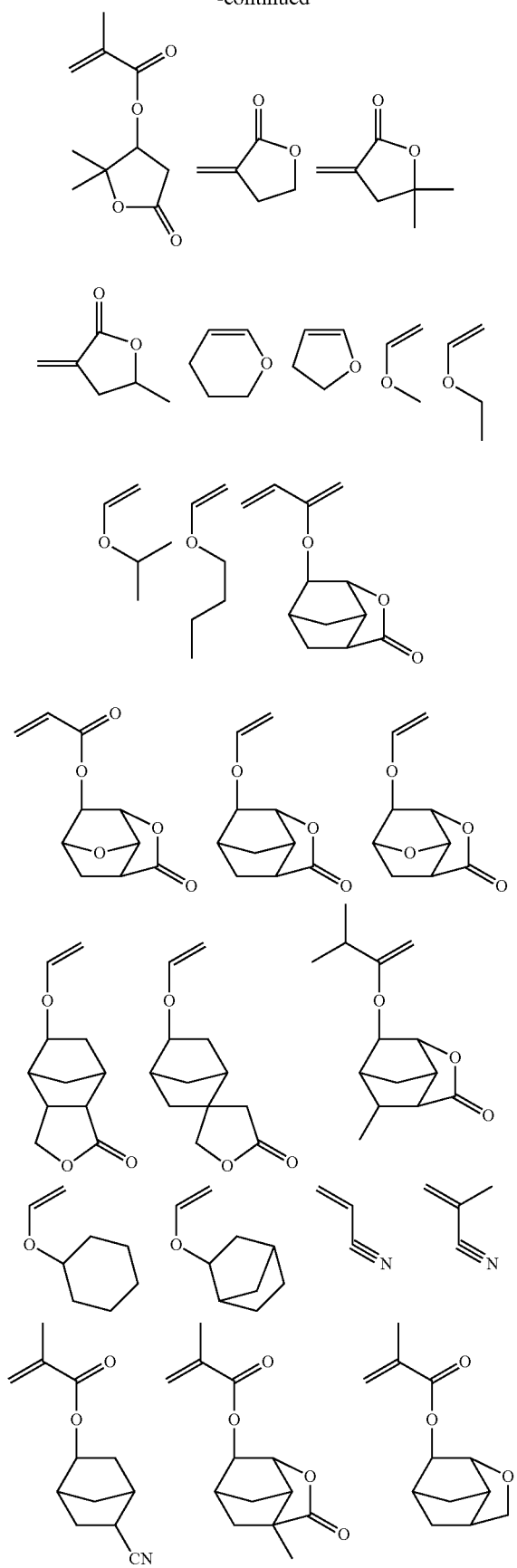

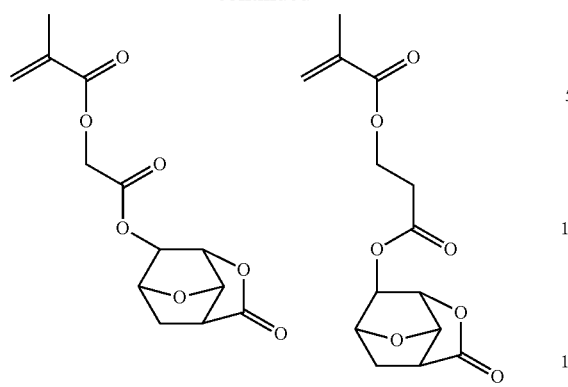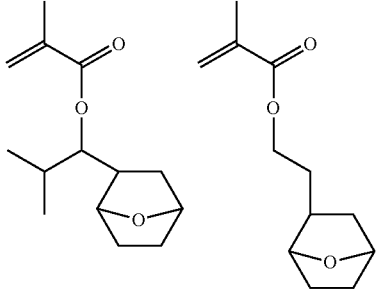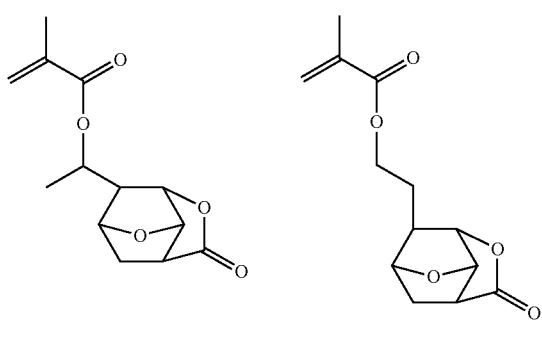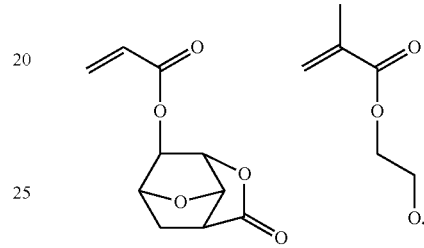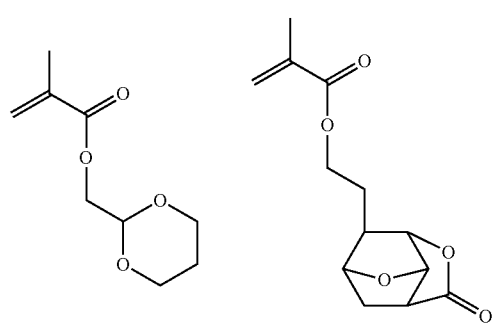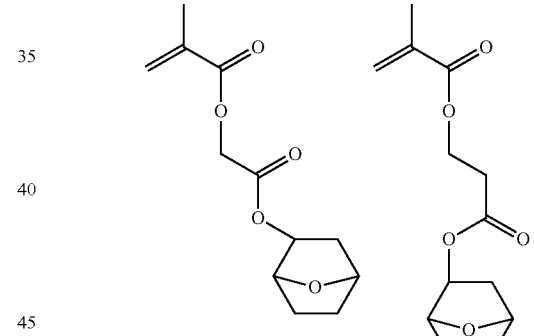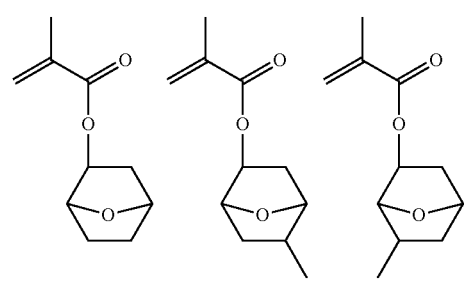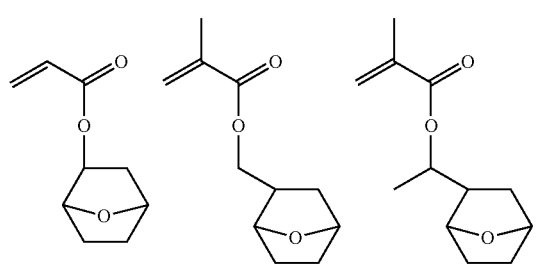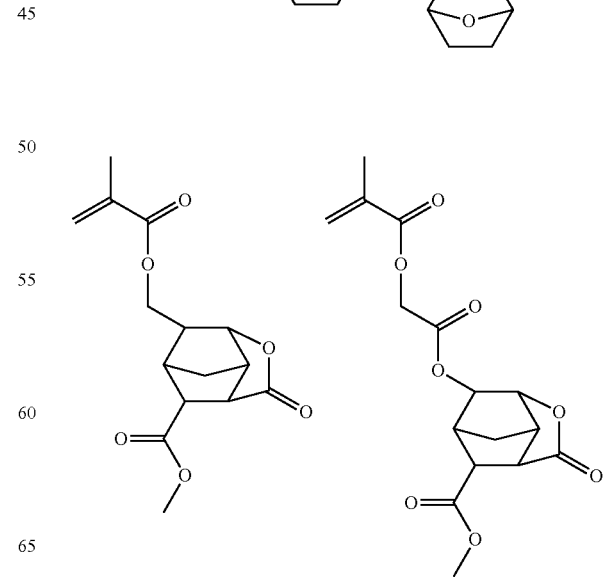

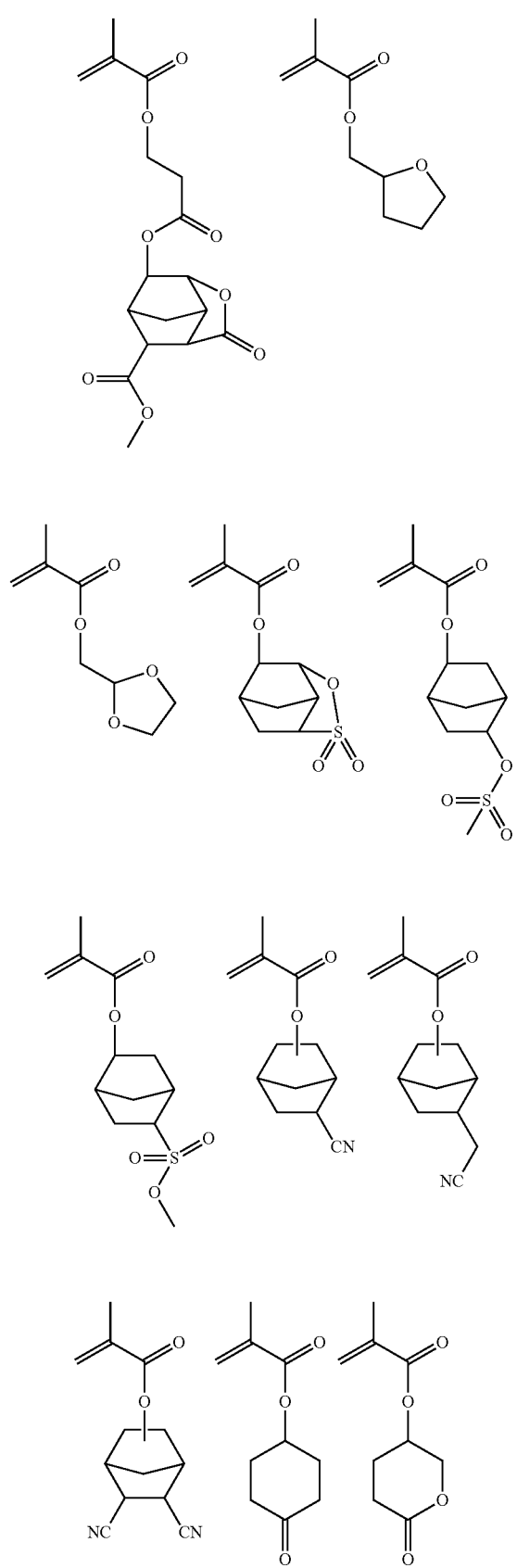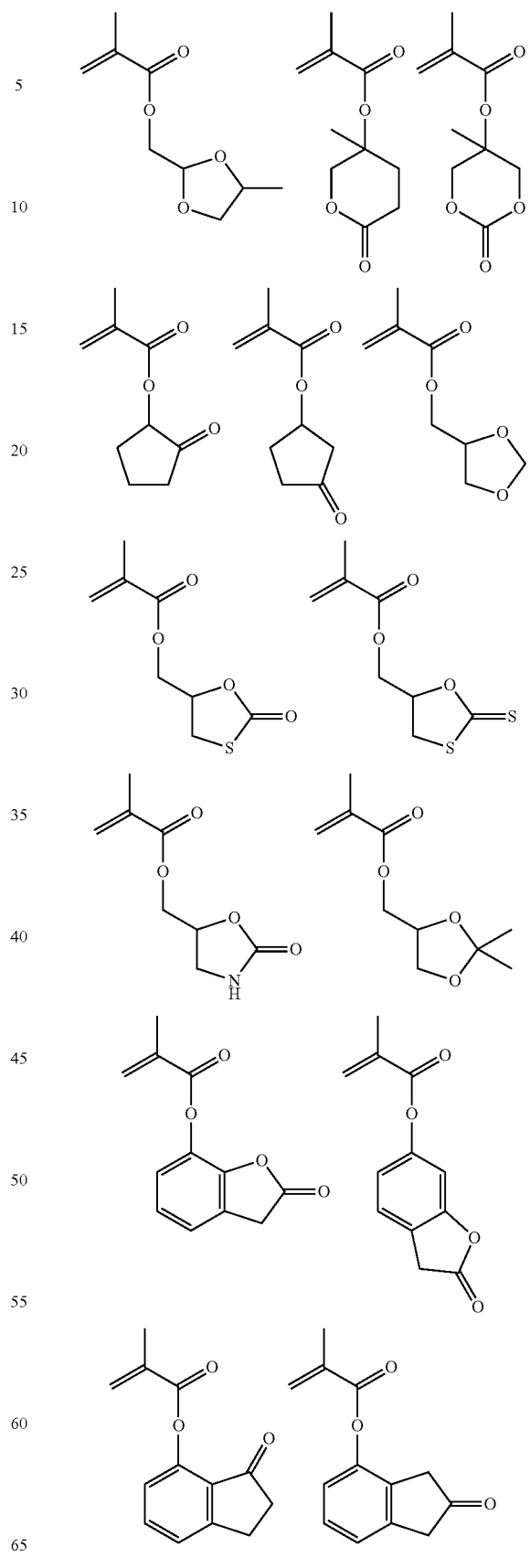

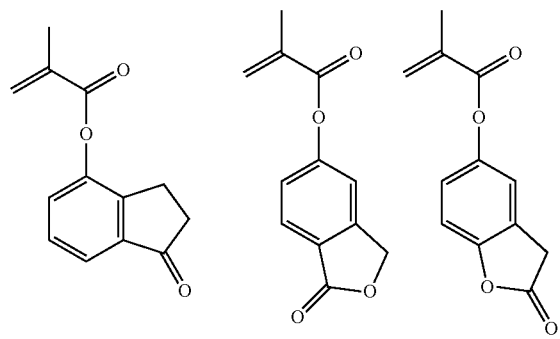
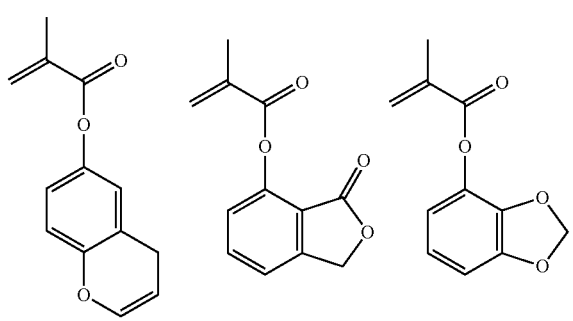
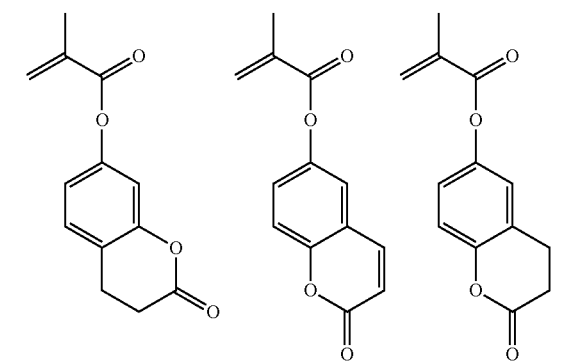
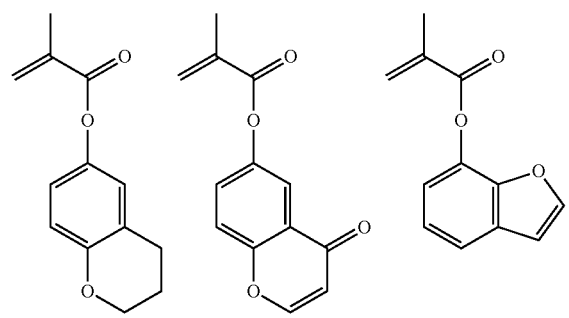
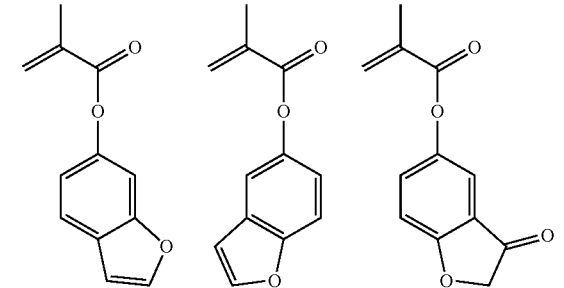
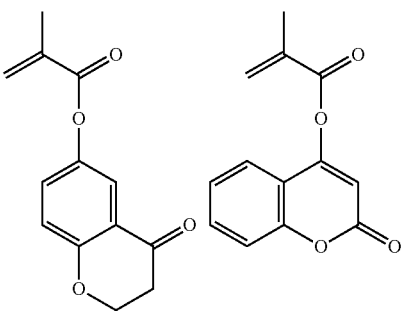
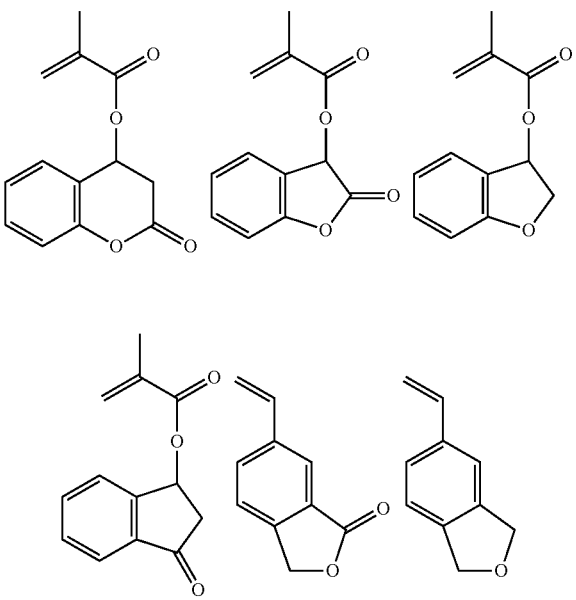
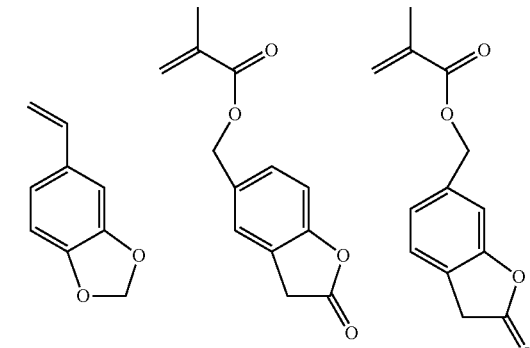
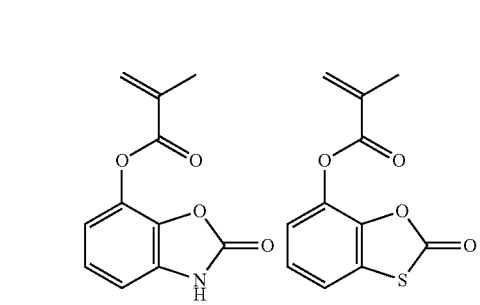

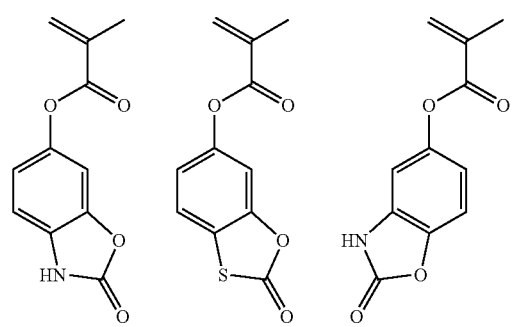
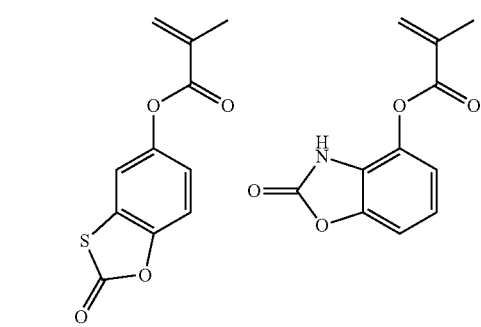
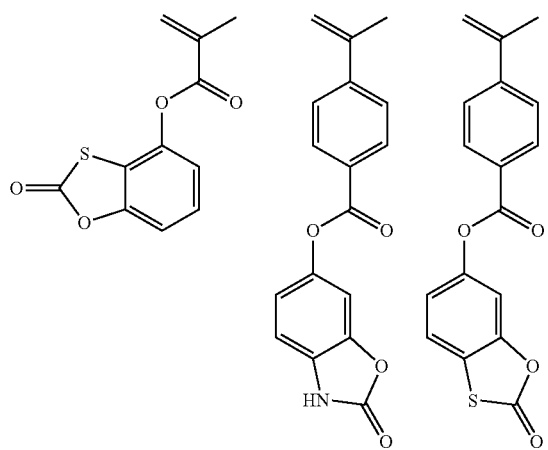
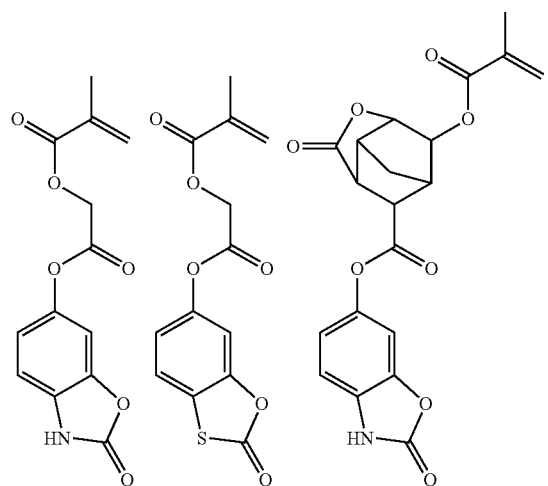
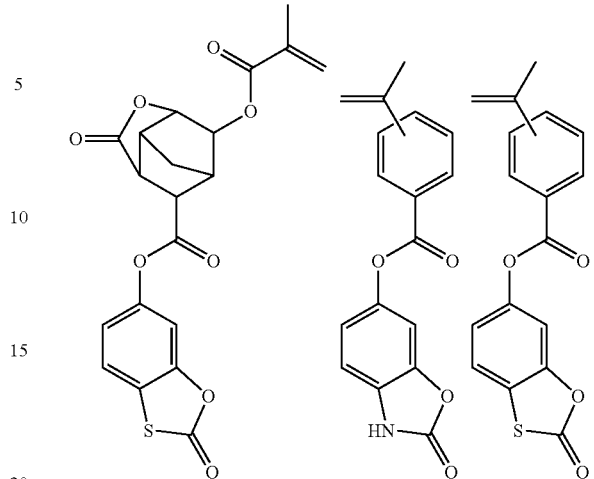
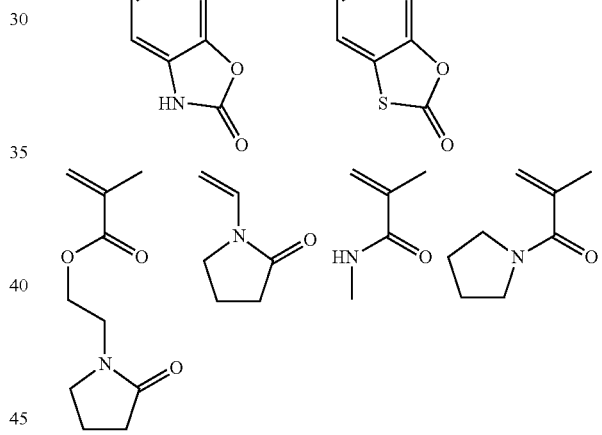
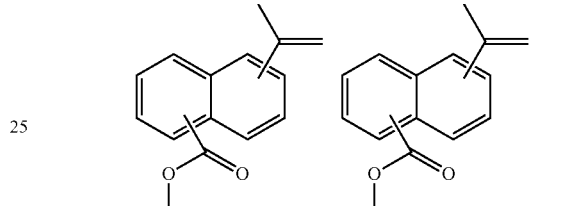
The first polymer in the first resist composition may have further copolymerized therein recurring units (e) having a phenolic hydroxyl group, which are exemplified below.
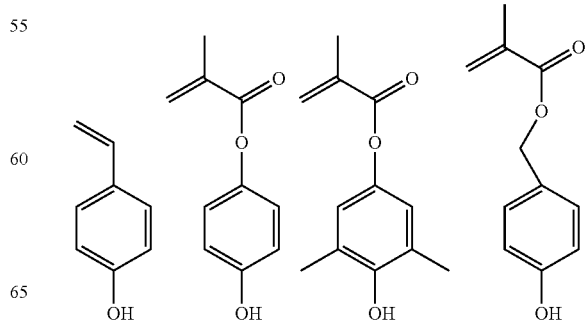

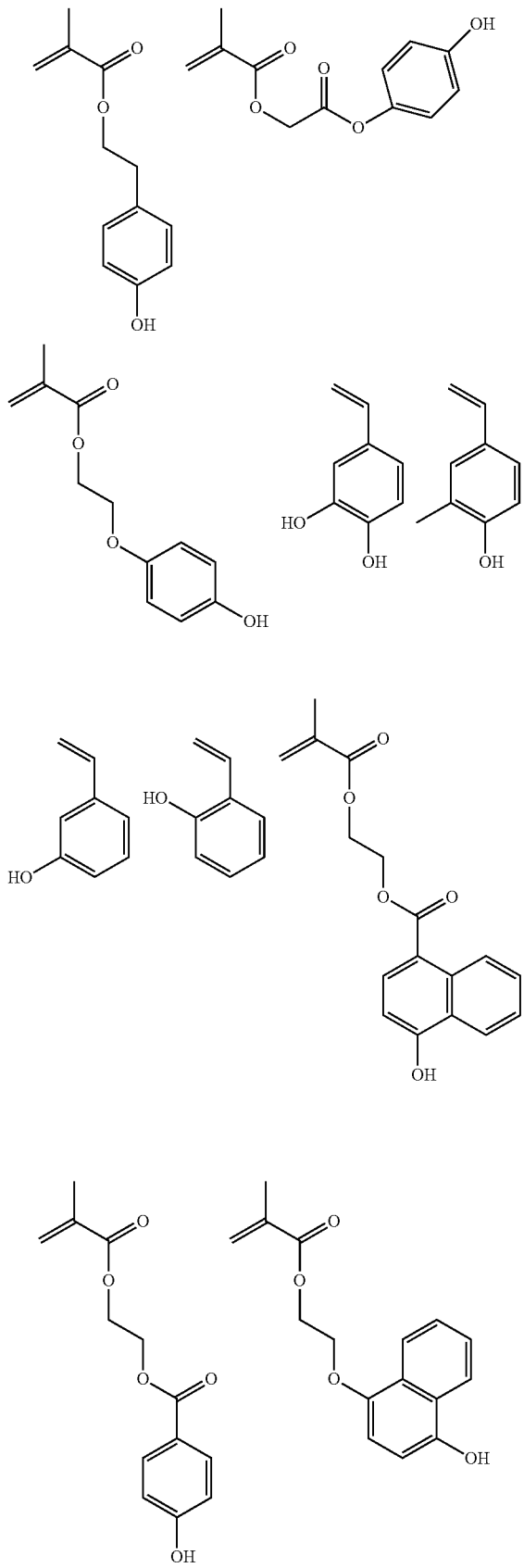
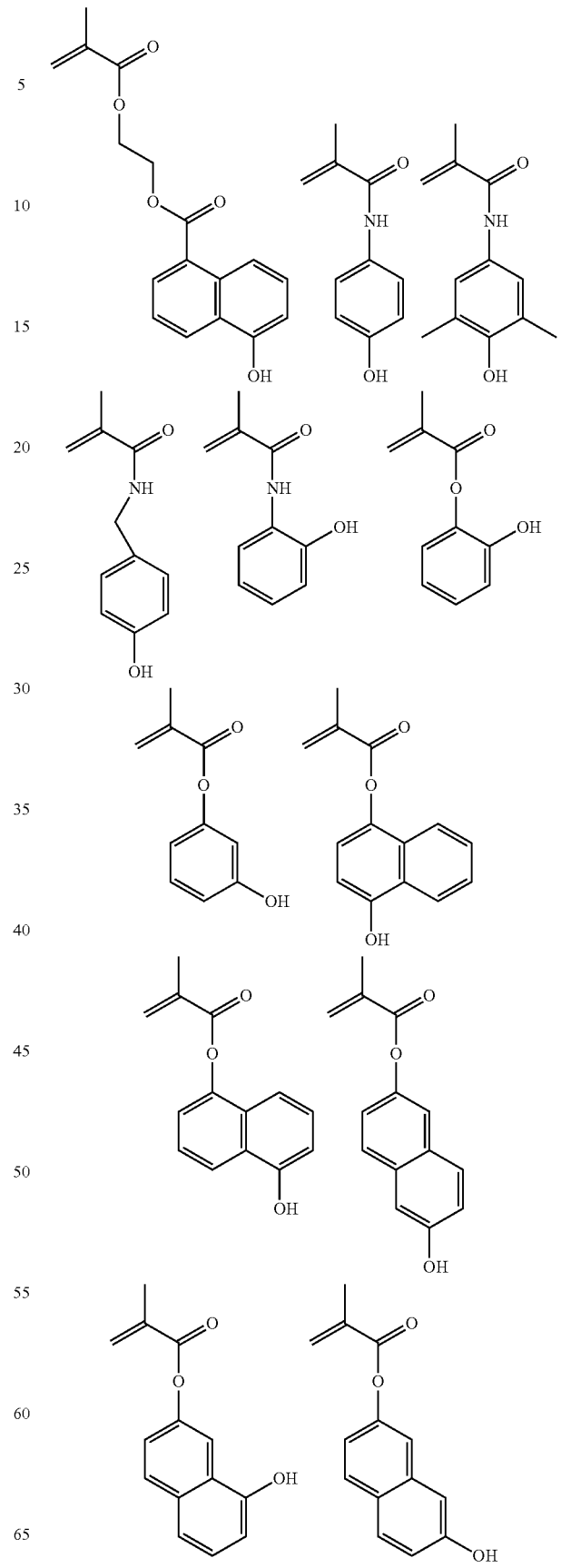

31
-continued

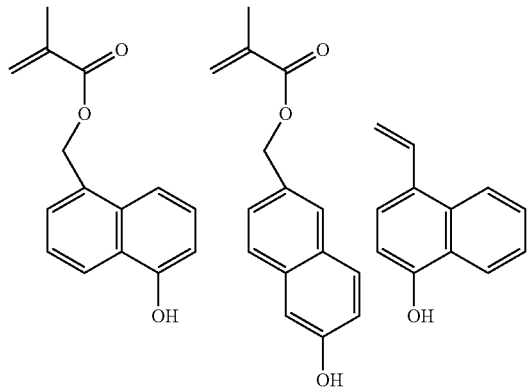

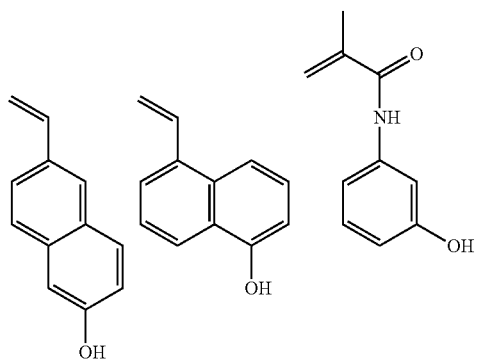

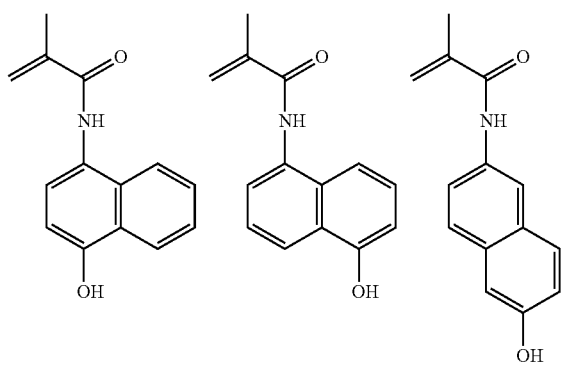

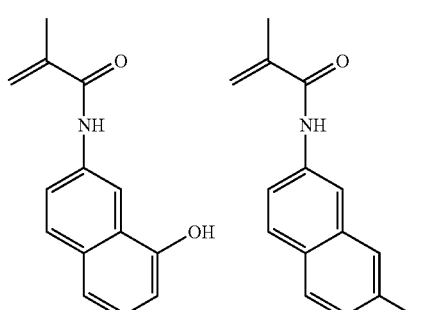

32
-continued

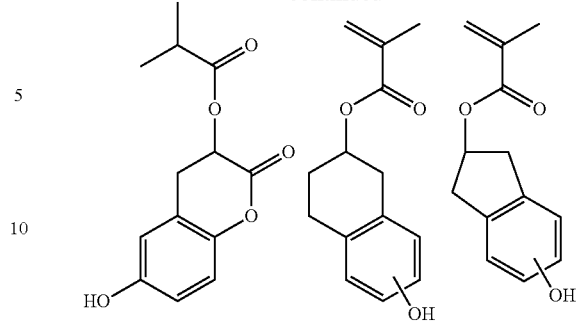

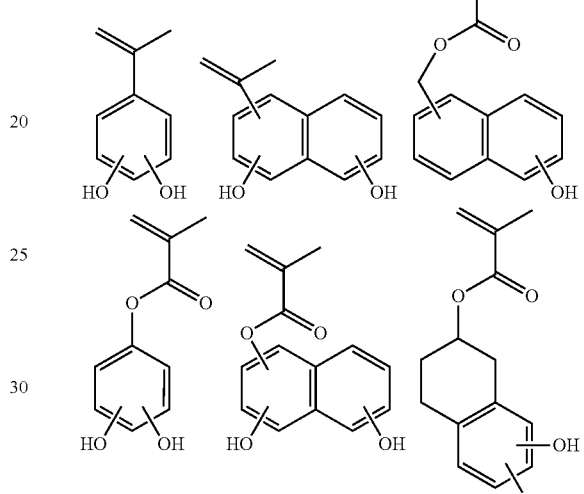

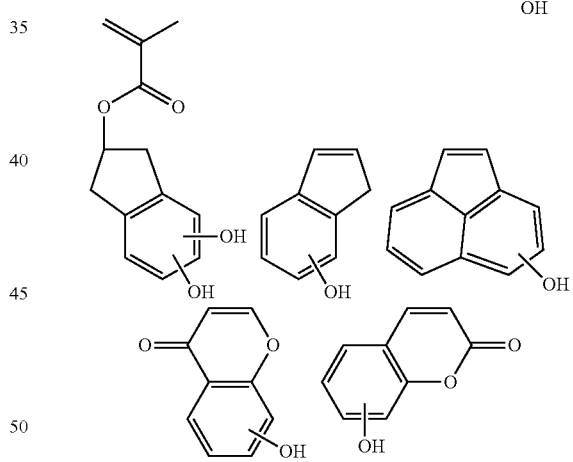

It is acceptable that in the monomer stage, the phenolic hydroxyl group is protected with an acid labile group or acyl group, and after polymerization, it is deprotected with an acid or alkaline aqueous solution to restore a hydroxyl group.

Further, recurring units (f) for improving etching resistance may be copolymerized, for example, styrene, vinylnaphthalene, vinylanthracene, vinylpyrene, vinylfluorene, vinylphenanthrene, vinylchrysene, vinylnaphthacene, vinylpentacene, vinylacenaphthene, indene, acenaphthylene, coumarin, chromone, maleic anhydride, maleimide, and vinyl carbazole.

The second polymer, which is combined with the $C_3$-$C_8$ alkyl alcohol solvent to form the second positive resist composition, should preferably comprise recurring units (a) having a 2,2,2-trifluoro-1-hydroxyethyl group, specifically represented by the general formula (1).

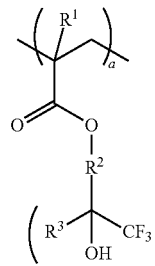

Herein $R^1$ is hydrogen or methyl, and m is 1 or 2. $R^2$ is a straight, branched or cyclic $C_1$-$C_{10}$ alkylene group, which may contain an ester, ether, hydroxyl group or fluorine, in the case of m=1. $R^2$ is the foregoing alkylene group with one hydrogen atom eliminated in the case of m=2. Alternatively, $R^2$ and $R^3$ bond together to form a $C_3$-$C_{10}$ aliphatic ring with the carbon atom to which they are attached. $R^3$ is hydrogen, fluorine, methyl, trifluoromethyl or difluoromethyl.

Examples of the monomer from which recurring units (a) are derived are given below.

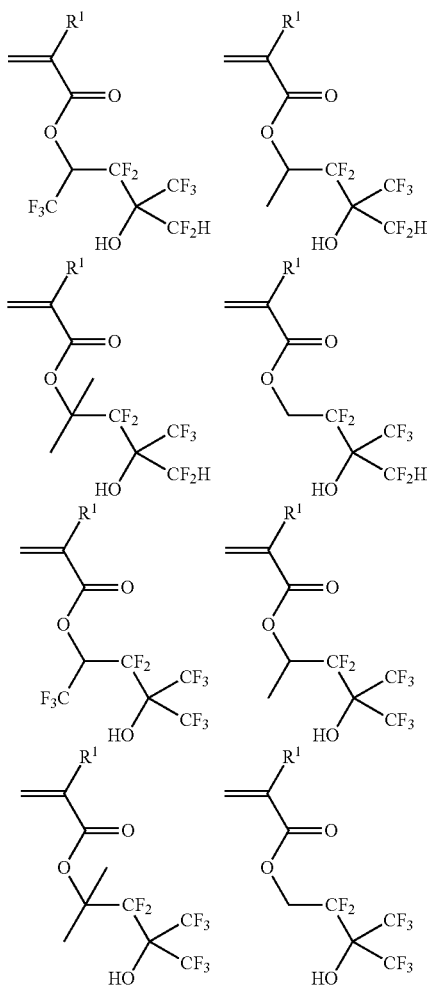

-continued

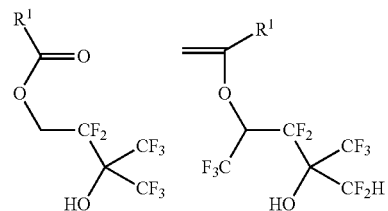

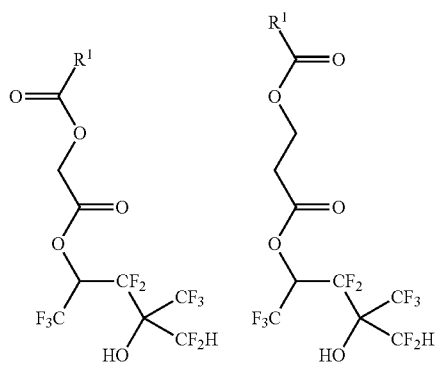

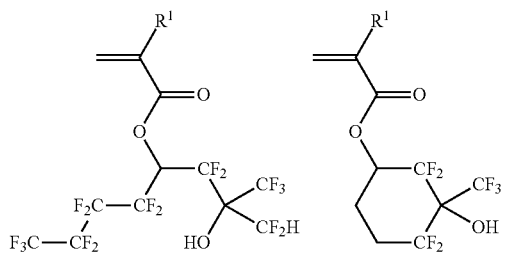

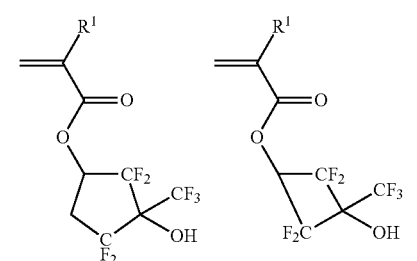

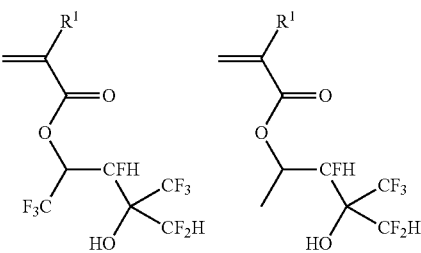

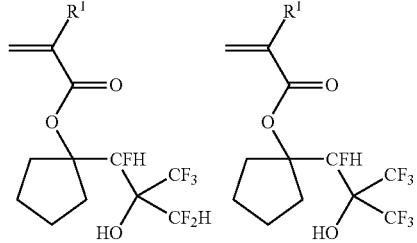

-continued
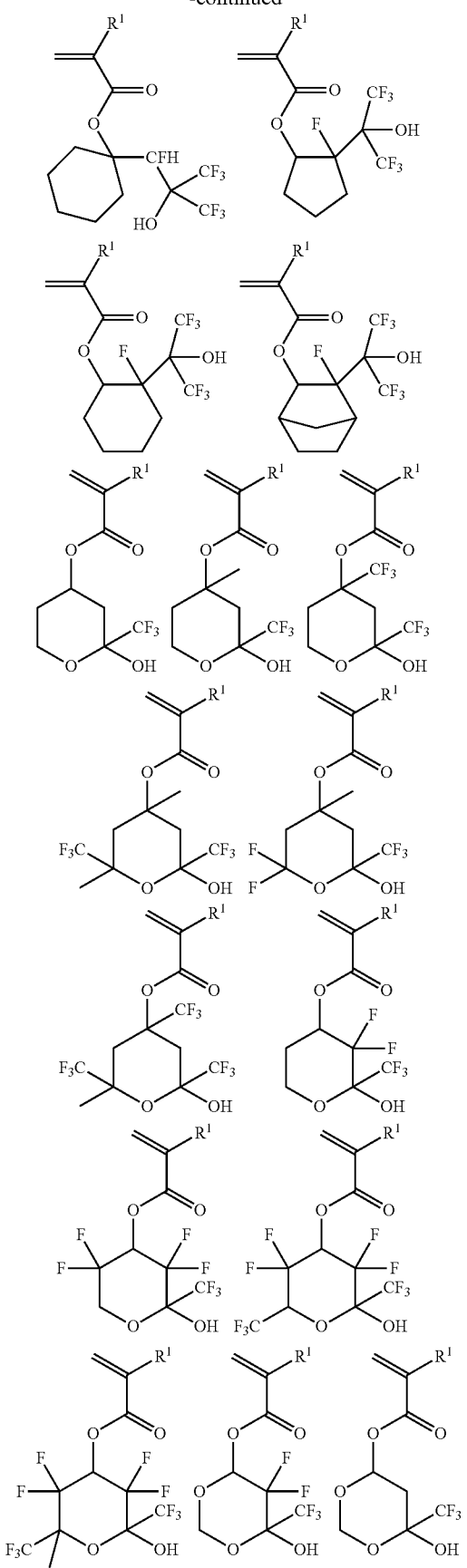
-continued
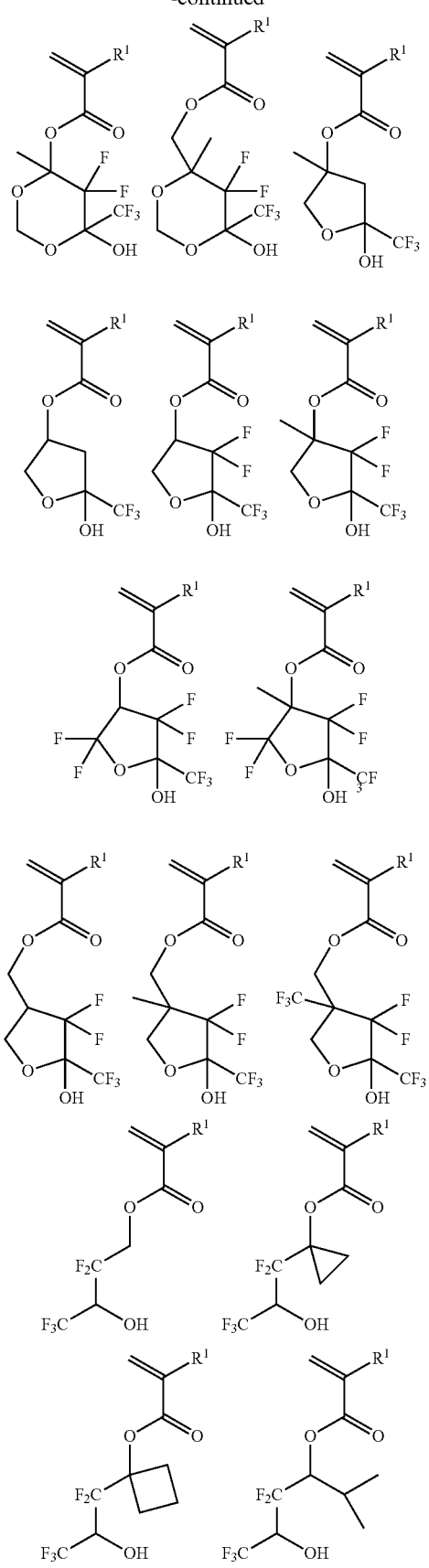

-continued
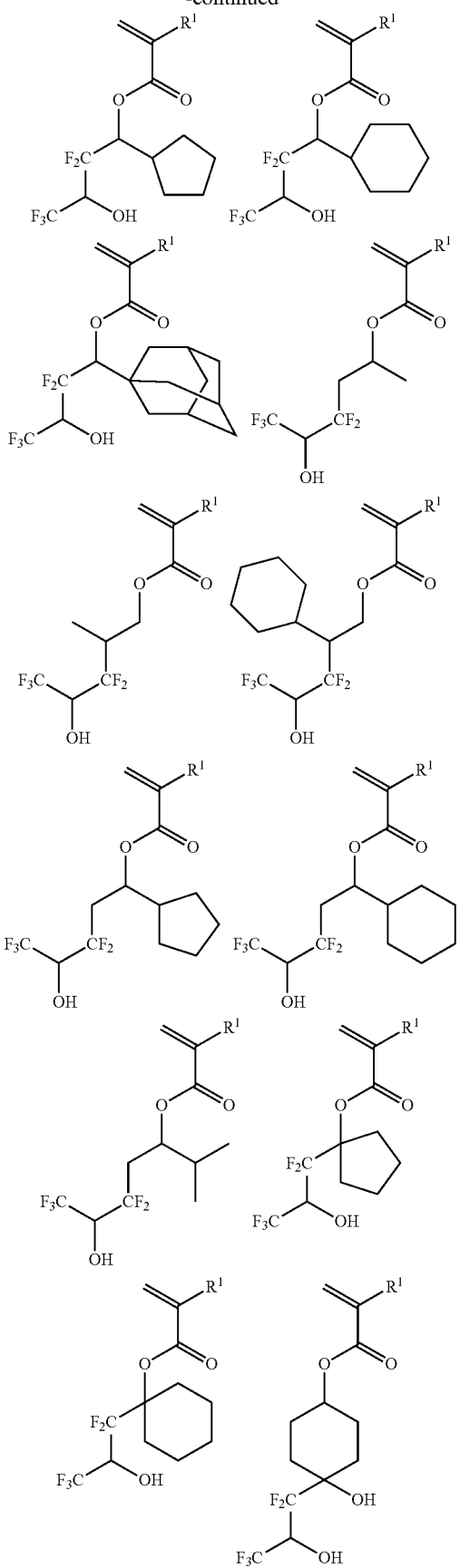
-continued
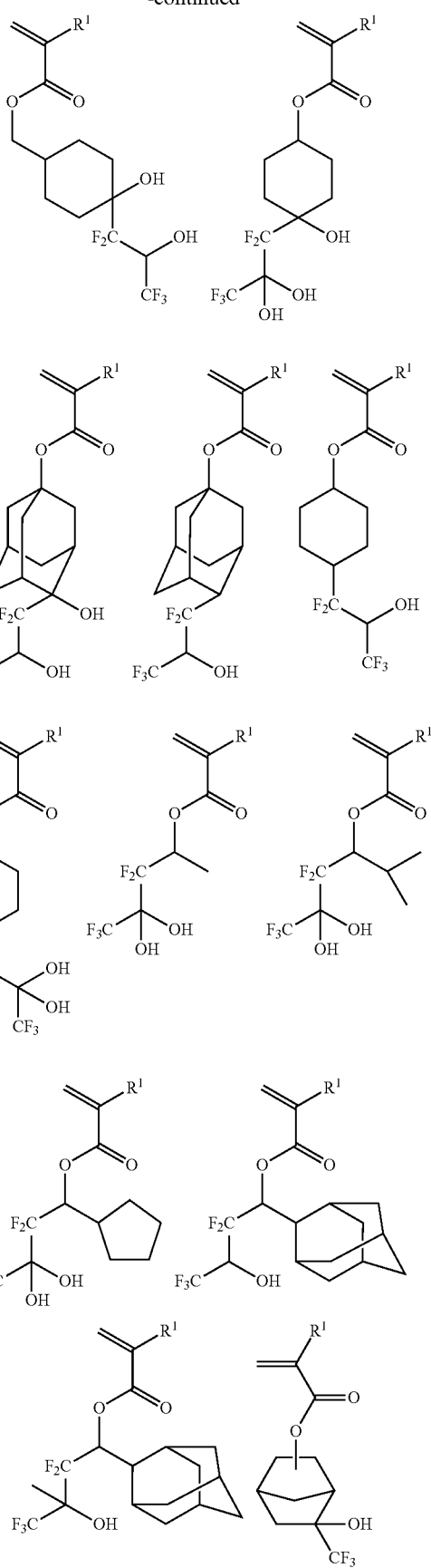

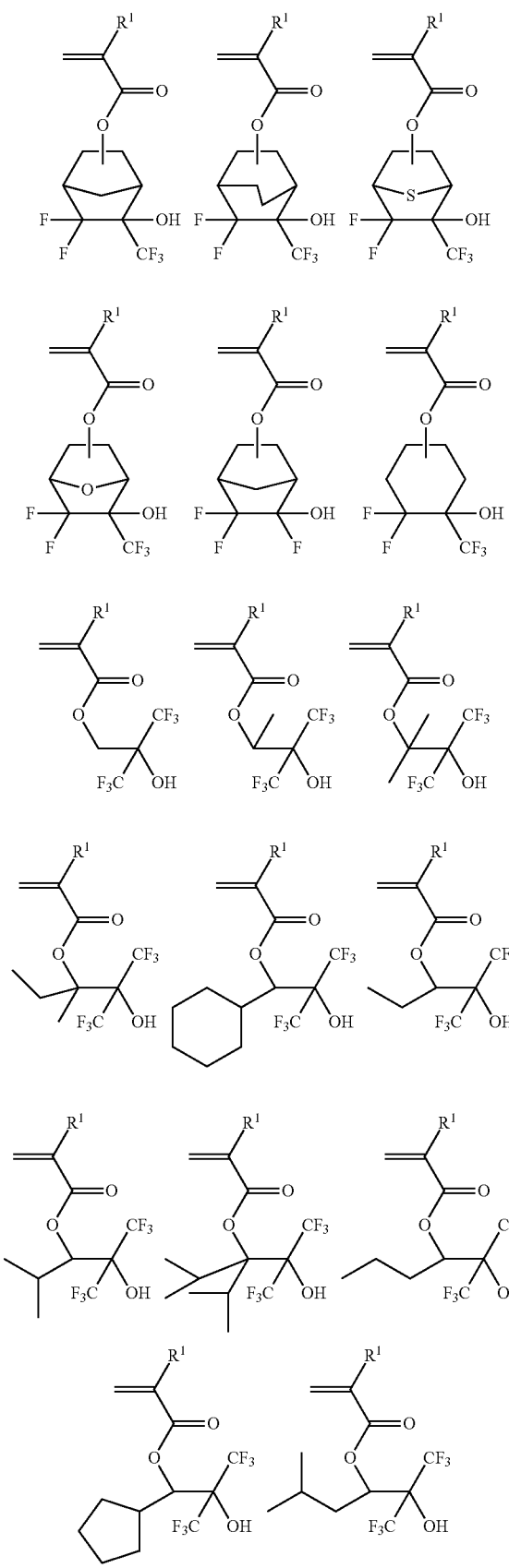
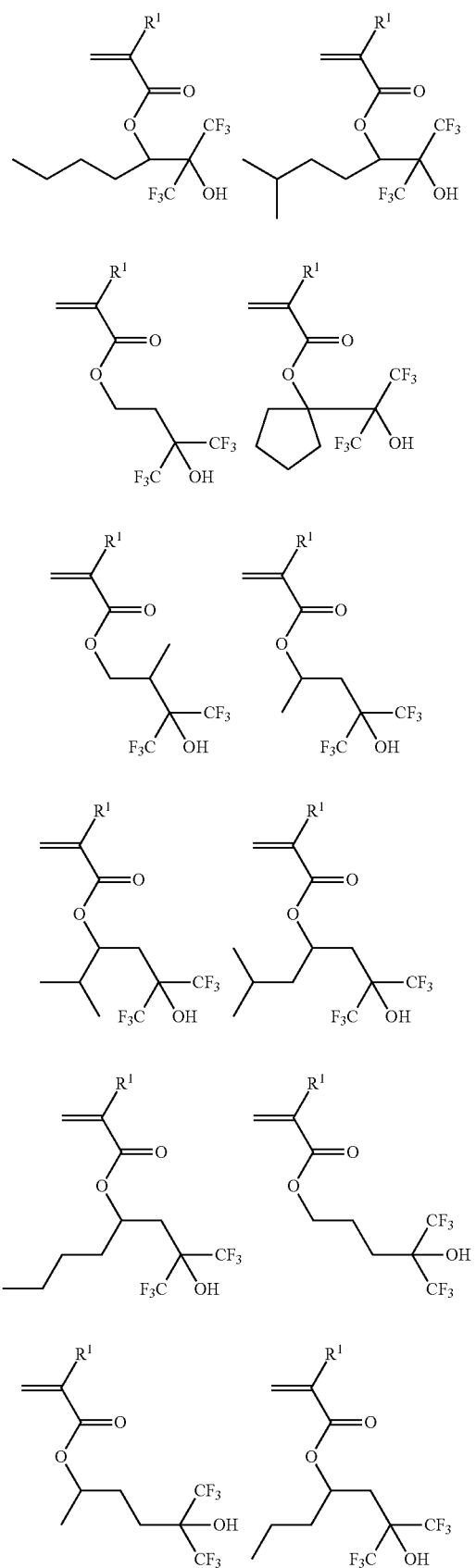

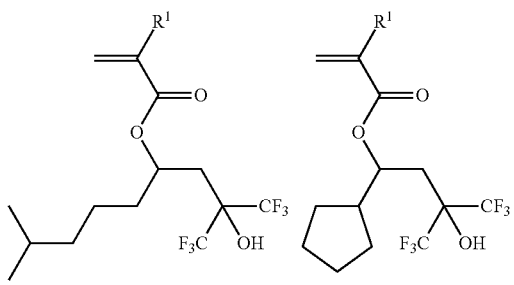
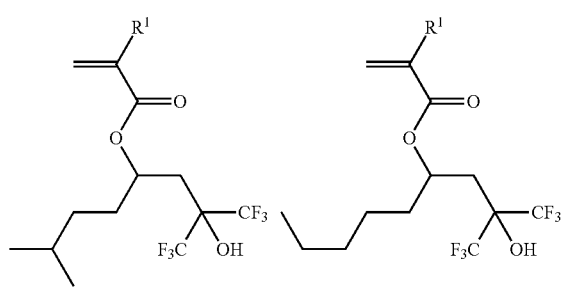
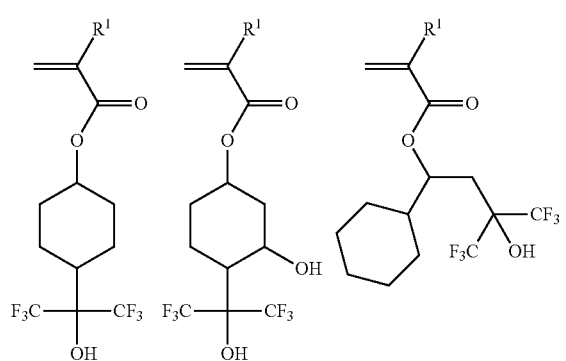
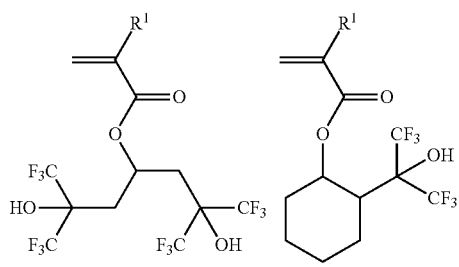
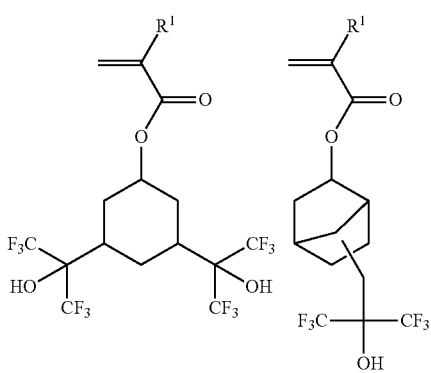

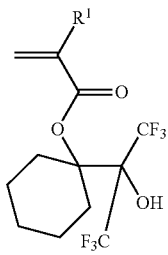

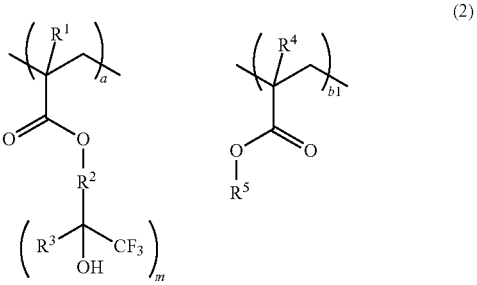

Preferably the second polymer used as a base resin in the second positive resist composition comprises recurring units (a) having a 2,2,2-trifluoro-1-hydroxyethyl group and recurring units (b) having an acid labile group as represented by the general formula (2).

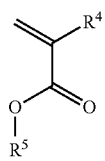

(2)

Herein $R^1$ to $R^3$ and m are as defined above, $R^4$ is hydrogen or methyl, $R^5$ is an acid labile group, a and b1 are numbers in the range: $0<a<1.0$, $0<b1<1.0$, and $0<a+b1\le1.0$.

The monomers from which recurring units (b1) are derived are represented by the following formula.

Herein $R^4$ and $R^5$ are as defined above.

In the second polymer, a monomer corresponding to recurring units (e) having a phenolic hydroxyl group, as described above, may be copolymerized.

Further, the second polymer may have copolymerized therein recurring units (g) having a hydroxyl group, as described below, for enhancing the solubility in the alcohol solvent. It is acceptable that the recurring units having a hydroxyl group be introduced into the first polymer. Since the introduction of recurring units having a hydroxyl group enhances the effect of controlling acid diffusion, an improvement in the lithographic performance by controlled acid diffusion is expected not only for the second resist composition, but also for, the first resist composition.

Examples of the recurring units (g) having a hydroxyl group are shown below.

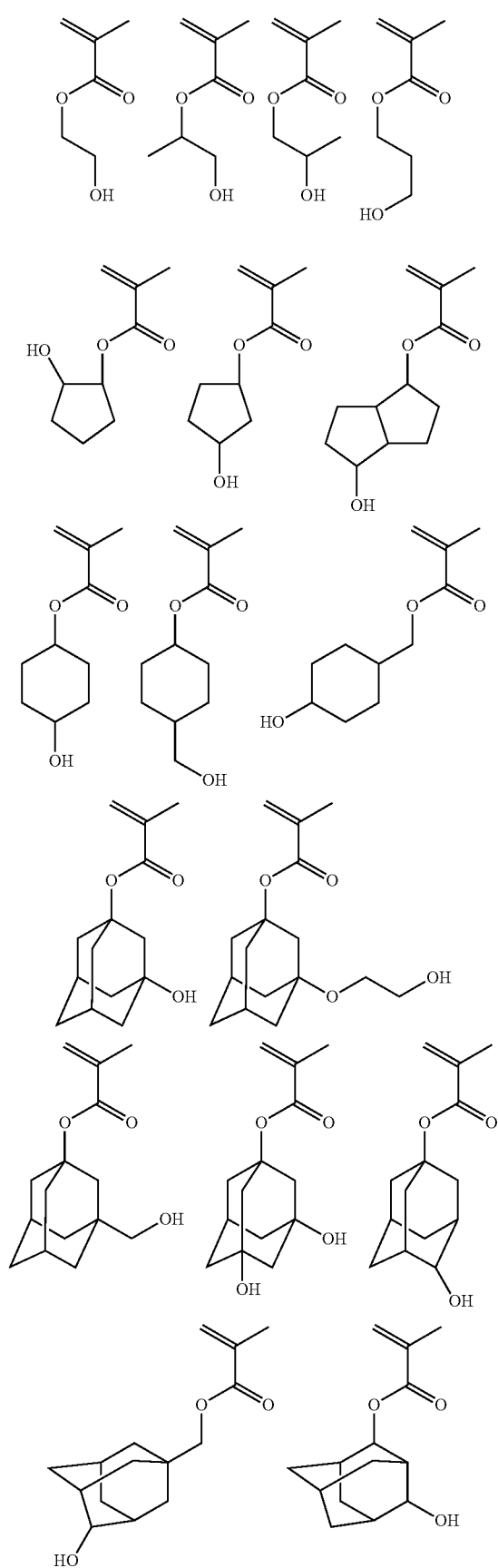
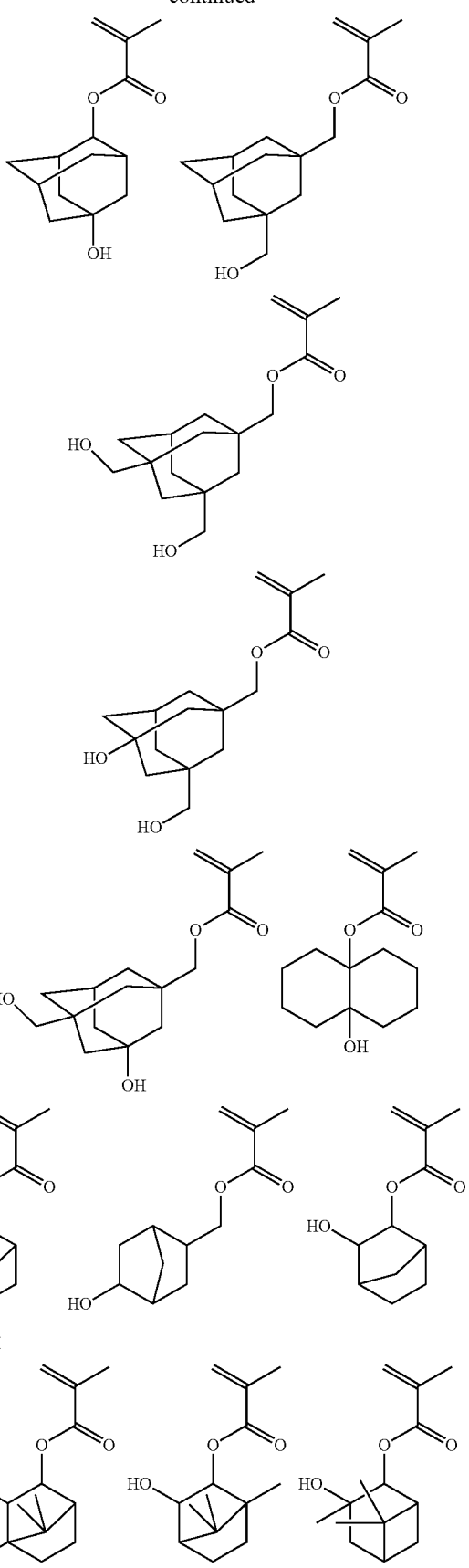
-continued

-continued
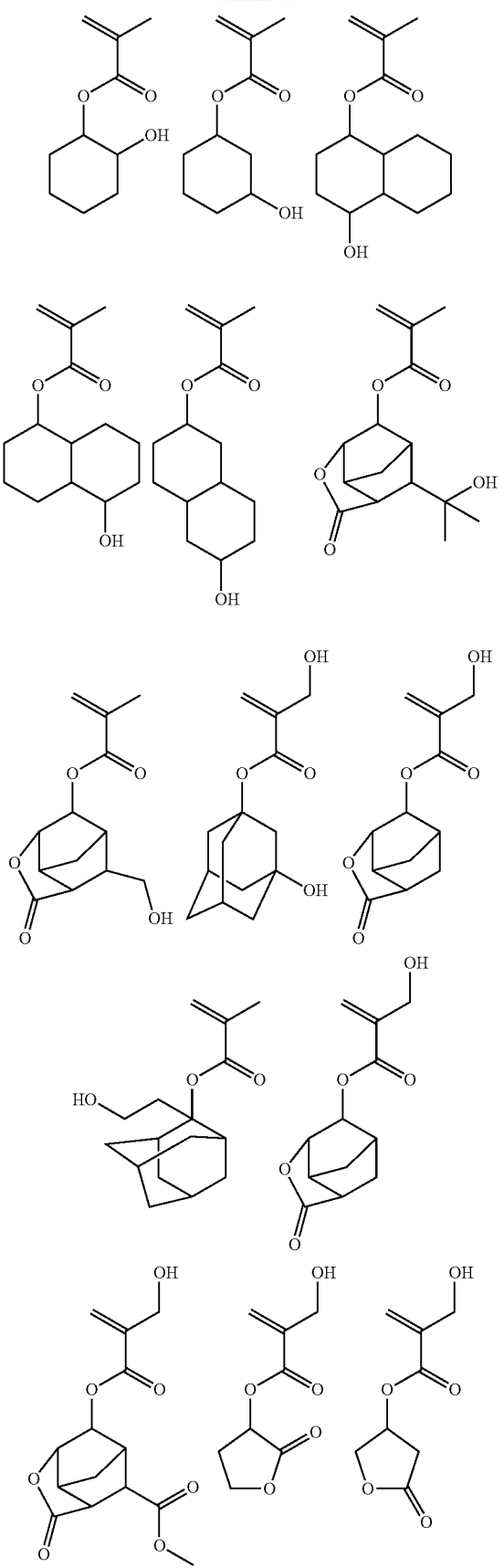
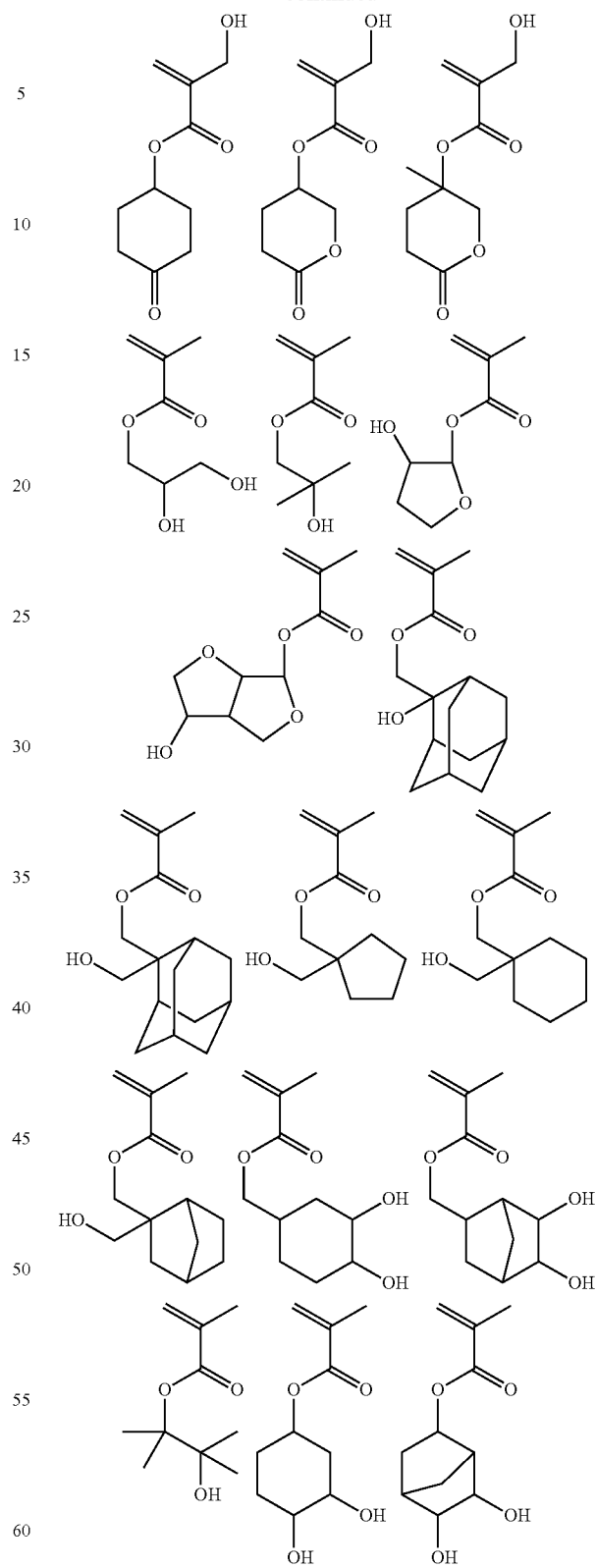
Further, the second polymer may have copolymerized therein recurring units (h) having a sulfonamide group, as illustrated below. This also enhances the solubility of the polymer in the alcohol solvent.

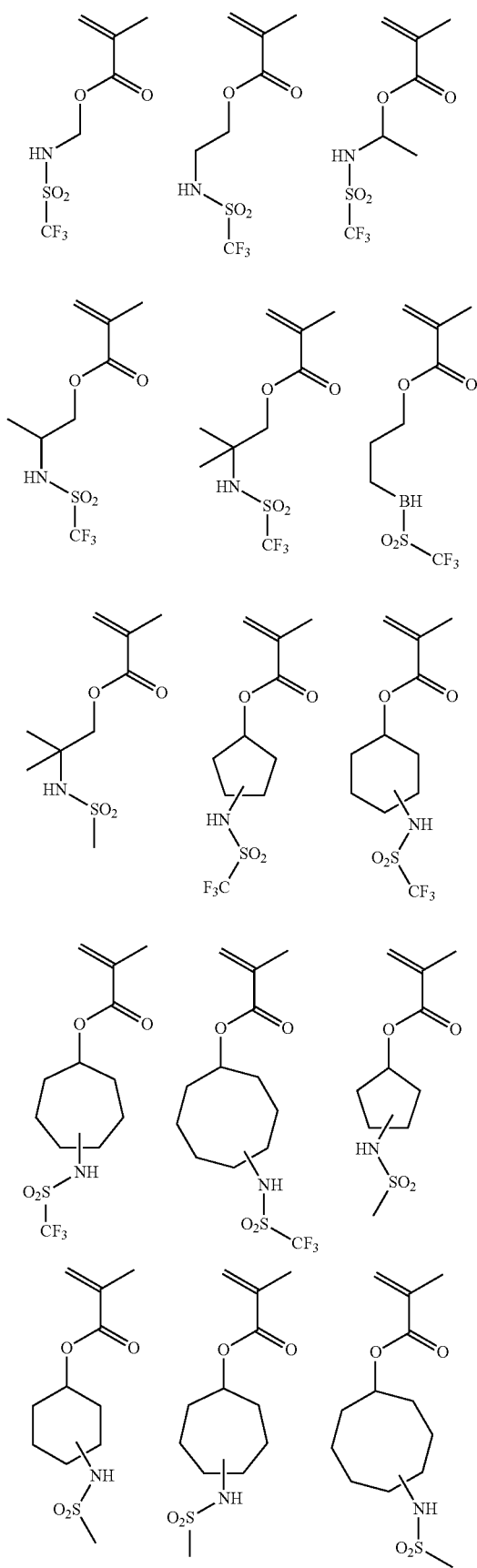

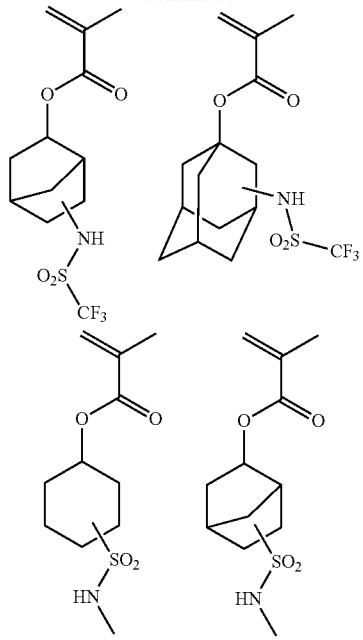

In addition to recurring units (a) and acid labile group-containing recurring units (b1) as represented by formula (2), the second polymer used in the second resist composition may have further copolymerized therein recurring units (d) having an adhesive group selected from among lactone ring, carbonate, thiocarbonate, carbonyl, cyclic acetal, ether, ester, sulfonic acid ester, cyano, amide groups, and —O—C(=O)—Y— wherein Y is sulfur or NH, as described above.

The acid labile group represented by $R^5$, $R^8$, $R^{11}$ and $R^{15}$ in formulae (2) and (3) may be selected from a variety of such groups. The acid labile groups may be the same or different and preferably include groups of the following formulae (A-1) and (A-2), tertiary alkyl groups of the following formula (A-3), and oxoalkyl groups of 4 to 20 carbon atoms.

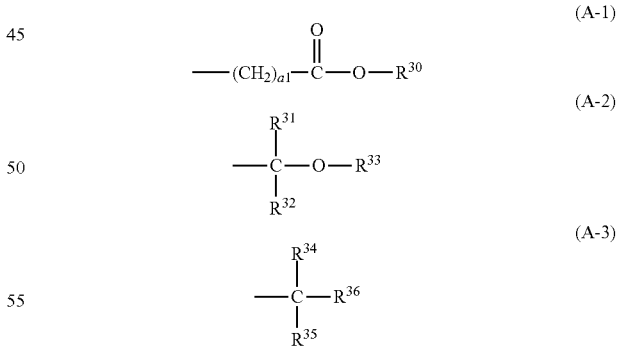

In formula (A-1), e is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter a1 is an integer of 0 to 6.

In formula (A-2), $R^{31}$ and $R^{32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

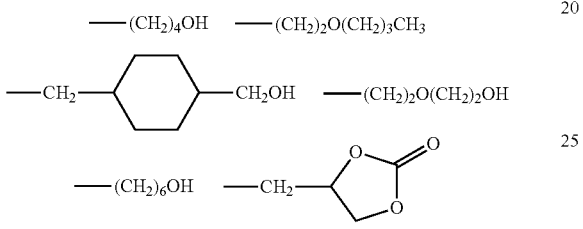

A pair of $R^{31}$ and $R^{32}$, $R^{31}$ and $R^{33}$, or $R^{32}$ and $R^{33}$ may bond together to form a ring with the carbon and oxygen atoms to which they are attached. Each of $R^{31}$, $R^{32}$ and $R^{33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

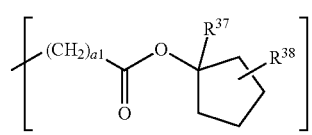 (A-1)-1

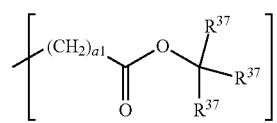 (A-1)-2

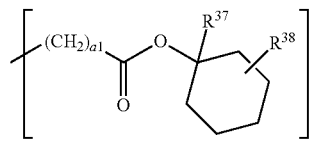 (A-1)-3

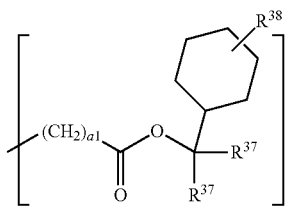 (A-1)-4

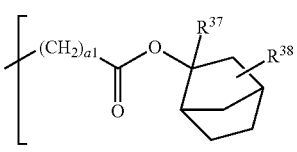 (A-1)-5

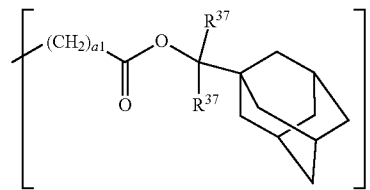 (A-1)-6

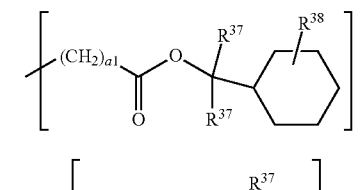 (A-1)-7

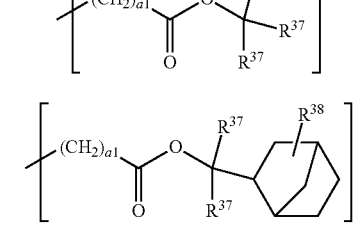 (A-1)-8

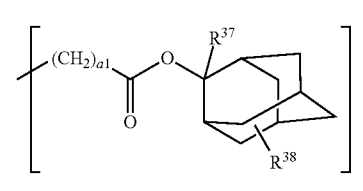 (A-1)-9

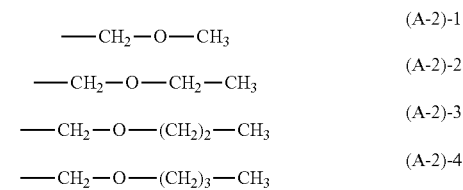 (A-1)-10

Herein $R^{37}$ is each independently a straight, branched or cyclic $C_1$-$C_{10}$ alkyl group or $C_6$-$C_{20}$ aryl group, $R^{38}$ is hydrogen or a straight, branched or cyclic $C_1$-$C_{10}$ alkyl group, $R^{39}$ is each independently a straight, branched or cyclic $C_2$-$C_{10}$ alkyl group or $C_6$-$C_{20}$ aryl group, and a1 is as defined above.

Of the acid labile groups of formula (A-2), the straight and branched ones are exemplified by the following, groups having formulae (A-2)-1 to (A-2)-69.

—CH₂—O—CH₃ (A-2)-1

—CH₂—O—CH₂—CH₃ (A-2)-2

—CH₂—O—(CH₂)₂—CH₃ (A-2)-3

—CH₂—O—(CH₂)₃—CH₃ (A-2)-4

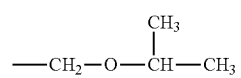 (A-2)-5
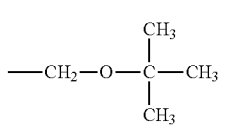 (A-2)-6
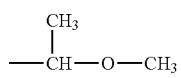 (A-2)-7
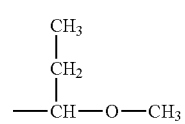 (A-2)-8
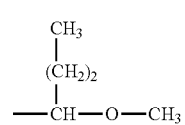 (A-2)-9
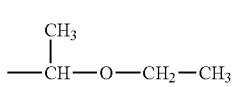 (A-2)-10
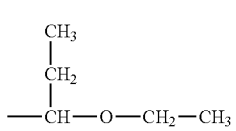 (A-2)-11
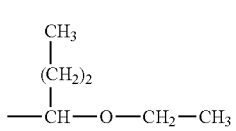 (A-2)-12
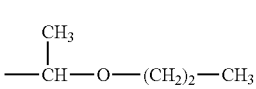 (A-2)-13
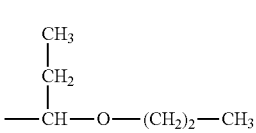 (A-2)-14
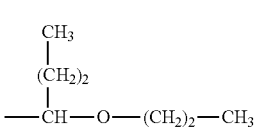 (A-2)-15
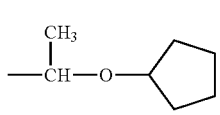 (A-2)-16
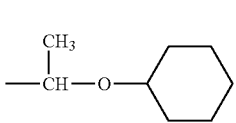 (A-2)-17
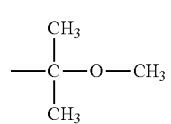 (A-2)-18
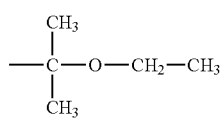 (A-2)-19
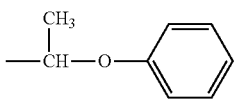 (A-2)-20
 (A-2)-21
 (A-2)-22
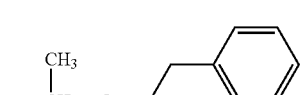 (A-2)-23
 (A-2)-24
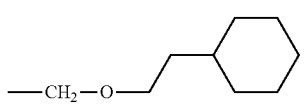 (A-2)-25
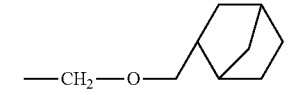 (A-2)-26
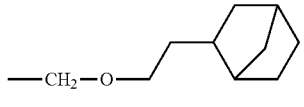 (A-2)-27
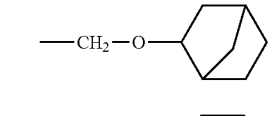 (A-2)-28
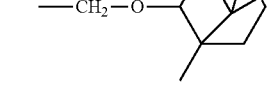 (A-2)-29
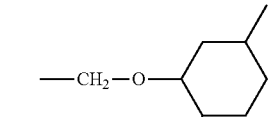 (A-2)-30
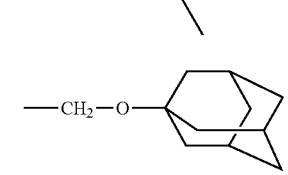 (A-2)-31

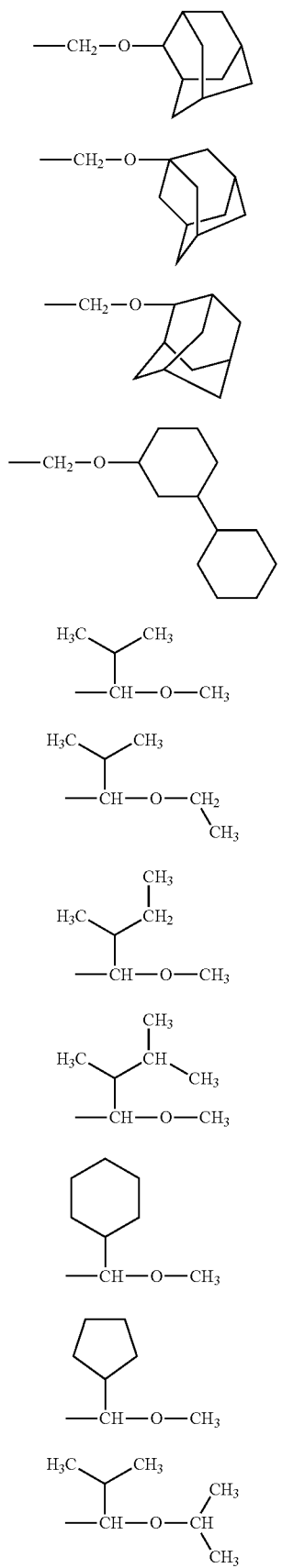
(A-2)-32
(A-2)-33
(A-2)-34
(A-2)-35
(A-2)-36
(A-2)-37
(A-2)-38
(A-2)-39
(A-2)-40
(A-2)-41
(A-2)-42
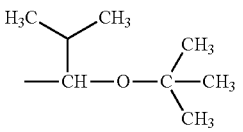 (A-2)-43
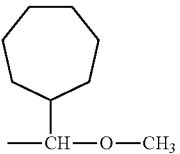 (A-2)-44
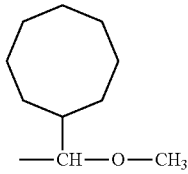 (A-2)-45
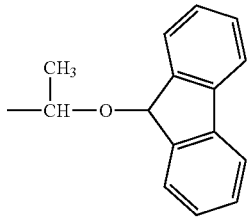 (A-2)-46
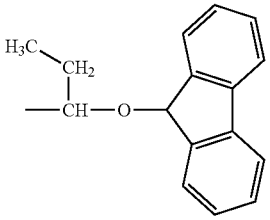 (A-2)-47
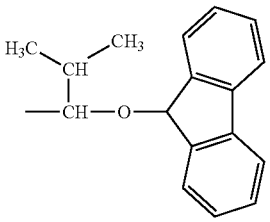 (A-2)-48
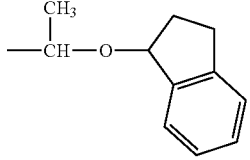 (A-2)-49
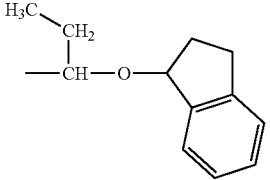 (A-2)-50

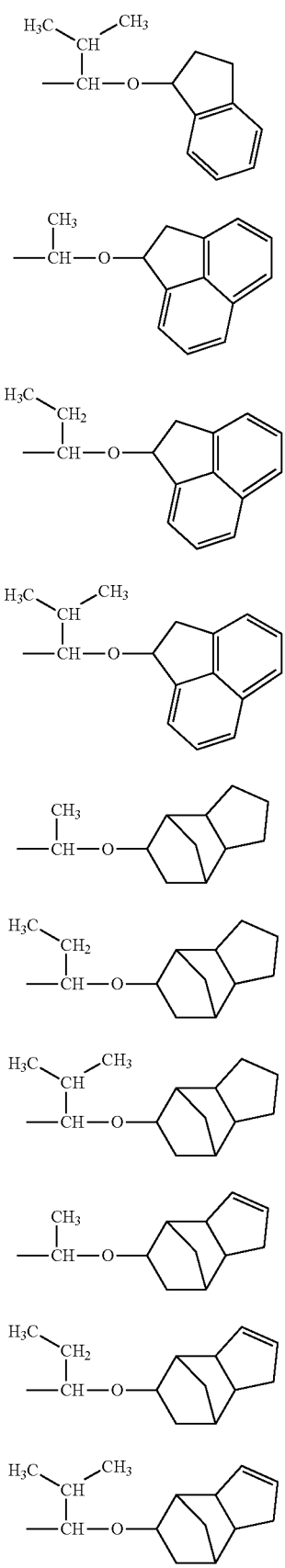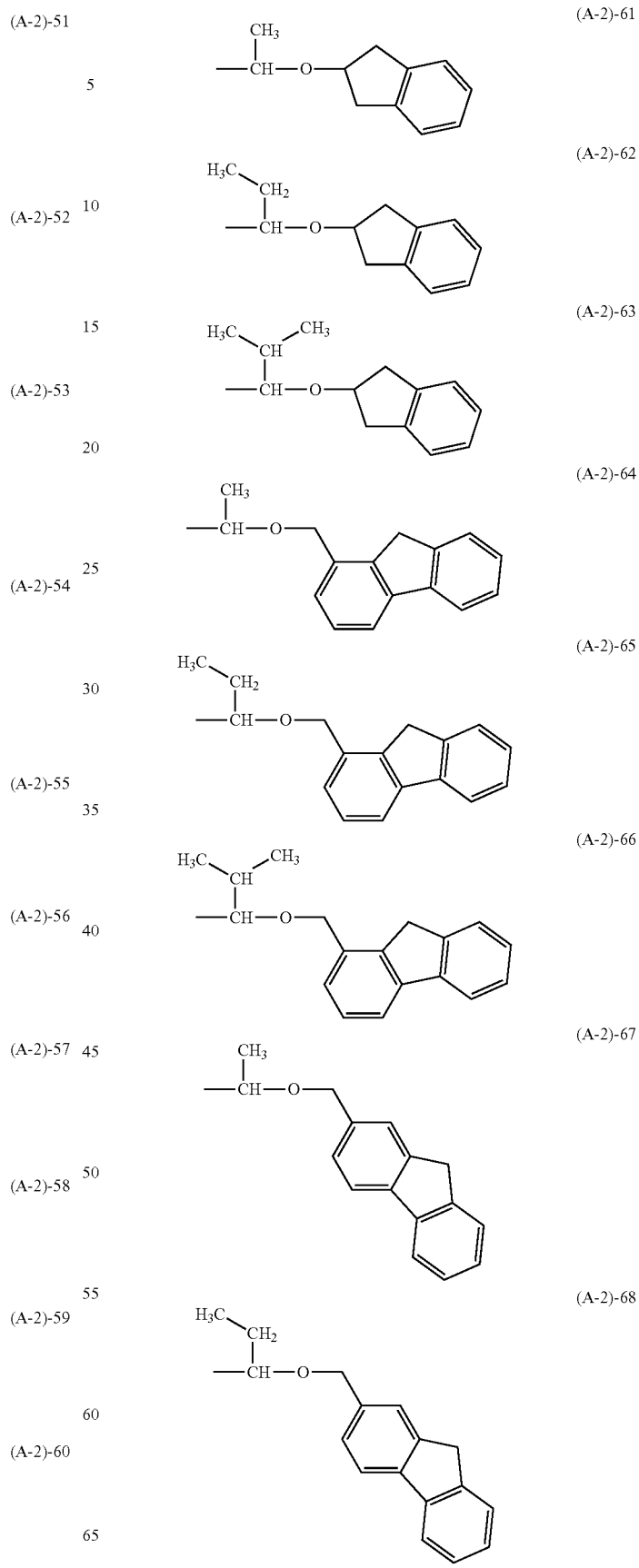

(A-2)-69

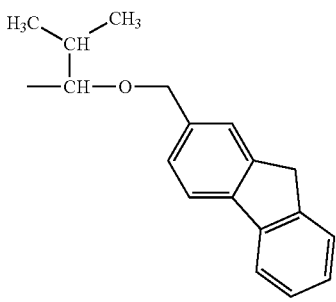

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

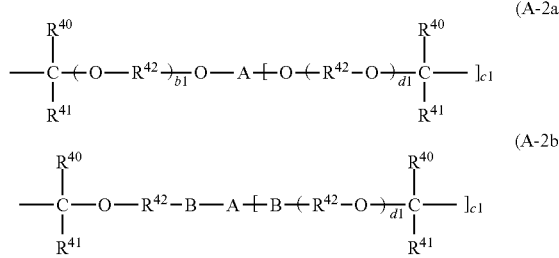

Herein $R^{40}$ and $R^{41}$ each are hydrogen or a straight, branched or cyclic $C_1$-$C_8$ alkyl group, or $R^{40}$ and $R^{41}$, taken together, may form a ring with the carbon atom to which they are attached, and $R^{40}$ and $R^{41}$ are straight or branched $C_1$-$C_8$ alkylene groups when they form a ring. $R^{42}$ is a straight, branched or cyclic $C_1$-$C_{10}$ alkylene group. Each of b1 and d1 is 0 or an integer of 1 to 10, preferably 0 or an integer of 1 to 5, and c1 is an integer of 1 to 7. "A" is a (c1+1)-valent aliphatic or alicyclic saturated hydrocarbon group, aromatic hydrocarbon group or heterocyclic group having 1 to 50 carbon atoms, which may be separated by a heteroatom or in which some hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may contain a heteroatom or in which some hydrogen atoms attached to carbon atoms may be substituted by hydroxyl, carboxyl, acyl groups or halogen atoms. The subscript c1 is preferably an integer of 1 to 3.

The crosslinking acetal groups of formulae (A-2a) and (A-2b) are exemplified by the following formulae (A-2)-70 through (A-2)-77.

(A-2)-70

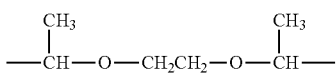

(A-2)-71

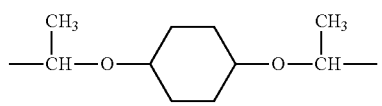

(A-2)-72

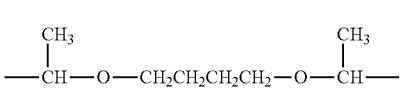

(A-2)-73

(A-2)-74

(A-2)-75

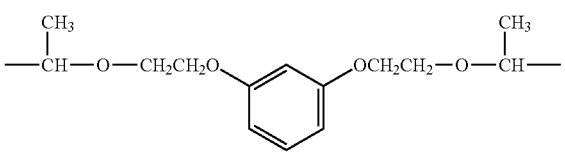

(A-2)-76

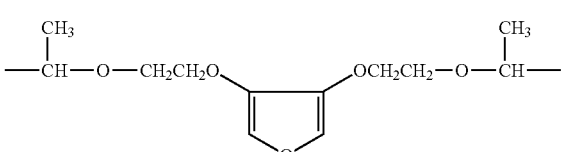

(A-2)-77

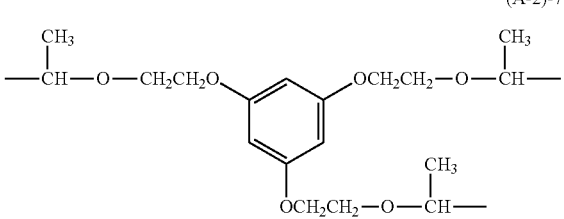

In formula (A-3), $R^{34}$, $R^{35}$ and $R^{36}$ each are a monovalent hydrocarbon group, typically a straight, branched or cyclic alkyl group, which may contain a heteroatom such as oxygen, sulfur, nitrogen or fluorine. A pair of $R^{34}$ and $R^{35}$, $R^{34}$ and $R^{36}$, or $R^{35}$ and $R^{36}$ may bond together to form a $C_3$-$C_{20}$ aliphatic ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

(A-3)-1

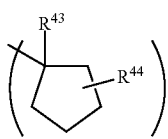

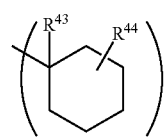 (A-3)-2
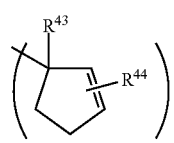 (A-3)-3
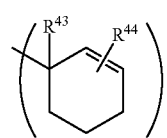 (A-3)-4
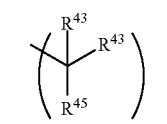 (A-3)-5
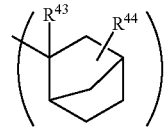 (A-3)-6
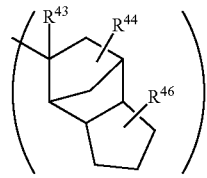 (A-3)-7
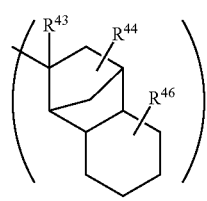 (A-3)-8
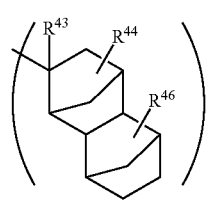 (A-3)-9
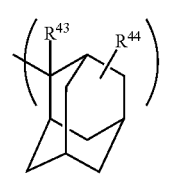 (A-3)-10
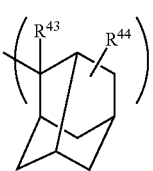 (A-3)-11
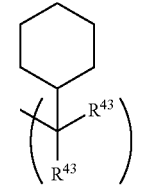 (A-3)-12
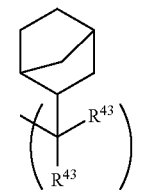 (A-3)-13
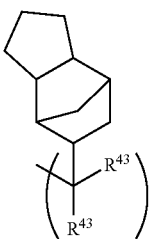 (A-3)-14
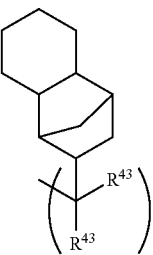 (A-3)-15
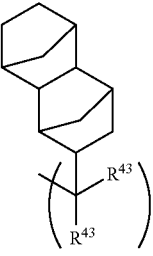 (A-3)-16
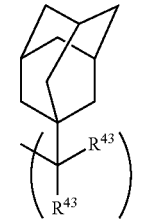 (A-3)-17

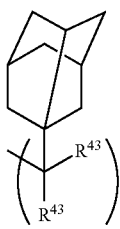

(A-3)-18

Herein $R^{43}$ is each independently a straight, branched or cyclic $C_1$-$C_6$ alkyl group or $C_6$-$C_{20}$ aryl group, typically phenyl, $R^{44}$ and $R^{46}$ each are hydrogen or a straight, branched or cyclic $C_1$-$C_{20}$ alkyl group, and $R^{45}$ is a straight, branched or cyclic $C_1$-$C_8$ alkyl group, $C_6$-$C_{20}$ aryl group, typically phenyl, or $C_2$-$C_{20}$ alkenyl group.

The polymer may be crosslinked within the molecule or between molecules with groups having $R^{47}$ which is a di- or multi-valent alkylene or arylene group, as shown by the following formulae (A-3)-19 and (A-3)-20.

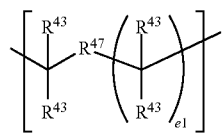

(A-3)-19

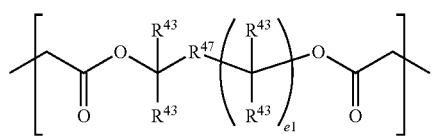

(A-3)-20

Herein $R^{43}$ is as defined above, $R^{47}$ is a straight, branched or cyclic $C_1$-$C_{20}$ alkylene group or arylene group, typically phenylene, which may contain a heteroatom such as oxygen, sulfur or nitrogen, and e1 is an integer of 1 to 3.

$R^{30}$, $R^{33}$, and $R^{36}$ in formulae (A-1), (A-2), and (A-3) may be substituted or unsubstituted aryl groups such as phenyl, p-methylphenyl, p-ethylphenyl, and alkoxy-substituted phenyl, typically p-methoxyphenyl, aralkyl groups such as benzyl and phenethyl, or alkyl or oxoalkyl groups which may contain an oxygen atom, and substituted forms in which a carbon-bonded hydrogen atom is substituted by hydroxyl or two hydrogen atoms are replaced by an oxygen atom to form carbonyl. The substituted alkyl and oxoalkyl groups are as shown below.

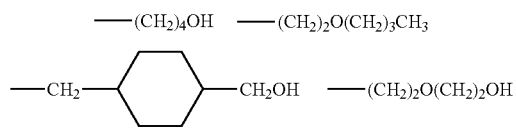

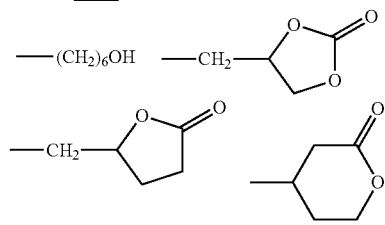

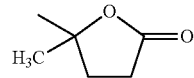

Of recurring units having acid labile groups of formula (A-3), recurring units of (meth)acrylate having an exo-form structure represented by the formula (A-3)-21 are preferred.

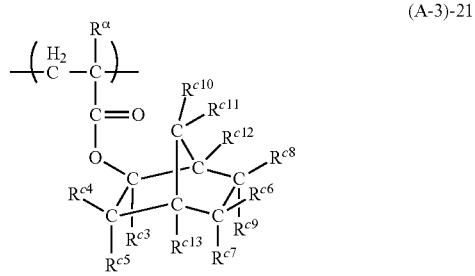

(A-3)-21

Herein, $R^\alpha$ is hydrogen or methyl; $R^{c3}$ is a straight, branched or cyclic $C_1$-$C_8$ alkyl group or an optionally substituted $C_6$-$C_{20}$ aryl group; $R^{c4}$ to $R^{c9}$, $R^{c12}$ and $R^{c13}$ are each independently hydrogen or a monovalent $C_1$-$C_{15}$ hydrocarbon group which may contain a heteroatom; and $R^{c10}$ and $R^{c11}$ are hydrogen. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

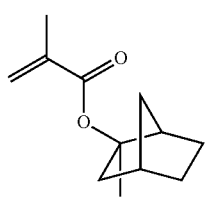 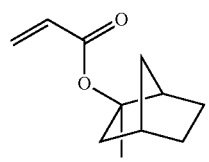

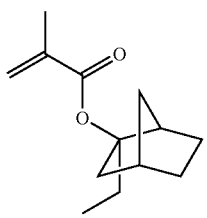 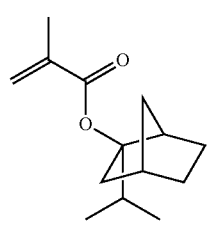

-continued

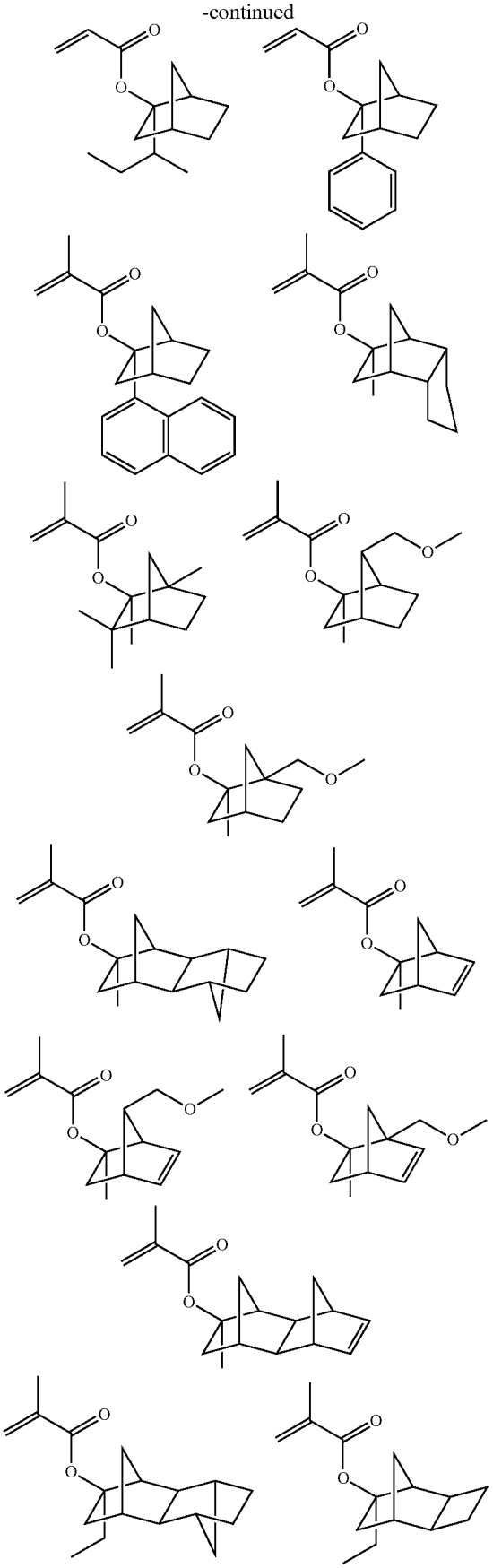

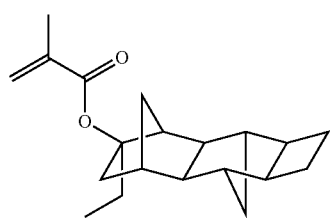

Also included in the acid labile groups of formula (A-3) are acid labile groups of (meth)acrylate having furandiyl, tetrahydrofurandiyl or oxanorbornanediyl as represented by the following formula (A-3)-22.

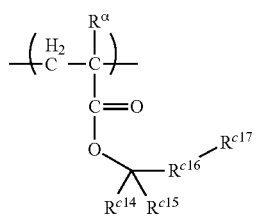

(A-3)-22

Herein, $R^{\alpha}$ is as defined above; $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

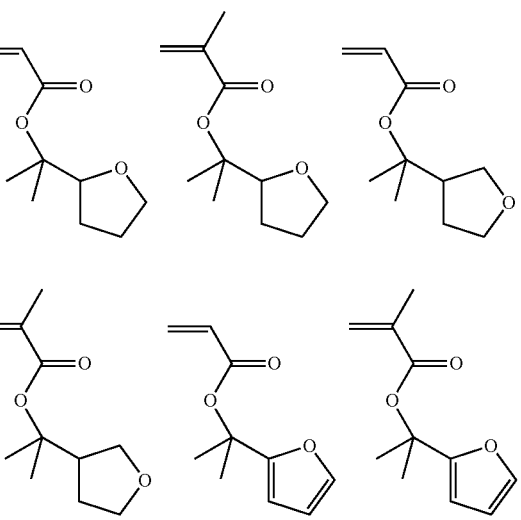

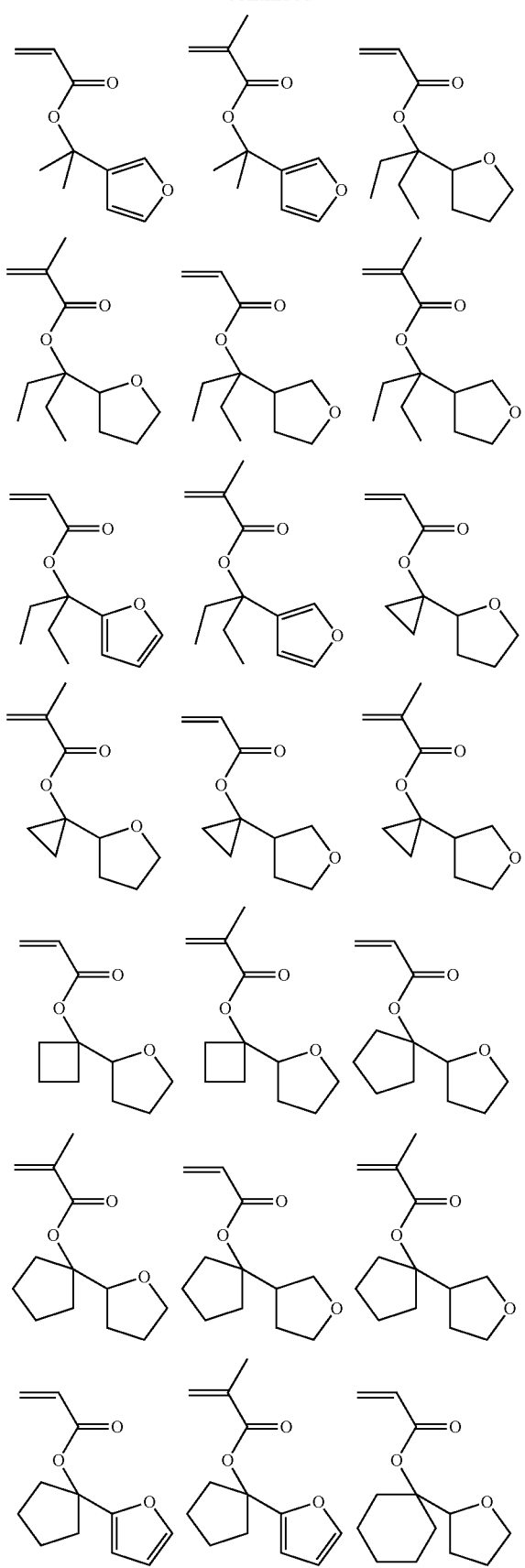
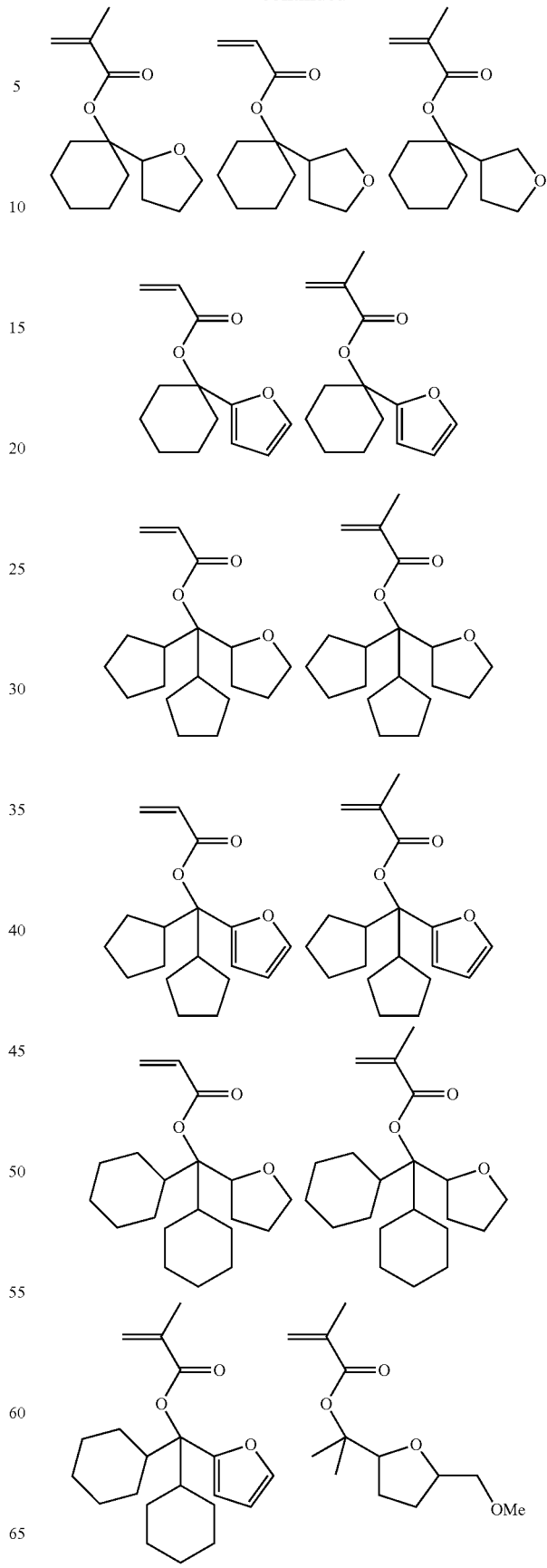

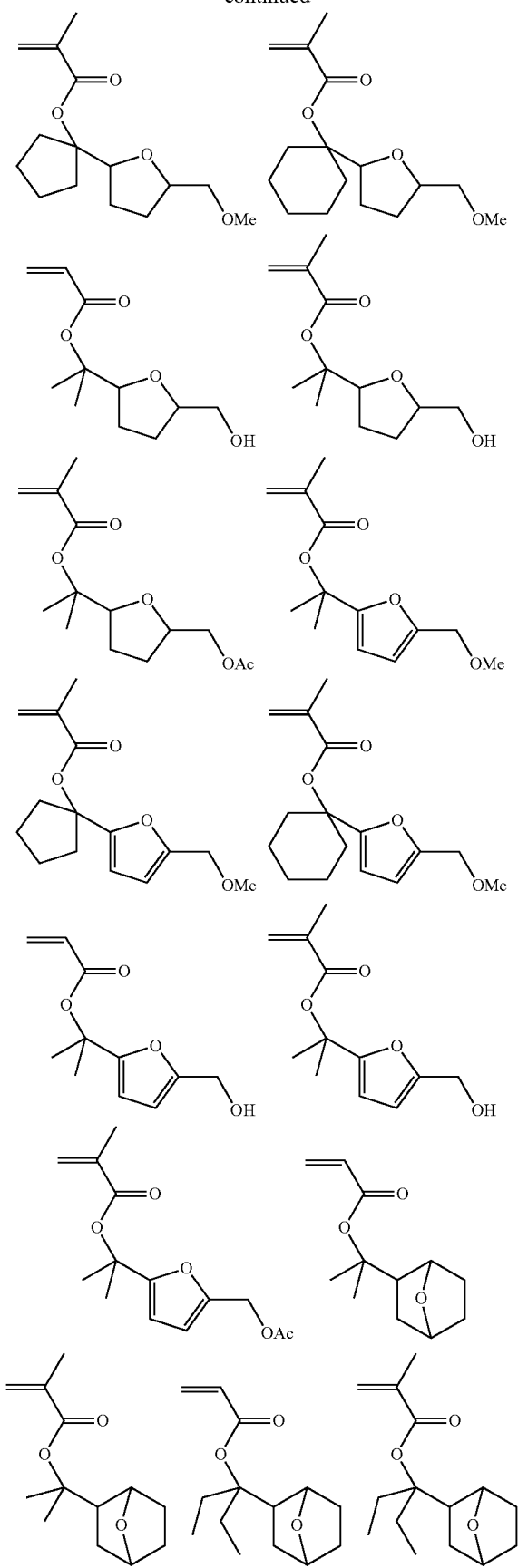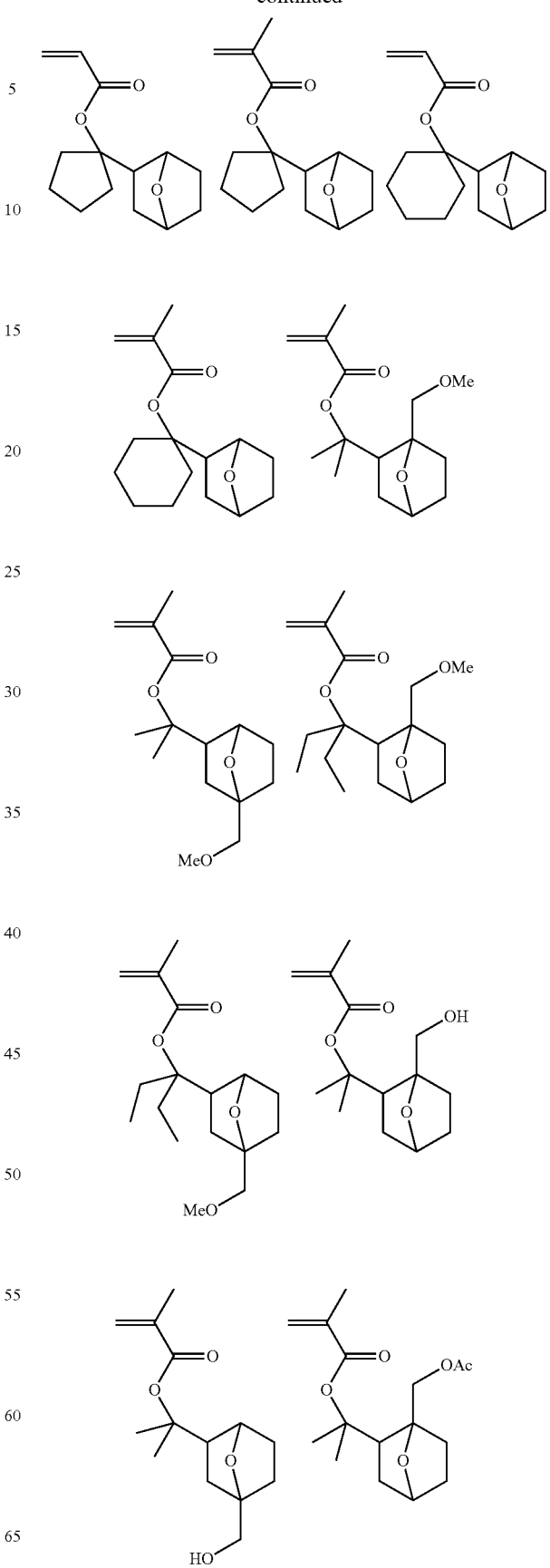

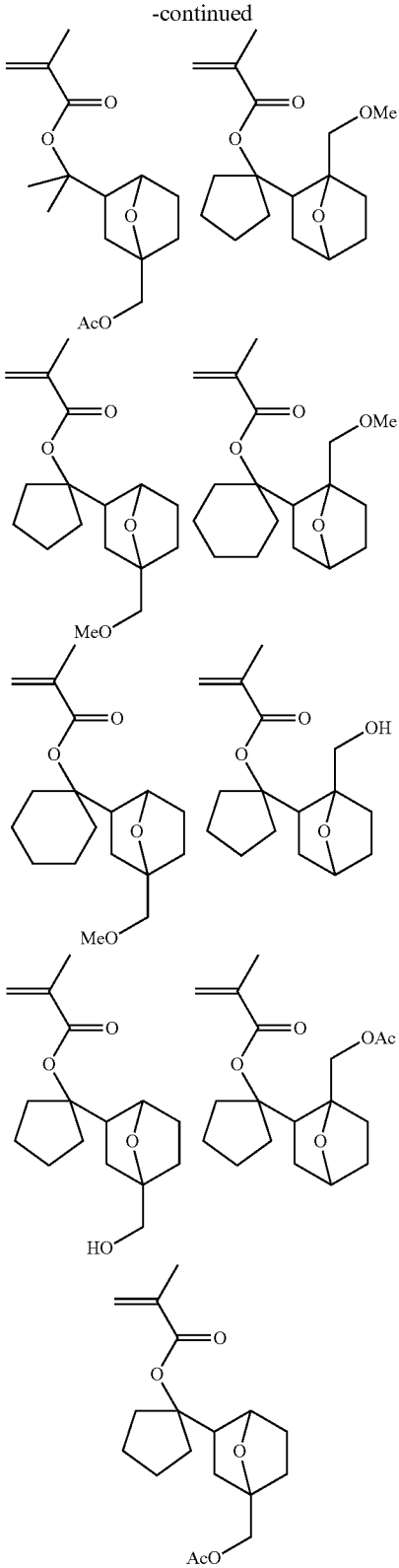

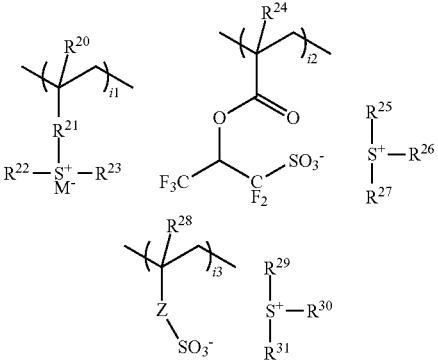

(4)

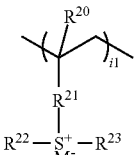

Herein $R^{20}$, $R^{24}$, and $R^{28}$ each are hydrogen or methyl. $R^{21}$ is a phenylene group, —O—R— or —C(=O)—$Y^0$—R— wherein $Y^0$ is an oxygen atom or NH, and R is a straight, branched or cyclic $C_1$-$C_6$ alkylene, phenylene, or alkenylene group, which may contain a carbonyl (—CO—), ester (—COO—), ether (—O—) or hydroxyl radical. $R^{22}$, $R^{23}$, $R^{25}$, $R^{26}$, $R^{27}R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl group, $C_7$-$C_{20}$ aralkyl group or thiophenyl group. Z is a single bond, methylene, ethylene, phenylene, fluorinated phenylene, —O—$R^{32}$—, or —C(=O)—$Z_1$—$R^{32}$— wherein $Z_1$ is an oxygen atom or NH, and $R^{32}$ is a straight, branched or cyclic $C_1$-$C_6$ alkylene group, phenylene group or alkenylene group, which may contain a carbonyl, ester, ether or hydroxy radical. $M^-$ is a non-nucleophilic counter ion. The subscripts i1, i2 and i3 are numbers in the range: $0 \leq i1 \leq 0.3$, $0 \leq i2 \leq 0.3$, $0 \leq i3 \leq 0.3$, and $0 < i1+i2+i3 \leq 0.3$.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide, and bis(perfluorobutylsulfonyl)imide; and methidates such as tris(trifluoromethylsulfonyl)methide and tris(perfluoroethylsulfonyl)methide.

Other non-nucleophilic counter ions include sulfonates having fluorine substituted at α-position as represented by the general formula (K-1) and sulfonates having fluorine substituted at α- and β-positions as represented by the general formula (K-2).

 (K-1)

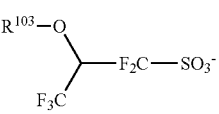 (K-2)

In the first and second resist compositions used herein, the polymers may have further copolymerized therein recurring units (i1), (i2) or (i3) having a sulfonium salt, represented by the general formula (4). It is noted that these units are collectively referred to as units (i).

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl radical, lactone ring or fluorine. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl radical or lactone ring.

The first base polymer in the first resist composition should be insoluble in $C_3$-$C_8$ alcohol solvents. To be insoluble in these solvents, the first polymer should preferably have an adhesive group selected from among lactone ring, carbonate, thiocarbonate, carbonyl, cyclic acetal, ether, ester, sulfonic acid ester, cyano, amide groups, and —O—C(=O)—Y— wherein Y is sulfur or NH. Since recurring units (a) facilitate, dissolution in $C_3$-$C_8$ alcohol solvents, desirably these units should not be introduced into the first polymer, or if introduced, should be limited to a copolymerization ratio of 20 mol % or less. In contrast, since recurring units (a) are introduced into the second polymer to ensure solubility in the $C_3$-$C_8$ alcohol solvents, it is acceptable to introduce into the second polymer an adhesive group selected from among lactone ring, carbonate, thiocarbonate, carbonyl, cyclic acetal, ether, ester, sulfonic acid ester, cyano, amide groups, and —O—C(=O)—Y—. It is rather recommended to introduce such an adhesive group into the second polymer because the adhesion of the second polymer is improved.

The first base polymer in the first resist composition may have copolymerized therein recurring units (b2) having an acid labile group and recurring units (d) having an adhesive group selected from among lactone ring, carbonate, thiocarbonate, carbonyl, cyclic acetal, ether, ester, sulfonic acid ester, cyano, amide groups, and —O—C(=O)—Y— wherein Y is sulfur or NH. The first resist film has the function of an antireflective coating (BARC) as well. For this function, strong absorption at the exposure wavelength is necessary. Specifically, the film should have such absorption as represented by a k value of 0.1 to 1.1, preferably 0.2 to 1.0. In the case of ArF excimer laser having an exposure wavelength of 193 nm, benzene ring has strong absorption in this wavelength band. In the first base polymer, benzene ring must be introduced into 30 to 100 mol % of recurring units. The benzene ring may be introduced as an acid labile group or as a phenolic hydroxyl group or adhesive group having lactone.

The first resist film due to a high aromatic content has high etching resistance and high barrier properties during ion implantation, and offers a high function as a mask against both etching and ion implantation. Although the second resist film has only etching resistance comparable to conventional ArF resist materials, a combination of the second resist film with the first resist film provides high resistance.

In the case of conventional BARC, since the BARC film is processed by dry etching through the resist pattern as a mask, it must have a high etching rate. This means that the BARC film has little etch resistance. In contrast, the first resist film has the same antireflective effect as BARC, is processed with a developer to form a pattern, so eliminating the risk of the upper resist film being damaged by dry etching, and has high etching resistance.

The first polymer in the first resist composition comprises recurring units (b2), (c1), (c2), (d), (e), (f), (g), (h), and (i) in a copolymerization ratio in the range: $0 \le b2 < 1.0$, $0 \le c1 < 1.0$, $0 \le c2 < 1.0$, $0 < b2+c1+c2 \le 1.0$, $0 < d < 1.0$, $0 \le e < 1.0$, $0 \le f < 1.0$, $0 \le g < 1.0$, $0 \le h < 1.0$, $0 \le i < 1.0$; preferably $0 \le b2 \le 0.8$, $0 \le c1 \le 0.8$, $0 \le c2 \le 0.8$, $0.1 \le b2+c1+c2 \le 1.0$, $0.1 \le d \le 0.8$, $0 \le e \le 0.5$, $0 \le f \le 0.5$, $0 \le g \le 0.6$, $0 \le h \le 0.5$, $0 \le i \le 0.5$, and $b2+c1+c2+d+e+f+g+h+i=1$.

The second polymer in the second resist composition comprises recurring units (a), (b1), (d), (e), (f), (g), (h), and (i) in a copolymerization ratio in the range: $0 < a < 1.0$, $0 < b1 < 1.0$, $0 < a+b1 \le 1.0$, $0 \le d \le 0.5$, $0 \le e < 1.0$, $0 \le f < 1.0$, $0 \le g < 1.0$, $0 \le h < 1.0$, $0 \le i < 1.0$; preferably $0.1 \le a \le 0.8$, $0.1 \le b1 \le 0.8$, $0.2 \le a+b1 \le 1.0$, $0 \le d \le 0.4$, $0 \le e \le 0.5$, $0 \le f \le 0.5$, $0 \le g \le 0.6$, $0 \le h \le 0.5$, $0 \le i \le 0.5$, provided that $a+b1+d+e+f+g+h+i=1$.

It is noted that the meaning of $a+b+c+d=1$, for example, is that in a polymer comprising recurring units (a), (b), (c) and (d), the sum of recurring units (a), (b), (c) and (d) is 100 mol % based on the total amount of entire recurring units. The meaning of $a+b+c+d<1$ is that the sum of recurring units (a), (b), (c) and (d) is less than 100 mol % based on the total amount of entire recurring units, indicating the inclusion of other recurring units, for example, units (e), (f), (g), (h) and (i).

The polymer should preferably have a weight average molecular weight (Mw) in the range of 1,000 to 500,000, and more preferably 2,000 to 30,000, as measured in tetrahydrofuran (THF) or dimethylformamide (DMF) solvent by GPC using polystyrene standards. Outside the range, a lower Mw may lead to a lowering in the efficiency of thermal crosslinking of resist material after development whereas a polymer with too high a Mw may lose alkali solubility and have a likelihood of footing after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymers as used herein may be synthesized by any desired method, for example, by dissolving unsaturated bond-containing monomers corresponding to the respective units (a), (b), (c), (d), (e), (f), (g), (h), and (i) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once eliminated with an acid catalyst and thereafter protected or partially protected. The polymer used as the base resin is not limited to one type and a mixture of two or more polymers may be added. The performance of a resist material may be adjusted by using plural polymers.

The first and second positive resist compositions may further comprise an organic solvent, an acid generator, and optionally, a dissolution regulator, basic compound, surfactant, acetylene alcohol, and other components.

Each of the first and second positive resist compositions used herein may include an acid generator in order for the composition to function as a chemically amplified positive resist composition. Typical of the acid generator used herein is a photoacid generator (PAG) capable of generating an acid in response to actinic light or radiation. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]).

Examples of the organic solvent used in the first resist composition are described in JP-A 2008-111103, paragraphs [0144] to [0145] (U.S. Pat. No. 7,537,880). Specifically, exemplary solvents include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof.

The organic solvent in the second resist composition is a $C_3$-$C_8$ alkyl alcohol, examples of which include n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-1-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, and octanol.

In combination with the alcohol solvent, a $C_6$-$C_{12}$ ether may be used. Suitable ethers include methyl cyclopentyl ether, methyl cyclohexyl ether, diisopropyl ether, diisobutyl ether, diisopentyl ether, di-n-pentyl ether, methyl cyclopentyl ether, methyl cyclohexyl ether, di-n-butyl ether, di-sec-butyl ether, di-sec-pentyl ether, di-tert-amyl ether, di-n-hexyl ether, anisole, 2-methylanisole, 3-methylanisole, 4-methylanisole, 2,3-dimethylanisole, 2,4-dimethylanisole, 3,4-dimethylanisole, 2,5-dimethylanisole, 2,6-dimethylanisole, 3,5-dimethylanisole, 3,6-dimethylanisole, 2,3,4-trimethylanisole, 2,3,5-trimethylanisole, 2,4,5,6-tetramethylanisole, 2-ethylanisole, 3-ethylanisole, 4-ethylanisole, 2-isopropylanisole, 3-isopropylanisole, 4-isopropylanisole, 4-propylanisole, 2-butylanisole, 3-butylanisole, 4-butylanisole, 2-tert-butylanisole, 3-tert-butylanisole, 4-tert-butylanisole, pentamethylanisole, 2-vinylanisole, 3-vinylanisole, 4-methoxystyrene, ethyl phenyl ether, propyl phenyl ether, butyl phenyl ether, ethyl 3,5-xylyl ether, ethyl 2,6-xylyl ether, ethyl 2,4-xylyl ether, ethyl 3,4-xylyl ether, ethyl 2,5-xylyl ether, methyl benzyl ether, ethyl benzyl ether, isopropyl benzyl ether, propyl benzyl ether, methyl phenethyl ether, ethyl phenethyl ether, isopropyl phenethyl ether, propyl phenethyl ether, butyl phenethyl ether, vinyl phenyl ether, allyl phenyl ether, vinyl benzyl ether, allyl benzyl ether, vinyl phenethyl ether, allyl phenethyl ether, 4-ethylphenetole, and tert-butyl phenyl ether.

Examples of the basic compound which can be used in the first and second resist compositions are described in JP-A 2008-111103, paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

Notably, an appropriate amount of the acid generator is 0.5 to 30 parts, preferably 1 to 20 parts by weight, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base polymer.

Now referring to the drawings, the pattern forming process of the invention is illustrated in FIG. 1. A first positive resist composition is coated onto a processable substrate 20 disposed on a substrate 10 to form a first resist film 31 as shown in FIG. 1A. A second positive resist composition is coated on first resist film 31 to form a second resist film 32 as shown in FIG. 1B. After every application of the first and second resist compositions, the coating is baked for drying, i.e., removal of the solvent for thereby preventing intermixing between the first and second resist films and preventing the first resist film from being dissolved when the second resist composition is applied thereon. The bake temperature is preferably in a range of 60 to 180° C., more preferably 70 to 150° C. The first resist film typically has a thickness in the range of 5 to 100 nm while a thickness sufficient to achieve a satisfactory antireflective effect is preferably selected. This is followed by exposure, development and etching steps as shown in FIGS. 1C, 1D, and 1E, respectively.

In the case of the prior art pattern forming process using DBARC, the first resist film in FIG. 1 corresponds to the DBARC. When DBARC is used, a DBARC solution is coated and baked at a high temperature of about 200° C. to induce crosslinking reaction for thereby preventing dissolution and intermixing when a resist solution is coated thereon. However, the crosslinking reaction results in a substantial loss of solubility in developer, leaving a problem of scumming in the space portion.

In the pattern forming process using BARC, since BARC is not photosensitive, the exposed portion of BARC is not dissolved even after development of the resist film. In order to open the processable substrate surface in the exposed portion, the BARC is opened by dry etching through the resist pattern after development as a mask. Thus the thickness of the resist film has been reduced at the stage prior to processing of the processable substrate (or target film).

FIG. 2 shows another embodiment of the pattern forming process of the invention. The process of FIG. 2 is the same as that of FIG. 1 until the development step except that the processable layer is not formed. The development is followed by ion implantation as shown in FIG. 2E whereby ions are implanted into the substrate surface in an opening. The pattern forming process using BARC has the problem that when BARC is opened by dry etching, the substrate surface is oxidized. Upon ion implantation, ions are stopped by the oxide film. In the patterning process involving ion implantation, the substrate surface must be open after development.

The substrate 10 used in the embodiment of FIG. 1 is generally a silicon substrate. The processable substrate (or target film) 20 used includes $SiO_2$, SiN, SiON, SiOC, p-Si, α-Si, TiN, WSi, BPSG, SOG, Cr, CrO, CrON, MoSi, low dielectric film, etch stopper film, underlayer in the form of carbon film, and silicon-containing intermediate film.

In the embodiment of the invention, the first resist film of the first positive resist composition is formed on the processable layer directly or via a silicon-containing intermediate film, and the second resist film of the second positive resist composition is formed on the first resist film. The first resist film typically has a thickness in the range of 5 to 100 nm, preferably 10 to 100 nm, and more preferably 20 to 50 nm while it is desirable to select a film thickness suitable to minimize substrate reflection. The second resist film typically has a thickness in the range of 20 to 300 nm, preferably 30 to 250 nm. The first and second resist films each are prebaked after spin coating and before exposure. Preferred prebake conditions include a temperature of 60 to 180° C., especially 70 to 50° C. and a time of 10 to 300 seconds, especially 15 to 200 seconds.

Next exposure is carried out. For the exposure, preference is given to high-energy radiation having a wavelength of 140 to 250 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves exposing a prebaked resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface. The resist protective film used in the immersion lithography is preferably formed from a solution of a polymer having 1,1,1,3,3,3-hexafluoro-2-propanol residues which is insoluble in water, but soluble in an alkaline developer, in a solvent selected from alcohols of at least 4 carbon atoms, ethers of 8 to 12 carbon atoms, and mixtures thereof. After formation of the resist film, deionized water rinsing (or post-soaking) may be carried out for extracting the acid generator and the like from the film surface or washing away particles, or after exposure, rinsing (or post-soaking) may be carried out for removing water droplets left on the resist film.

To the first and second resist compositions, an additive for enhancing water repellency of resist surface may be added. This additive is a polymer having a fluoroalcohol group, which segregates on the resist surface after spin coating to reduce the surface energy, improving water slip. Such polymers are described in JP-A 2007-297590 and JP-A 2008-122932.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Development is then carried out by a standard technique such as puddle, dip or spray technique using an aqueous alkaline solution, typically a 0.1 to 5 wt %, preferably 2 to 3 wt % aqueous solution of tetramethylammonium hydroxide (TMAH). In this way the desired pattern is formed on the substrate.

FIGS. 3 to 10 show the results of experiments. For each of first resist films having different n values varying from 1.3 to 2.0 by an increment of 0.1, reflection from beneath the resist film is computed when the k value and film thickness are varied. Exposure is ArF dry lithography with wavelength 193 nm using NA 0.85 lens and ⅔ annular illumination.

The first resist film has optimum values of extinction coefficient (k value) at the exposure wavelength and film thickness which differ depending on a particular n value. In the thinnest film region where reflectivity is 1% or below (depicted as white squares with reflectivity of 0-0.01), the film is thinner as the n value is greater, and at this point, the k value is greater.

Figure 6:
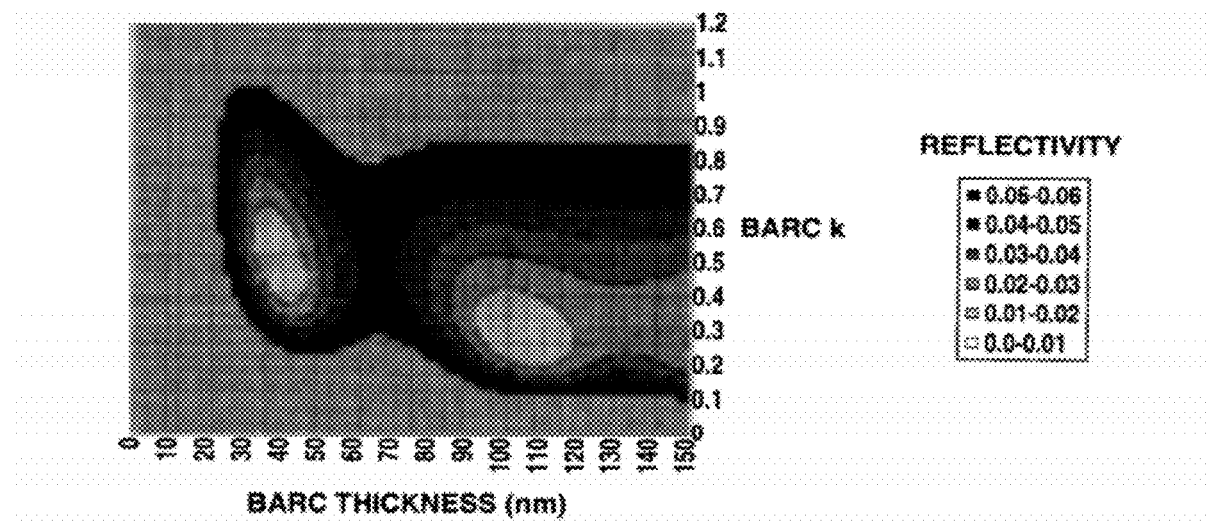
FIG. 6 is a diagram showing reflectivity from beneath a first resist film having an n value of 1.6 when the k value and thickness of the resist film are varied.
Figure 7:
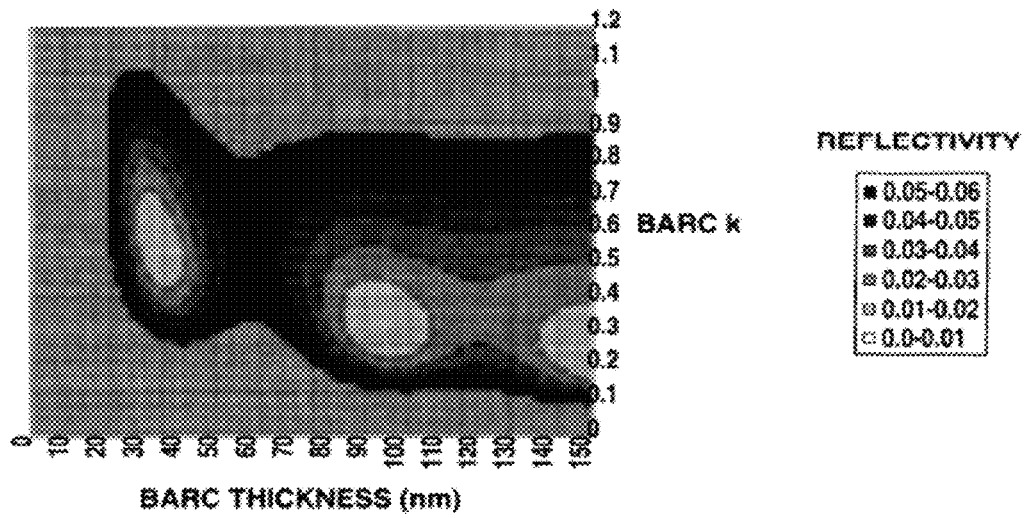
FIG. 7 is a diagram showing reflectivity from beneath a first resist film having an n value of 1.7 when the k value and thickness of the resist film are varied.
Figure 8:
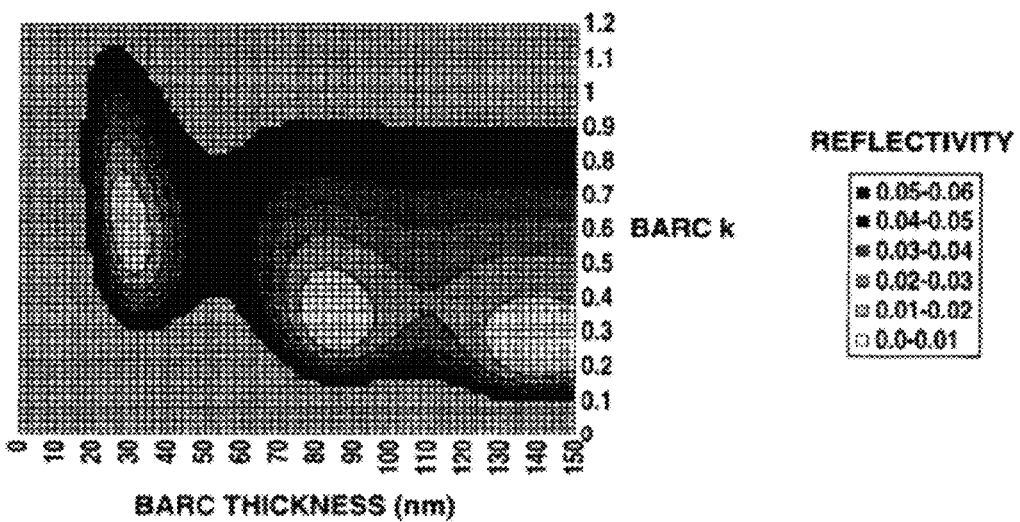
FIG. 8 is a diagram showing reflectivity from beneath a first resist film having an n value of 1.8 when the k value and thickness of the resist film are varied.
Figure 9:
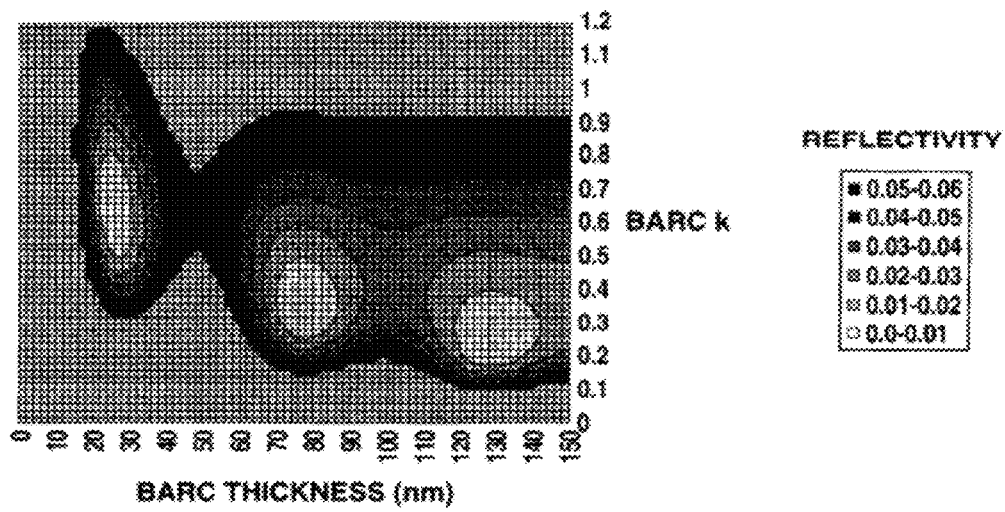
FIG. 9 is a diagram showing reflectivity from beneath a first resist film having an n value of 1.9 when the k value and thickness of the resist film are varied.
Figure 10:
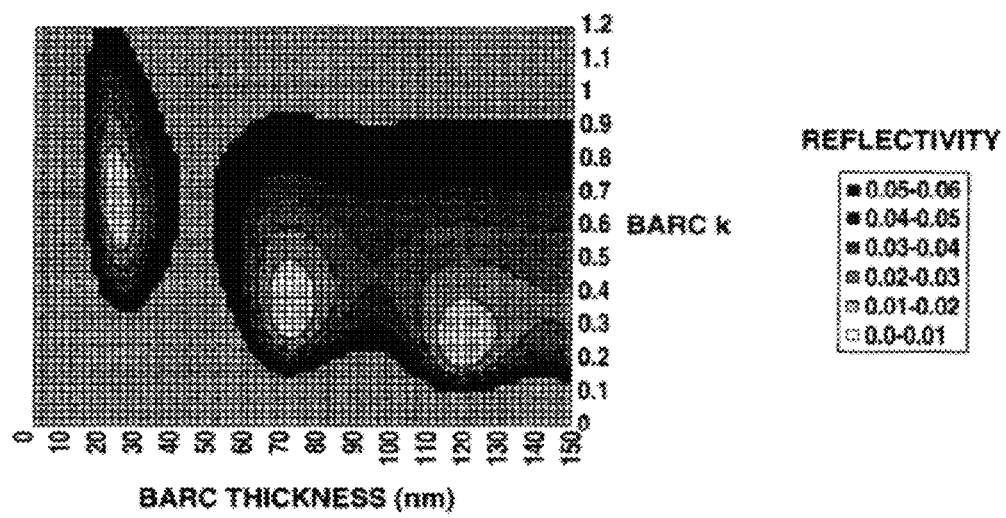
FIG. 10 is a diagram showing reflectivity from beneath a first resist film having an n value of 2.0 when the k value and thickness of the resist film are varied.

Since the first resist film contains a large amount of light absorber for anti-reflection purpose, a thicker resist film results in a pattern of tapered profile. It is thus necessary to make the first resist film as thin as possible. In FIG. 6, for example, although regions giving a reflectivity of 1% or less exist in film thickness ranges of 30-50 nm and 90-120 nm, a film thickness range of 30-50 nm is preferably used. In the range of 30-50 nm, a choice of as thin a film as possible is preferred. The first resist having a higher refractive index n may provide a reflectivity of 1% or less in a thinner film form.

EXAMPLE

Synthesis Examples and Examples are given below together with Comparative Examples for further illustrating the invention although the invention is not limited thereby. The weight average molecular weight (Mw) of a polymer is determined by GPC versus polystyrene standards using tetrahydrofuran (dimethylformamide for Polymer 1-9) as a solvent. Dispersity (Mw/Mn) is computed therefrom.

Synthesis Example

Polymers to be added to resist compositions were synthesized by combining monomers, effecting copolymerization reaction in tetrahydrofuran solvent, pouring the reaction mixture into methanol for crystallization, repeatedly washing with hexane, isolation, and drying. The resulting Polymers 1-1 to 1-19, Polymers 2-1 to 2-8, and Comparative Polymer 1-1 are identified below. The composition of a polymer was analyzed by $^1$H-NMR spectroscopy, and Mw and Mw/Mn by GPC.

Polymer 1-1

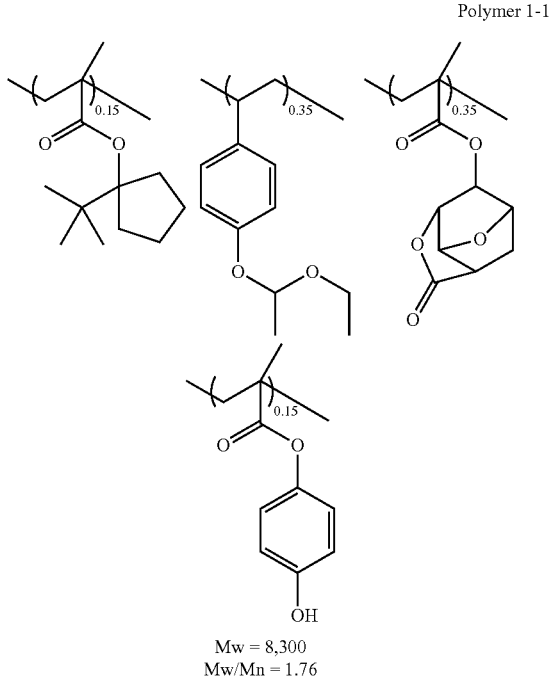

Polymer 1-1

Mw = 8,300
Mw/Mn = 1.76

-continued
Polymer 1-2
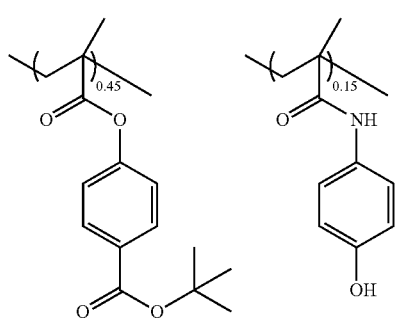
Mw = 8,800
Mw/Mn = 1.77
Polymer 1-3
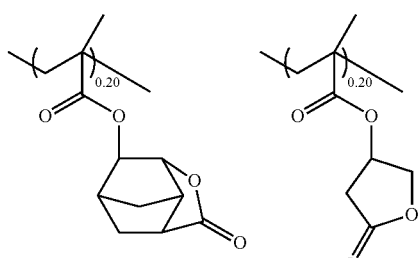
Mw = 7,600
Mw/Mn = 1.79
Polymer 1-4
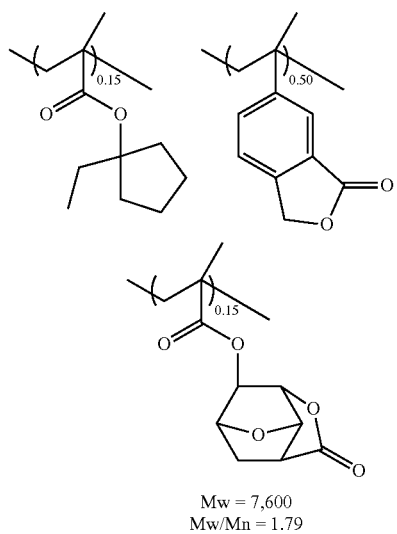
-continued
Polymer 1-2
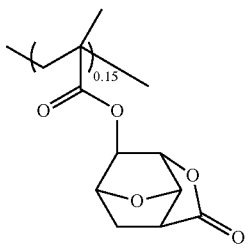
Mw = 8,600
Mw/Mn = 1.93
Polymer 1-5
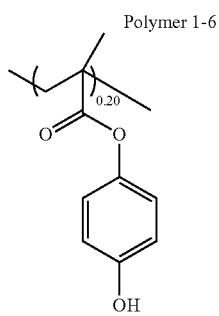
Mw = 8,100
Mw/Mn = 1.83
Polymer 1-6
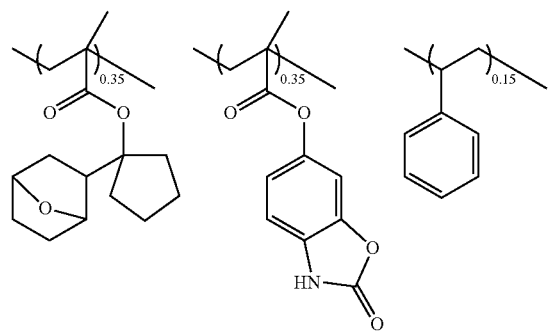
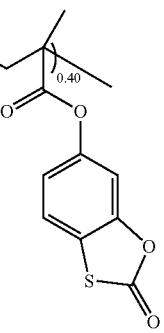
Mw = 8,300
Mw/Mn = 1.89

-continued
Polymer 1-7
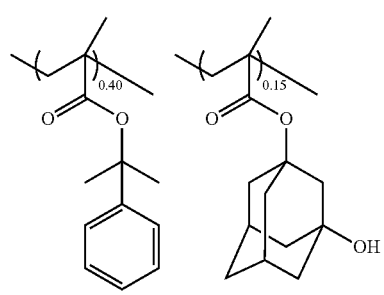
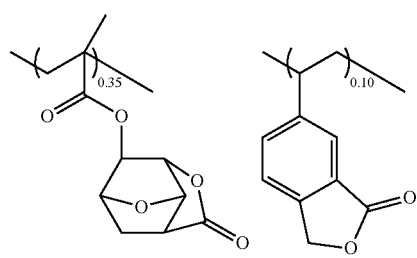
Mw = 8,600
Mw/Mn = 1.82
Polymer 1-8
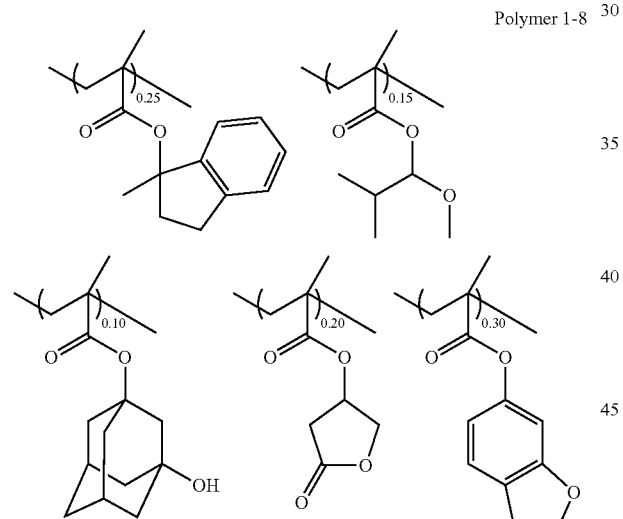
Mw = 8,600
Mw/Mn = 1.82
Polymer 1-9
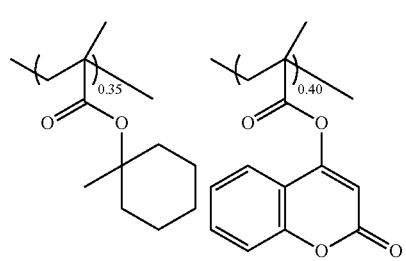
-continued
Polymer 1-7
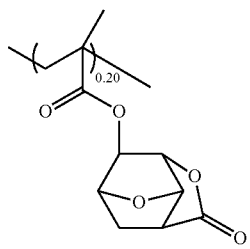
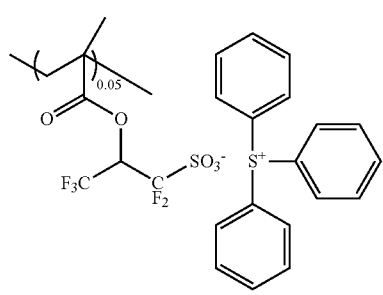
Mw = 9,600
Mw/Mn = 1.77
Polymer 1-10
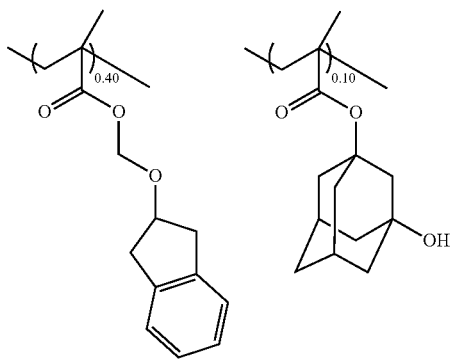
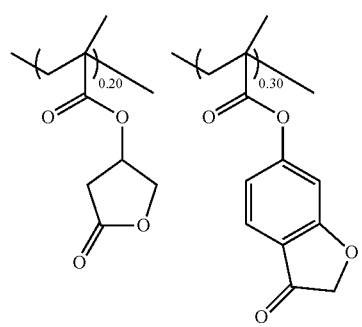
Mw = 8,900
Mw/Mn = 1.83

Polymer 1-11
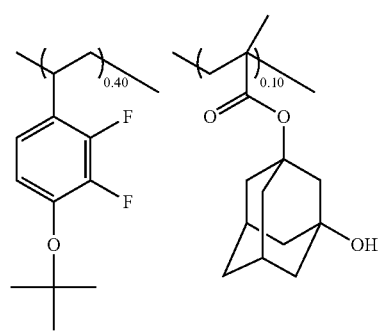
Polymer 1-12
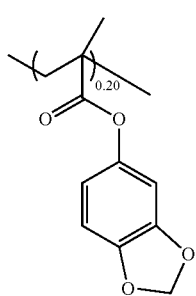
Mw = 8,100
Mw/Mn = 1.85
Polymer 1-13
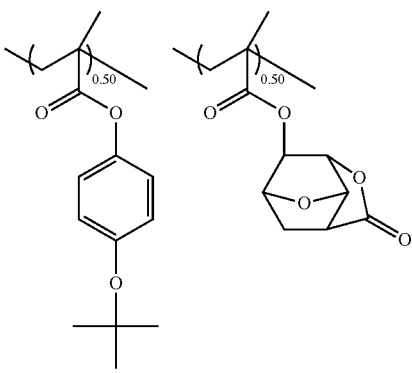
Mw = 8,900
Mw/Mn = 1.68
Polymer 1-14
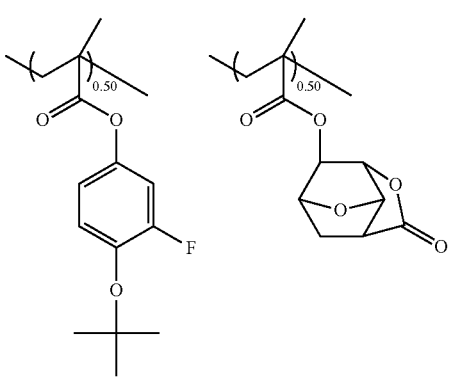
Mw = 9,900
Mw/Mn = 2.05
Polymer 1-15
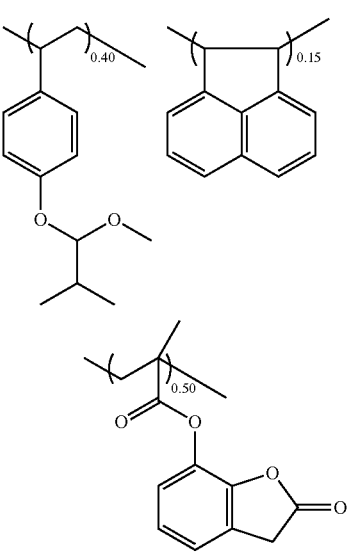
Mw = 9,900
Mw/Mn = 2.05
Polymer 1-12
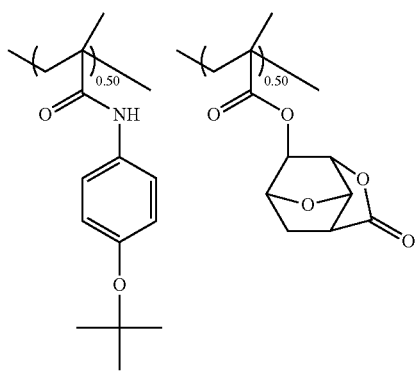
Mw = 8,500
Mw/Mn = 1.79

-continued
Polymer 1-16
Polymer 1-16
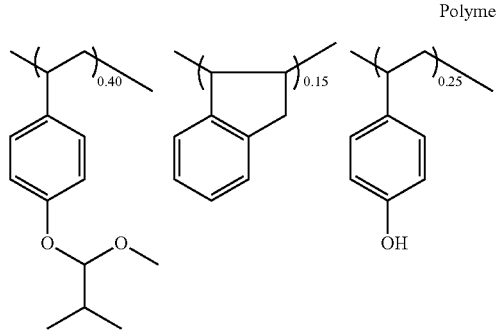
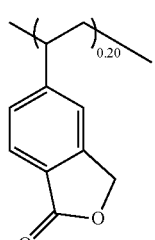
Mw = 6,500
Mw/Mn = 1.98
Polymer 1-17
Polymer 1-17
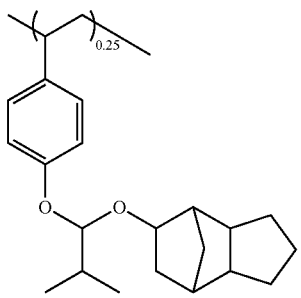
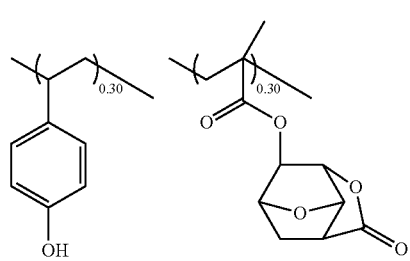
Mw = 7,500
Mw/Mn = 1.91
-continued
Polymer 1-18
Polymer 1-18
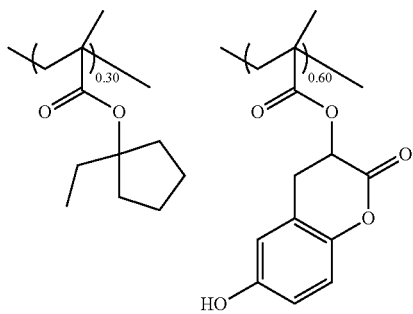
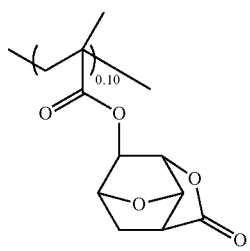
Mw = 7,600
Mw/Mn = 1.79
Polymer 1-19
Polymer 1-19
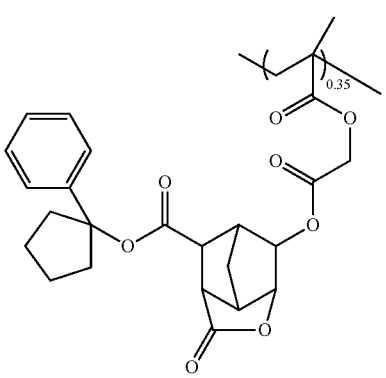
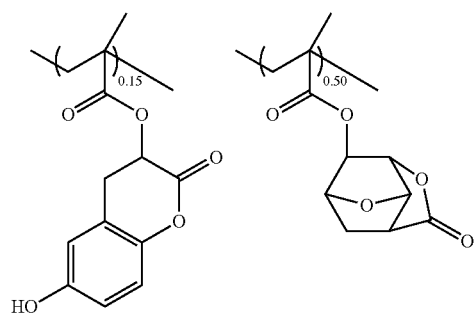
Mw = 9,100
Mw/Mn = 1.99

Polymer 2-1
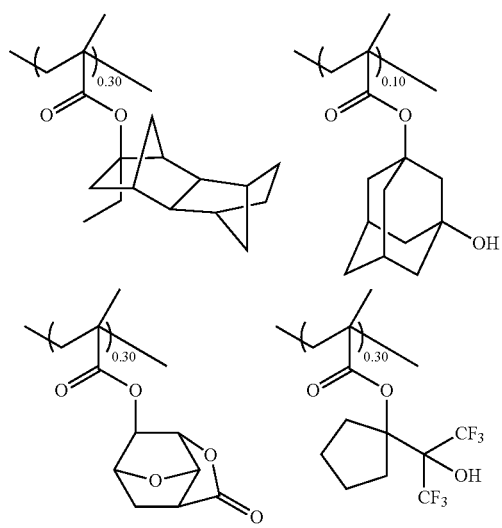
Mw = 8,100
Mw/Mn = 1.83
Polymer 2-2
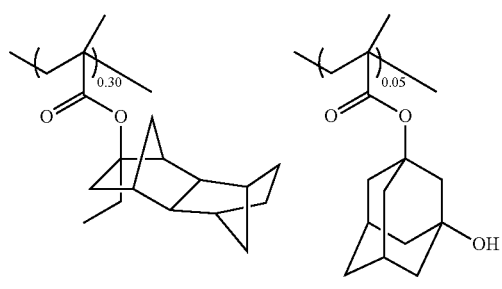
Mw = 8,900
Mw/Mn = 1.89
Polymer 2-3
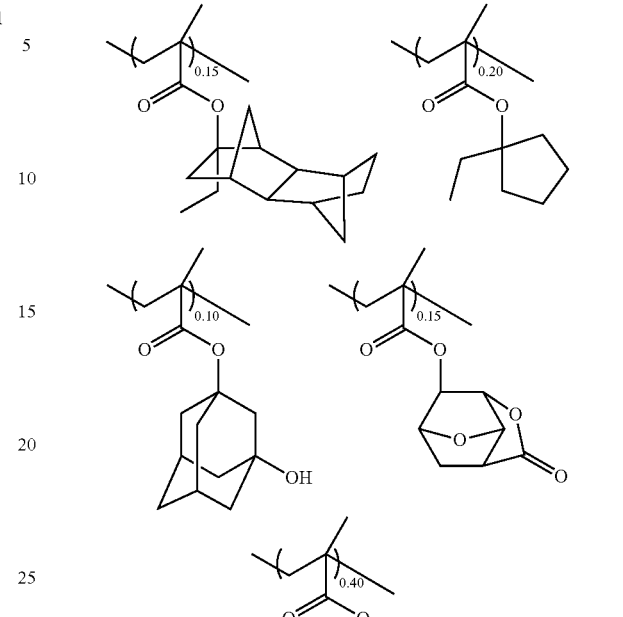
Mw = 9,100
Mw/Mn = 1.92
Polymer 2-4
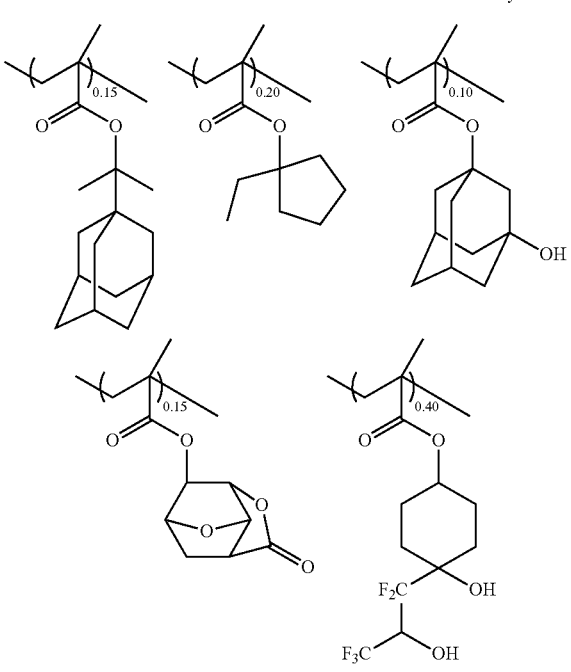
Mw = 9,100
Mw/Mn = 1.92

Polymer 2-5
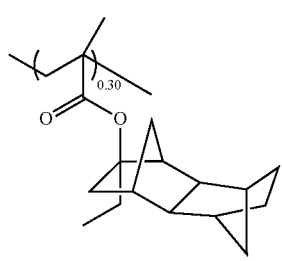
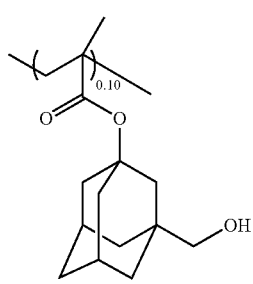
Polymer 2-5
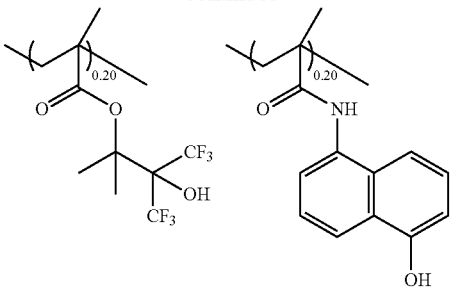
Mw = 8,700
Mw/Mn = 1.68
Polymer 2-7
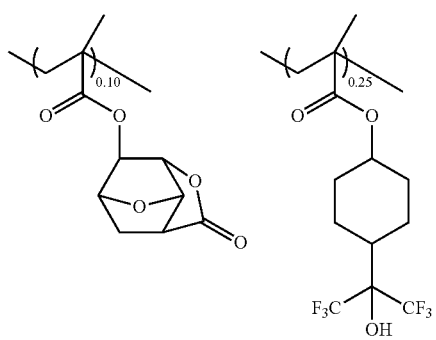
Polymer 2-7
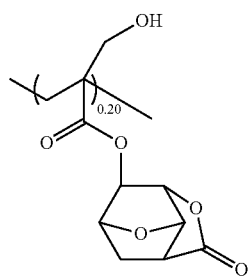
Mw = 8,300
Mw/Mn = 1.87
Polymer 2-8
Mw = 8,800
Mw/Mn = 1.88
Polymer 2-6
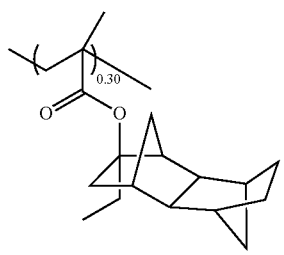
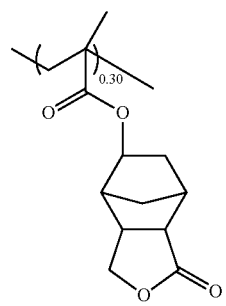
Polymer 2-6
Polymer 2-8
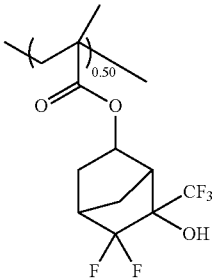
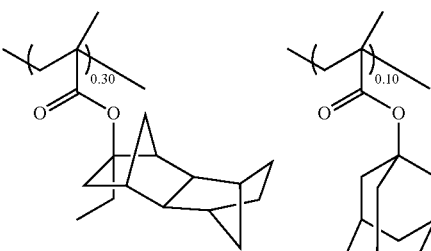
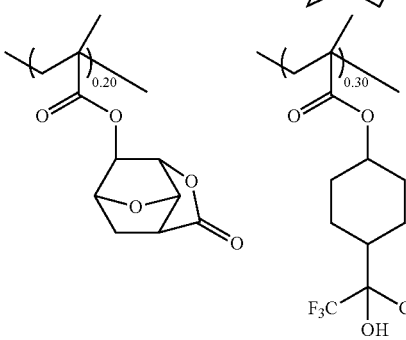

Acid generator: PAG1 to PAG3

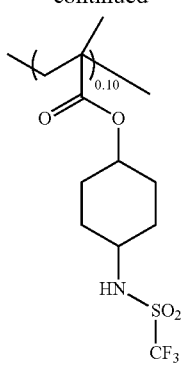

Mw = 9,500
Mw/Mn = 1.79

Comparative Polymer 1-1

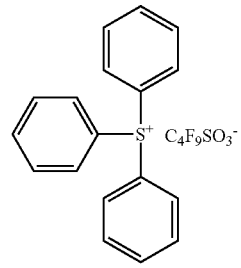
PAG 1

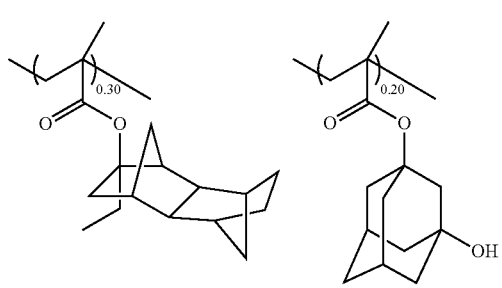
Comparative Polymer 1-1

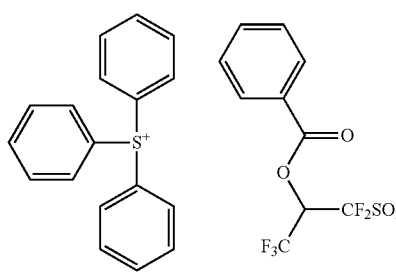
PAG 2

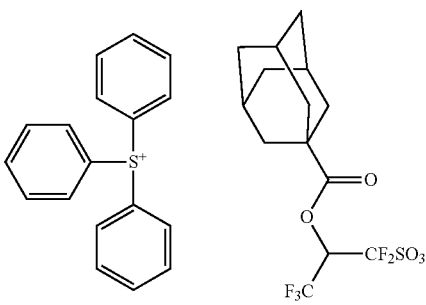
PAG 3

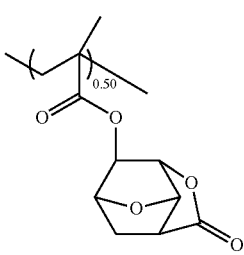

Mw = 8,900
Mw/Mn = 1.89

Basic compound (amine quencher): Quenchers 1 and 2

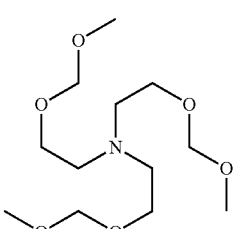
Quencher 1

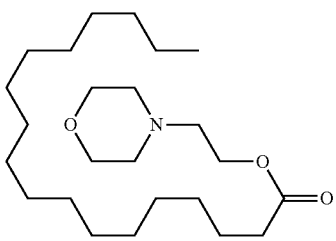
Quencher 2

Formulation of First Resist Composition

A first resist composition in solution form was prepared by mixing a polymer (Polymers 1-1 to 1-19, Polymer 2-1, or Comparative Polymer 1-1), acid generator, and amine quencher in a solvent in accordance with the formulation shown in Table 1, and filtering through a Teflon® filter having a pore size of 0.2 μm. The solvent contained 50 ppm of a surfactant FC-4430 (3M-Sumitomo Co., Ltd.).

In preparing Comparative Resist 1-3, Polymer 1-1 could not be dissolved in 2-methyl-1-butanol.

The components in Tables 1 and 2 are identified below.

Organic Solvent:
propylene glycol monomethyl ether acetate (PGMEA)
cyclohexanone (CyH)

TABLE 1

| | Polymer (pbw) | Acid generator (pbw) | Basic compound (pbw) | Organic solvent (pbw) |
|---|---|---|---|---|
| Resist 1-1 | Polymer 1-1 (100) | PAG1 (8.0) | Quencher 1 (0.60) | PGMEA (4,500) CyH (500) |
| Resist 1-2 | Polymer 1-2 (100) | PAG1 (8.0) | Quencher 1 (0.60) | PGMEA (4,500) CyH (500) |
| Resist 1-3 | Polymer 1-3 (100) | PAG1 (8.0) | Quencher 1 (0.60) | PGMEA (4,500) CyH (500) |
| Resist 1-4 | Polymer 1-4 (100) | PAG1 (8.0) | Quencher 1 (0.60) | PGMEA (4,500) CyH (500) |
| Resist 1-5 | Polymer 1-5 (100) | PAG2 (8.0) | Quencher 1 (1.60) | PGMEA (4,500) CyH (500) |
| Resist 1-6 | Polymer 1-6 (100) | PAG1 (8.0) | Quencher 1 (0.60) | PGMEA (4,500) CyH (500) |
| Resist 1-7 | Polymer 1-7 (100) | PAG1 (8.0) | Quencher 1 (0.60) | PGMEA (4,500) CyH (500) |
| Resist 1-8 | Polymer 1-8 (100) | PAG1 (8.0) | Quencher 1 (0.60) | PGMEA (4,500) CyH (500) |
| Resist 1-9 | Polymer 1-9 (100) | — | Quencher 1 (0.60) | PGMEA (4,500) CyH (500) |
| Resist 1-10 | Polymer 1-10 (100) | PAG1 (8.0) | Quencher 1 (0.60) | PGMEA (4,500) CyH (500) |
| Resist 1-11 | Polymer 1-11 (100) | PAG1 (8.0) | Quencher 1 (0.60) | PGMEA (4,500) CyH (500) |
| Resist 1-12 | Polymer 1-12 (100) | PAG1 (8.0) | Quencher 1 (0.60) | PGMEA (4,500) CyH (500) |
| Resist 1-13 | Polymer 1-13 (100) | PAG1 (8.0) | Quencher 1 (0.60) | PGMEA (4,500) CyH (500) |
| Resist 1-14 | Polymer 1-14 (100) | PAG1 (8.0) | Quencher 1 (0.60) | PGMEA (4,500) CyH (500) |
| Resist 1-15 | Polymer 1-15 (65) Comparative Polymer 1-1 (45) | PAG1 (8.0) | Quencher 1 (0.60) | PGMEA (4,500) CyH (500) |
| Resist 1-16 | Polymer 1-16 (60) Comparative Polymer1-1 (40) | PAG1 (8.0) | Quencher 1 (0.60) | PGMEA (4,500) CyH (500) |
| Resist 1-17 | Polymer 1-17 (100) | PAG2 (8.0) | Quencher 1 (0.60) | PGMEA (4,500) CyH (500) |
| Resist 1-18 | Polymer 1-18 (100) | PAG2 (8.0) | Quencher 1 (0.60) | PGMEA (4,500) CyH (500) |
| Resist 1-19 | Polymer 1-19 (100) | PAG2 (8.0) | Quencher 1 (0.60) | PGMEA (4,500) CyH (500) |
| Comparative Resist 1-1 | Comparative Polymer 1-1 (100) | PAG1 (8.0) | Quencher 1 (0.60) | PGMEA (4,500) CyH (500) |
| Comparative Resist 1-2 | Polymer 2-1 (100) | PAG1 (8.0) | Quencher 1 (0.60) | PGMEA (4,500) CyH (500) |
| Comparative Resist 1-3 | Polymer 1-1 (100) | PAG1 (8.0) | Quencher 1 (0.60) | 2-methyl-1-butanol (5,000) |

Formulation of Second Resist Composition

A second resist composition in solution form was prepared by mixing a polymer (Polymers 2-1 to 2-8 or Comparative Polymer 1-1), acid generator, and amine quencher in a solvent in accordance with the formulation shown in Table 2, and filtering through a Teflon® filter having a pore size of 0.2 μm. The solvent contained 50 ppm of a surfactant FC-4430 (3M-Sumitomo Co., Ltd.).

In preparing Comparative Resist 2-3, Comparative Polymer 1-1 could not be dissolved in 2-methyl-1-butanol.

TABLE 2

| | Polymer (pbw) | Acid generator (pbw) | Basic compound (pbw) | Organic solvent (pbw) |
|---|---|---|---|---|
| Resist 2-1 | Polymer 2-1 (100) | PAG3 (10.0) | Quencher 2 (2.30) | 2-methyl-1-butanol (1,800) |
| Resist 2-2 | Polymer 2-2 (100) | PAG3 (10.0) | Quencher 2 (2.30) | 3-methyl-1-butanol (1,800) |
| Resist 2-3 | Polymer 2-3 (100) | PAG3 (10.0) | Quencher 2 (2.30) | 2-methyl-1-butanol (1,200) isobutyl alcohol (700) |
| Resist 2-4 | Polymer 2-4 (100) | PAG3 (10.0) | Quencher 2 (2.30) | isobutyl alcohol (1,000) 4-methyl-2-pentanol (1,000) |
| Resist 2-5 | Polymer 2-5 (100) | PAG3 (10.0) | Quencher 2 (2.30) | 2-methyl-1-butanol (1,800) |
| Resist 2-6 | Polymer 2-6 (100) | PAG3 (10.0) | Quencher 2 (2.30) | 2-methyl-1-butanol (1,800) |
| Resist 2-7 | Polymer 2-7 (100) | PAG3 (10.0) | Quencher 2 (2.30) | 2-methyl-1-butanol (1,800) |
| Resist 2-8 | Polymer 2-8 (100) | PAG3 (10.0) | Quencher 2 (2.30) | 2-methyl-1-butanol (1,800) |
| Comparative Resist 2-1 | Polymer 2-1 (100) | PAG3 (10.0) | Quencher 2 (2.30) | PGMEA (1,800) |
| Comparative Resist 2-2 | Comparative Polymer 1-1 (100) | PAG3 (10.0) | Quencher 2 (2.30) | PGMEA (1,800) |
| Comparative Resist 2-3 | Comparative Polymer 1-1 (100) | PAG3 (10.0) | Quencher 2 (2.30) | 2-methyl-1-butanol (1,800) |

Each of the first resist compositions in Table 1 was coated on a 8-inch silicon wafer and baked at 110° C. for 60 seconds to form a first resist film of 35 nm thick. Using a variable angle spectroscopic ellipsometer (VASE®) of J. A. Woollam Co., the refractive index (n) and extinction coefficient (k) at wavelength 193 nm of the resist film were determined. The results are shown in Table 3.

TABLE 3

| | n | k |
|---|---|---|
| Resist 1-1 | 1.65 | 0.48 |
| Resist 1-2 | 1.66 | 0.48 |
| Resist 1-3 | 1.67 | 0.40 |
| Resist 1-4 | 1.66 | 0.42 |
| Resist 1-5 | 1.65 | 0.46 |
| Resist 1-6 | 1.57 | 0.58 |
| Resist 1-7 | 1.65 | 0.41 |
| Resist 1-8 | 1.66 | 0.46 |
| Resist 1-9 | 1.66 | 0.40 |
| Resist 1-10 | 1.60 | 0.57 |
| Resist 1-11 | 1.77 | 0.46 |
| Resist 1-12 | 1.68 | 0.50 |
| Resist 1-13 | 1.62 | 0.50 |
| Resist 1-14 | 1.70 | 0.48 |
| Resist 1-15 | 1.60 | 0.47 |
| Resist 1-16 | 1.62 | 0.49 |
| Resist 1-17 | 1.63 | 0.48 |
| Resist 1-18 | 1.64 | 0.44 |
| Resist 1-19 | 1.66 | 0.40 |
| Comparative Resist 1-1 | 1.70 | 0 |
| Comparative Resist 1-2 | 1.65 | 0 |

Each of the first resist compositions in Table 1 was coated on a 8-inch silicon wafer and baked at 110° C. for 60 seconds to form a first resist film of 35 nm thick. A solvent (shown in Table 4) was statically dispensed on the resist film for 20 seconds, followed by spin drying at 1,500 rpm and baking at 100° C. for 60 seconds. The thickness of the resist film was measured for determining a film thickness reduction (film loss) before and after solvent dispensing. The results are shown in Table 4.

TABLE 4

| | Solvent | Film loss (nm) |
|---|---|---|
| Resist 1-1 | 2-methyl-1-butanol | 2 |
| Resist 1-2 | 2-methyl-1-butanol | 1 |
| Resist 1-3 | 2-methyl-1-butanol | 1 |
| Resist 1-4 | 2-methyl-1-butanol | 2 |
| Resist 1-5 | 2-methyl-1-butanol | 2 |
| Resist 1-6 | 2-methyl-1-butanol | 2 |
| Resist 1-7 | 2-methyl-1-butanol | 1 |
| Resist 1-8 | 2-methyl-1-butanol | 1 |
| Resist 1-9 | 2-methyl-1-butanol | 1 |
| Resist 1-10 | 2-methyl-1-butanol | 1 |
| Resist 1-11 | 2-methyl-1-butanol | 1 |
| Resist 1-12 | 2-methyl-1-butanol | 1 |
| Resist 1-13 | 2-methyl-1-butanol | 1 |
| Resist 1-14 | 2-methyl-1-butanol | 1 |
| Resist 1-15 | 2-methyl-1-butanol | 1 |
| Resist 1-16 | 2-methyl-1-butanol | 1 |
| Resist 1-17 | 2-methyl-1-butanol | 1 |
| Resist 1-18 | 2-methyl-1-butanol | 1 |
| Resist 1-19 | 2-methyl-1-butanol | 1 |
| Resist 1-1 | 3-methyl-1-butanol | 1 |
| Resist 1-1 | 4-methyl-2-pentanol | 1 |
| Resist 1-1 | isobutyl alcohol | 1 |
| Resist 1-1 | PGMEA | 35 |
| Resist 1-1 | CyH | 35 |
| Comparative Resist 1-1 | 2-methyl-1-butanol | 1 |
| Comparative Resist 1-2 | 2-methyl-1-butanol | 35 |

Examples and Comparative Examples

Exposure Experiment

The first resist composition in Table 1 was coated on a silicon substrate (which had been vapor primed with hexamethyl disilazane HMDS) and baked on a hot plate at 110° C. for 60 seconds to form a first resist layer of 35 nm thick. The second resist composition in Table 2 was coated on the first resist film and baked on a hot plate at 100° C. for 60 seconds to form a second resist layer of 165 nm thick. Using an ArF excimer laser scanner NSR-S307E (Nikon Corp., NA 0.85, σ 0.93, ⅔ annular illumination, 6% halftone phase shift mask), the resist film was exposed to a 90 nm line, 180 nm pitch pattern. Immediately after exposure, the resist film was baked at 100° C. for 60 seconds and developed with a 2.38 wt % aqueous solution of tetramethylammonium hydroxide for 30 seconds, obtaining a 90 nm line-and-space pattern. A cross-sectional profile of the pattern was observed under SEM. The results are shown in Table 5.

TABLE 5

| | 1st resist film | 2nd resist film | Profile |
|---|---|---|---|
| Example 1-1 | Resist 1-1 | Resist 2-1 | rectangular, no roughness on sidewall |
| Example 1-2 | Resist 1-2 | Resist 2-1 | rectangular, no roughness on sidewall |
| Example 1-3 | Resist 1-3 | Resist 2-1 | rectangular, no roughness on sidewall |
| Example 1-4 | Resist 1-4 | Resist 2-1 | rectangular, no roughness on sidewall |
| Example 1-5 | Resist 1-5 | Resist 2-1 | rectangular, no roughness on sidewall |
| Example 1-6 | Resist 1-6 | Resist 2-1 | rectangular, no roughness on sidewall |
| Example 1-7 | Resist 1-7 | Resist 2-1 | rectangular, no roughness on sidewall |
| Example 1-8 | Resist 1-8 | Resist 2-1 | rectangular, no roughness on sidewall |
| Example 1-9 | Resist 1-9 | Resist 2-1 | rectangular, no roughness on sidewall |
| Example 1-10 | Resist 1-10 | Resist 2-1 | rectangular, no roughness on sidewall |
| Example 1-11 | Resist 1-11 | Resist 2-1 | rectangular, no roughness on sidewall |
| Example 1-12 | Resist 1-12 | Resist 2-1 | rectangular, no roughness on sidewall |
| Example 1-13 | Resist 1-13 | Resist 2-1 | rectangular, no roughness on sidewall |
| Example 1-14 | Resist 1-14 | Resist 2-1 | rectangular, no roughness on sidewall |
| Example 1-15 | Resist 1-15 | Resist 2-1 | rectangular, no roughness on sidewall |
| Example 1-16 | Resist 1-16 | Resist 2-1 | rectangular, no roughness on sidewall |
| Example 1-17 | Resist 1-17 | Resist 2-1 | rectangular, no roughness on sidewall |
| Example 1-18 | Resist 1-18 | Resist 2-1 | rectangular, no roughness on sidewall |
| Example 1-19 | Resist 1-19 | Resist 2-1 | rectangular, no roughness on sidewall |
| Example 1-20 | Resist 1-1 | Resist 2-2 | rectangular, no roughness on sidewall |
| Example 1-21 | Resist 1-1 | Resist 2-3 | rectangular, no roughness on sidewall |
| Example 1-22 | Resist 1-1 | Resist 2-4 | rectangular, no roughness on sidewall |
| Example 1-23 | Resist 1-1 | Resist 2-5 | rectangular, no roughness on sidewall |
| Example 1-24 | Resist 1-1 | Resist 2-6 | rectangular, no roughness on sidewall |
| Example 1-25 | Resist 1-1 | Resist 2-7 | rectangular, no roughness on sidewall |
| Example 1-26 | Resist 1-1 | Resist 2-8 | rectangular, no roughness on sidewall |
| Comparative Example 1-1 | Comparative Resist 1-1 | Resist 2-1 | notable ridges on sidewall due to standing waves |
| Comparative Example 1-2 | Comparative Resist 2-1 | Resist 1-1 | pattern collapse |
| Comparative Example 1-3 | Resist 1-1 | Comparative Resist 2-1 | pattern collapse |
| Comparative Example 1-4 | Resist 1-1 | Comparative Resist 2-2 | pattern collapse |

In Examples 1-1 to 1-26, the pattern of the first and second layer resist film was formed after development. By virtue of the antireflective effect of the first resist layer, sidewalls of the second resist layer pattern were found to be devoid of roughness due to standing waves.

When a first resist film formed of Comparative Resist composition 1-1 free of absorber component was used, sidewalls of the second resist layer pattern after development were found to have ridges due to standing waves by substrate reflection.

In the example wherein an alcohol solvent-soluble polymer was used in the first layer resist film, the first layer resist film was dissolved when the second layer resist composition was coated thereon. Pattern formation was impossible because of intermixing of the first and second layer resist films.

In the example wherein PGMEA solvent capable of dissolving the first layer resist film was used in the second layer resist composition, pattern formation was impossible because of intermixing of the first and second layer resist films.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

Japanese Patent Application No. 2010-246185 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising
coating a first positive resist composition onto a substrate to form a first resist film, said first resist composition comprising a first polymer comprising 20 mol % to 100 mol % of aromatic group-containing recurring units and adapted to turn alkali soluble under the action of an acid and a first solvent selected from the group consisting of cyclohexanone, cyclopentanone, methyl-2-n-amylketone, 3-methoxybutanol, 3-methyl-3-methoxybutanol, 1-methoxy-2-propanol, 1-ethoxy-2-propanol, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, and mixtures comprising at least two of the foregoing,
coating a second positive resist composition on the first resist film to form a second resist film, said second resist composition comprising a second polymer and a second solvent of $C_3$-$C_8$ alkyl alcohol which does not dissolve the first resist film, said alkyl alcohol being selected from the group consisting of n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-1-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, and octanol, and mixtures comprising at least two of the foregoing, exposing to high-energy radiation having a wavelength, post-exposure baking, and developing the first and second resist films simultaneously with a developer to form a resist pattern.

2. The process of claim 1 wherein the first resist film has an extinction coefficient (k value) in the range of 0.1 to 1.1 at the exposure wavelength.

3. The process of claim 1 wherein the radiation for exposure is ArF excimer laser radiation having a wavelength of 193 nm.

4. The process of claim 1 wherein the aromatic group in the first resist composition is benzene ring.

5. The process of claim 1 wherein the second polymer in the second resist composition has a 2,2,2-trifluoro-1-hydroxyethyl group.

6. The process of claim 5 wherein the second polymer comprises recurring units having a 2,2,2-trifluoro-1-hydroxyethyl group, represented by the general formula (1):

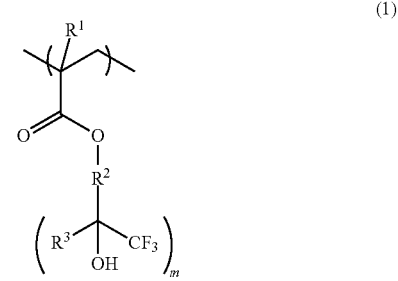

wherein $R^1$ is hydrogen or methyl, m is 1 or 2, $R^2$ is a straight, branched or cyclic $C_1$-$C_{10}$ alkylene group, which may contain an ester, ether, hydroxyl group or fluorine, in the case of m=1, or $R^2$ is the foregoing alkylene group with one hydrogen atom eliminated in the case of m=2, or $R^2$ and $R^3$ may bond together to form a ring, and $R^3$ is hydrogen, fluorine, methyl, trifluoromethyl or difluoromethyl.

7. The process of claim 5 wherein the second polymer is a copolymer comprising recurring units (a) having a 2,2,2-trifluoro-1-hydroxyethyl group and recurring units (b1) having an acid labile group, represented by the general formula (2):

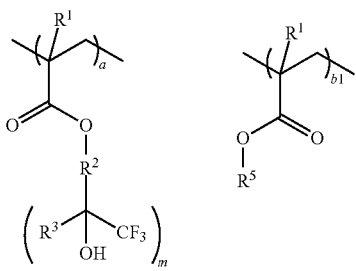

(2)

wherein $R^1$ is hydrogen or methyl, m is 1 or 2, $R^2$ is a straight, branched or cyclic $C_1$-$C_{10}$ alkylene group, which may contain an ester, ether, hydroxyl group or fluorine, in the case of m=1, or $R^2$ is the foregoing alkylene group with one hydrogen atom eliminated in the case of m=2, or $R^2$ and $R^3$ may bond together to form a ring, and $R^3$ is hydrogen, fluorine, methyl, trifluoromethyl or difluoromethyl, $R^4$ is hydrogen or methyl, $R^5$ is an acid labile group, a and b1 are numbers in the range: $0<a<1.0$, $0<b1<1.0$, and $0<a+b1<1.0$.

8. The process of claim 1 wherein the first polymer in the first resist composition comprises recurring units (b2), (c1), and (c2) as represented by the general formula (3):

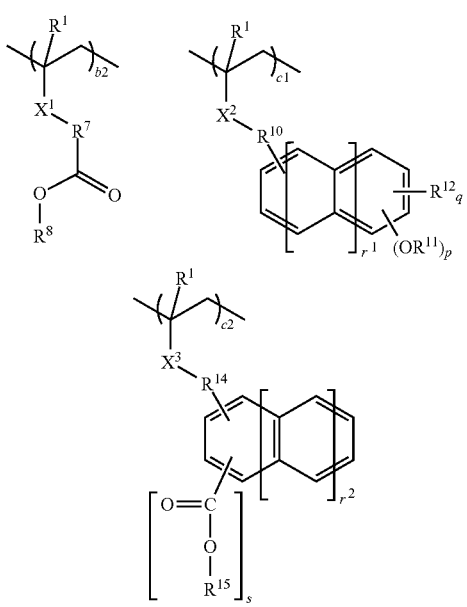

(3)

wherein $R^6$, $R^9$, and $R^{13}$ each are hydrogen or methyl, $X^1$, $X^2$, and $X^3$ each are a single bond or —C(=O)—O—, $X^2$ may also be —C(=O)—NH—, $R^7$, $R^{10}$, and $R^{14}$ each are a single bond or a straight or branched $C_1$-$C_6$ alkylene group, which may contain an ether group, ester group or lactone ring, $R^8$, $R^{11}$, and $R^{15}$ each are an acid labile group, $R^{12}$ is hydrogen, fluorine or a straight, branched or cyclic $C_1$-$C_6$ alkyl group, p and s are 1 or 2, q is an integer of 0 to 4, $r^1$ and $r^2$ are an integer of 0 to 2, b2, c1, and c2 are numbers in the range: $0 \leq b2 < 1.0$, $0 \leq c1 < 1.0$, $0 \leq c2 < 1.0$, $0.2 < b2+c1+c2 \leq 1.0$.

9. The process of claim 8 wherein the first polymer further comprise recurring units (d) having an adhesive group selected from the group consisting of lactone ring, carbonate, thiocarbonate, carbonyl, cyclic acetal, ether, ester, sulfonic acid ester, cyano, amide groups, and —O—C(=O)—Y— wherein Y is sulfur or NH.

10. The process of claim 1, further comprising, after the developing step, the step of processing the substrate by dry etching through the resist pattern.

11. The process of claim 1, further comprising, after the developing step, the step of processing the substrate by ion implantation through the resist pattern.

12. A pattern forming process comprising
coating a first positive resist composition onto a substrate to form a first resist film, said first resist composition comprising a first polymer comprising 20 mol % to 100 mol % of aromatic group-containing recurring units and adapted to turn alkali soluble under the action of an acid and a first solvent selected from the group consisting of cyclohexanone, cyclopentanone, methyl-2-n-amylketone, 3-methoxybutanol, 3-methyl-3-methoxybutanol, 1-methoxy-2-propanol, 1-ethoxy-2-propanol, propylene glycol monomethyl ether, ethylene glycol monomethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, and mixtures comprising at least two of the foregoing,
coating a second positive resist composition on the first resist film to form a second resist film, said second resist composition comprising a second polymer and a second solvent of $C_3$-$C_8$ alkyl alcohol which does not dissolve the first resist film, said alkyl alcohol being selected from the group consisting of n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-1-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, and octanol, and mixtures comprising at least two of the foregoing,
exposing to high-energy radiation having a wavelength, post-exposure baking, and
developing the first and second resist films simultaneously with a developer to form a resist pattern,
wherein the first polymer in the first resist composition comprises recurring units (b2), (c1), and (c2) as represented by the general formula (3):

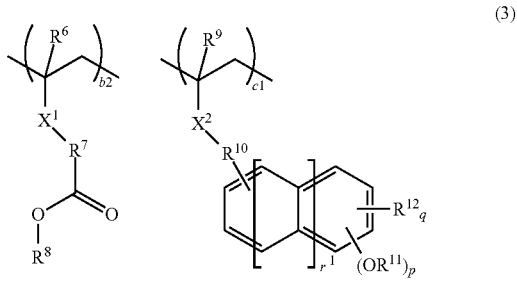

(3)

-continued

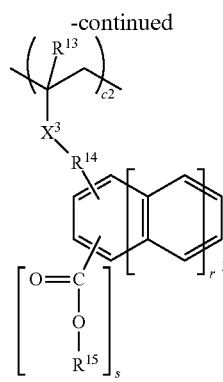

wherein $R^6$, $R^9$, and $R^{13}$ each are hydrogen or methyl, $X^1$, $X^2$, and $X^3$ each are a single bond or —C(=O)—O—, $X^2$ may also be —C(=O)—NH—, $R^7$, $R^{10}$, and $R^{14}$ each are a single bond or a straight or branched $C_1$-$C_6$ alkylene group, which may contain an ether group, ester group or lactone ring, $R^8$, $R^{11}$, and $R^{15}$ each are an acid labile group, $R^{12}$ is hydrogen, fluorine or a straight, branched or cyclic $C_1$-$C_6$ alkyl group, p and s are 1 or 2, q is an integer of 0 to 4, $r^1$ and $r^2$ are an integer of 0 to 2, b2, c1, and c2 are numbers in the range: $0 \leq b2 < 1.0$, $0 \leq c1 < 1.0$, $0 \leq c2 < 1.0$, $0.2 < b2+c1+c2 < 1.0$, and also comprises recurring units having an adhesive group of lactone ring, and the second polymer in the second resist composition is a copolymer comprising recurring units (a) having a 2,2,2-trifluoro-1-hydroxyethyl group and recurring units (b1) having an acid labile group, represented by the general formula (2):

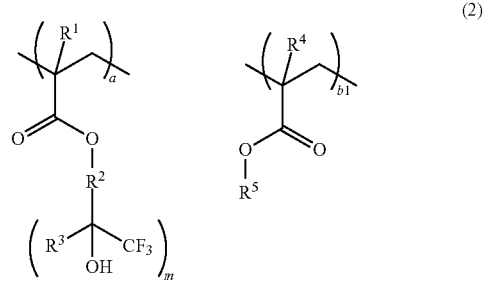

wherein $R^1$ is hydrogen or methyl, m is 1 or 2, $R^2$ is a straight, branched or cyclic $C_1$-$C_{10}$ alkylene group, which may contain an ester, ether, hydroxyl group or fluorine, in the case of m=1, or $R^2$ is the foregoing alkylene group with one hydrogen atom eliminated in the case of m=2, or $R^2$ and $R^3$ may bond together to form a ring, and $R^3$ is hydrogen, fluorine, methyl, trifluoromethyl or difluoromethyl, $R^4$ is hydrogen or methyl, $R^5$ is an acid labile group, a and b1 are numbers in the range: $0 < a < 1.0$, $0 < b1 < 1.0$, and $0 < a+b1 < 1.0$.

* * * * *